US012663832B2

(12) United States Patent
Fournier et al.

(10) Patent No.: US 12,663,832 B2
(45) **Date of Patent: \*Jun. 23, 2026**

(54) DISPLAY MODULE AND GLASS WITH UNDERCUT PLASTIC FRAME

(71) Applicant: Apple Inc., Cupertino, CA (US)

(72) Inventors: Douglas G. Fournier, San Jose, CA (US); James R. Krogdahl, Cupertino, CA (US); Daniel W. Jarvis, Sunnyvale, CA (US); Edward S. Huo, Sunnyvale, CA (US); Lee E. Hooton, Ridge, NY (US); Srikanth V. Thiruppukuzhi, San Jose, CA (US); Garret R. Owoc, Burlingame, CA (US); Michael Ngo, Santa Clara, CA (US); David A. Pakula, San Francisco, CA (US); Robert F. Meyer, Palo Alto, CA (US)

(73) Assignee: APPLE INC., Cupertino, CA (US)

( \* ) Notice: Subject to any disclaimer, the term of this patent is extended or adjusted under 35 U.S.C. 154(b) by 0 days.

This patent is subject to a terminal disclaimer.

(21) Appl. No.: 18/933,670

(22) Filed: Oct. 31, 2024

(65) Prior Publication Data

US 2025/0060784 A1 Feb. 20, 2025

Related U.S. Application Data

(63) Continuation of application No. 17/807,396, filed on Jun. 17, 2022, now Pat. No. 12,189,423, which is a (Continued)

(51) Int. Cl.
G06F 3/041 (2006.01)
G06F 1/16 (2006.01)
(Continued)

(52) U.S. Cl.
CPC ........ G06F 1/1637 (2013.01); H01M 50/247 (2021.01); H05K 1/0216 (2013.01);
(Continued)

(58) Field of Classification Search
None
See application file for complete search history.

(56) References Cited

U.S. PATENT DOCUMENTS

| | | | |
|---|---|---|---|
| 8,994,670 B2 * | 3/2015 | Tong | G06F 3/04883 345/173 |
| 10,631,437 B2 | 4/2020 | Fournier et al. | |
| | | (Continued) | |

FOREIGN PATENT DOCUMENTS

| | | |
|---|---|---|
| CN | 109074190 A | 12/2018 |
| CN | 114967975 A | 8/2022 |
| | (Continued) | |

*Primary Examiner* — Brian M Butcher
(74) *Attorney, Agent, or Firm* — Dorsey & Whitney LLP

(57) ABSTRACT

An electronic device having a display assembly is disclosed. Several layers may combine to form the display assembly. For example, the display assembly may include a touch sensitive layer (or touch detection layer), a display layer that present visual information, and a force sensitive layer (or force detection layer). The display layer may include a bend or curve that allows a portion of the display layer to bend around the force sensitive layer. Also, the connectors (that provide electrical and mechanical connections) may be positioned at different locations of the layers. For example, the display layer may include a connector on a first edge region, and the force sensitive layer may include a connector on a second edge region that is perpendicular, or at least substantially perpendicular, to the first edge region. By positioning the connectors on perpendicular edge regions, the display assembly may reduce its footprint.

18 Claims, 33 Drawing Sheets

Related U.S. Application Data continuation of application No. 16/816,212, filed on Mar. 11, 2020, now Pat. No. 11,392,175, which is a continuation of application No. 15/712,070, filed on Sep. 21, 2017, now Pat. No. 10,631,437.

(60) Provisional application No. 62/557,090, filed on Sep. 11, 2017, provisional application No. 62/398,045, filed on Sep. 22, 2016, provisional application No. 62/398,037, filed on Sep. 22, 2016, provisional application No. 62/398,069, filed on Sep. 22, 2016, provisional application No. 62/398,065, filed on Sep. 22, 2016, provisional application No. 62/398,059, filed on Sep. 22, 2016.

(51) Int. Cl.

| | |
|---|---|
| *H01M 50/247* | (2021.01) |
| *H05K 1/02* | (2006.01) |
| *H05K 1/14* | (2006.01) |
| *H05K 7/20* | (2006.01) |
| *H05K 9/00* | (2006.01) |
| *H01M 50/183* | (2021.01) |
| *H02J 7/70* | (2026.01) |

(52) U.S. Cl.
CPC ............ *H05K 1/144* (2013.01); *H05K 1/148* (2013.01); *H05K 7/20481* (2013.01); *H05K 7/20963* (2013.01); *H05K 9/0033* (2013.01); *B32B 2307/302* (2013.01); *B32B 2457/20* (2013.01); *G06F 1/1643* (2013.01); *G06F 3/0412* (2013.01); *G06F 2203/04112* (2013.01); *H01M 50/183* (2021.01); *H01M 2220/30* (2013.01); *H02J 7/70* (2026.01); *H05K 2201/042* (2013.01); *H05K 2201/10242* (2013.01); *H05K 2201/10257* (2013.01)

(56) References Cited

U.S. PATENT DOCUMENTS

| | | | |
|---|---|---|---|
| 11,392,175 B2 | 7/2022 | Fournier et al. | |
| 2015/0173212 A1* | 6/2015 | Lee ........................ | H05B 47/10 |
| | | | 361/752 |
| 2016/0275830 A1* | 9/2016 | You ................... | G02F 1/133305 |
| 2018/0081481 A1 | 3/2018 | Fournier et al. | |
| 2020/0221609 A1 | 7/2020 | Fournier et al. | |
| 2022/0317728 A1 | 10/2022 | Fournier et al. | |

FOREIGN PATENT DOCUMENTS

| | | | |
|---|---|---|---|
| EP | 2518589 | A1 | 10/2012 |
| JP | 6775596 | B2 | 10/2020 |
| JP | 6906666 | B2 | 7/2021 |
| KR | 102174119 | B1 | 11/2020 |
| KR | 102289734 | B1 | 8/2021 |
| WO | 2018057652 | A1 | 3/2018 |

* cited by examiner

3200

3300

PROVIDE A HOUSING 3302

INSERT MULTIPLE ELECTRODES IN THE HOUSING, THE MULTIPLE ELECTRODES SEPARATED BY A SEPARATOR 3304

FORM A CHANNEL IN THE HOUSING, THE CHANNEL DEFINING A REDUCED DIMENSION IN THE HOUSING 3306

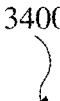

3400

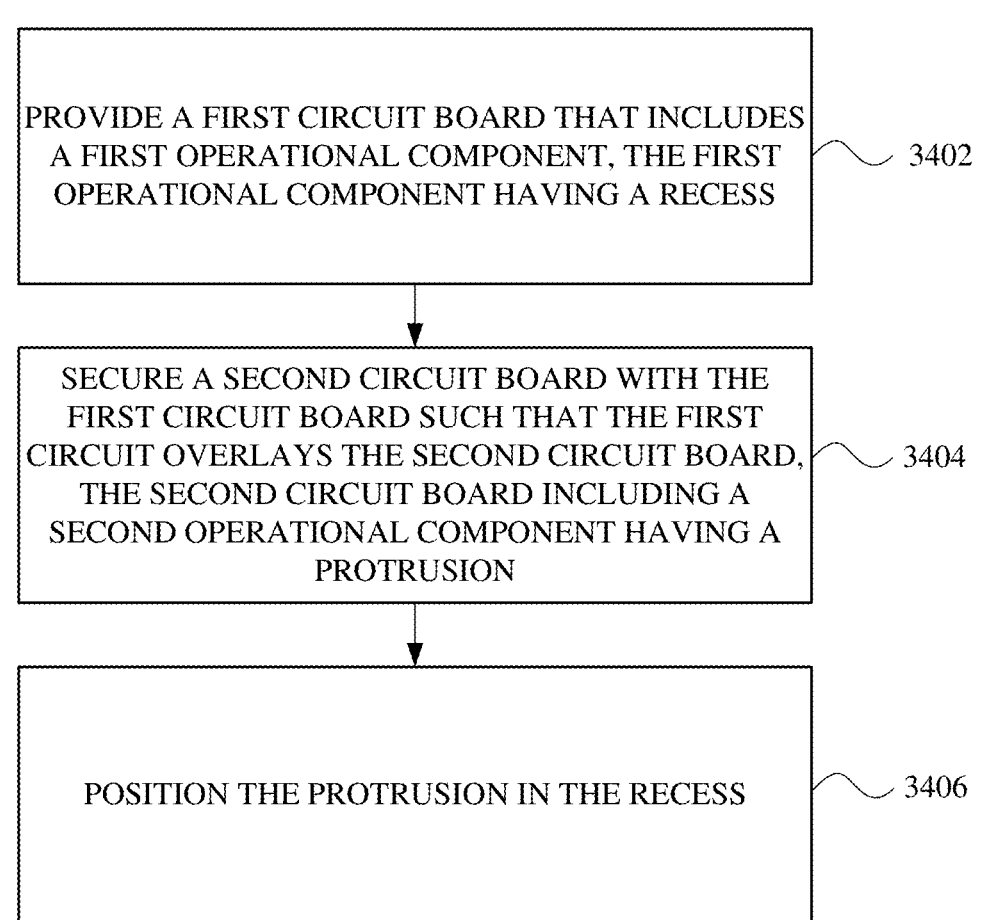

PROVIDE A FIRST CIRCUIT BOARD THAT INCLUDES A FIRST OPERATIONAL COMPONENT, THE FIRST OPERATIONAL COMPONENT HAVING A RECESS ⟋⟍ 3402

SECURE A SECOND CIRCUIT BOARD WITH THE FIRST CIRCUIT BOARD SUCH THAT THE FIRST CIRCUIT OVERLAYS THE SECOND CIRCUIT BOARD, THE SECOND CIRCUIT BOARD INCLUDING A SECOND OPERATIONAL COMPONENT HAVING A PROTRUSION ⟋⟍ 3404

POSITION THE PROTRUSION IN THE RECESS ⟋⟍ 3406

DISPOSE AN AUDIO MODULE IN THE INTERNAL VOLUME — 3502

POSITION A BRACKET AROUND A PORTION OF THE AUDIO MODULE HOUSING — 3504

SEAL, WITH A SEALING ELEMENT, THE BRACKET AGAINST THE ENCLOSURE AT THE THROUGH HOLE — 3506

3600

SECURE A FIRST LAYER WITH A SECOND LAYER        3602

SECURE A THIRD LAYER WITH THE SECOND LAYER        3604

DISPLAY MODULE AND GLASS WITH UNDERCUT PLASTIC FRAME

CROSS-REFERENCE TO RELATED APPLICATION(S)

This is a continuation of U.S. application Ser. No. 17/807,396, filed 17 Jun. 2022, and titled "DISPLAY MODULE & GLASS WITH UNDERCUT PLASTIC FRAME," which is a continuation of U.S. patent application Ser. No. 16/816,212, filed Mar. 11, 2020, and titled "DISPLAY MODULA & GLASS WITH UNDERCUT PLASTIC FRAME," now U.S. Pat. No. 11,392,175, issued Jul. 19, 2022, which is a continuation of and claims the benefit from U.S. patent application Ser. No. 15/712,070, filed Sep. 21, 2017, and titled "DISPLAY MODULE & GLASS WITH UNDER-CUT PLASTIC FRAME," now U.S. Pat. No. 10,631,437, issued Apr. 1, 2020 which claims the benefit of priority to (i) U.S. Provisional Application No. 62/398,037, filed on Sep. 22, 2016, and titled "DISPLAY MODULE & GLASS WITH UNDERCUT PLASTIC FRAME"; (ii) U.S. Provisional Application No. 62/398,045, filed on Sep. 22, 2016, and titled "BATTERY ARCHITECTURE IN AN ELEC-TRONIC DEVICE"; (iii) U.S. Provisional Application No. 62/398,059, filed on Sep. 22, 2016, and titled "STACKED MLB ARCHITECTURE IN AN ELECTRONIC DEVICE"; (iv) U.S. Provisional Application No. 62/398,065, filed on Sep. 22, 2016, and titled "CLOSED AUDIO MODULE IN AN ELECTRONIC DEVICE"; (v) U.S. Provisional Application No. 62/398,069, filed on Sep. 22, 2016, and titled "THERMAL DISTRIBUTION ASSEMBLY IN AN ELEC-TRONIC DEVICE"; and (vi) U.S. Provisional Application No. 62/557,090, filed on Sep. 11, 2017, and titled "POR-TABLE ELECTRONIC DEVICE", the disclosure of each is incorporated herein by reference in its entirety.

FIELD

The following description relates to electronic devices. In particular, the following relates to an electronic device that includes a display assembly having several active layers. The display assembly is designed to bend or curve around a force sensitive layer. Also, in order to increase an amount of available space in an electronic device, the electrical and mechanical connections of the active layers are positioned in different locations.

BACKGROUND

An electronic device may include a display assembly. When the display assembly includes multiple layers, the volume occupied by the display assembly increases, which may lead to engineering and design changes to accommo-date the increased volume. Moreover, each of the layers requires an electrical and mechanical connection. When the electrical and mechanical connections are stacked on top of, or in close proximity to, one another, additional design challenges may result.

SUMMARY

In one aspect, a display assembly for an electronic device is described. The display assembly may include a touch sensitive layer capable of detecting a touch input capable of controlling the electronic device. The display assembly may further include a force sensitive layer capable of detecting an amount of force applied to the touch sensitive layer. The display assembly may further include a display layer that is capable of presenting visual information. The display layer may at least partially be positioned between the touch sensitive layer and the force sensitive layer. In some embodi-ments, the display layer at least partially curves around the force sensitive layer.

In another aspect, an electronic device is described. The electronic device may include a protective layer that is formed from a transparent material. The electronic device may further include a display assembly covered by the protective layer. The display assembly may include a force sensitive layer capable of detecting an amount of force applied to the protective layer. The display assembly may further include a display layer between the touch sensitive layer and the force sensitive layer. In some embodiments, the display at least partially bends around the force sensitive layer defining a bend. The electronic device may further include a frame that carries the protective layer. The frame may include a notch that at least partially receives the display at the bend.

In another aspect, a method for forming a display assem-bly for an electronic device is described. The method may include positioning a display layer between a touch sensitive layer and a force sensitive layer. The touch sensitive layer can be configured to detect a touch input that controls the electronic device. The force sensitive layer can be config-ured to detect an amount of force applied to the touch sensitive layer. The method may further include bending the display layer such that the display layer least partially curves around the force sensitive layer.

Other systems, methods, features and advantages of the embodiments will be, or will become, apparent to one of ordinary skill in the art upon examination of the following figures and detailed description. It is intended that all such additional systems, methods, features and advantages be included within this description and this summary, be within the scope of the embodiments, and be protected by the following claims.

BRIEF DESCRIPTION OF THE DRAWINGS

The disclosure will be readily understood by the follow-ing detailed description in conjunction with the accompa-nying drawings, wherein like reference numerals designate like structural elements, and in which:

FIG. 49 illustrates a flowchart showing a method for forming a circuit board assembly, in accordance with some described embodiments;

Figure 1:
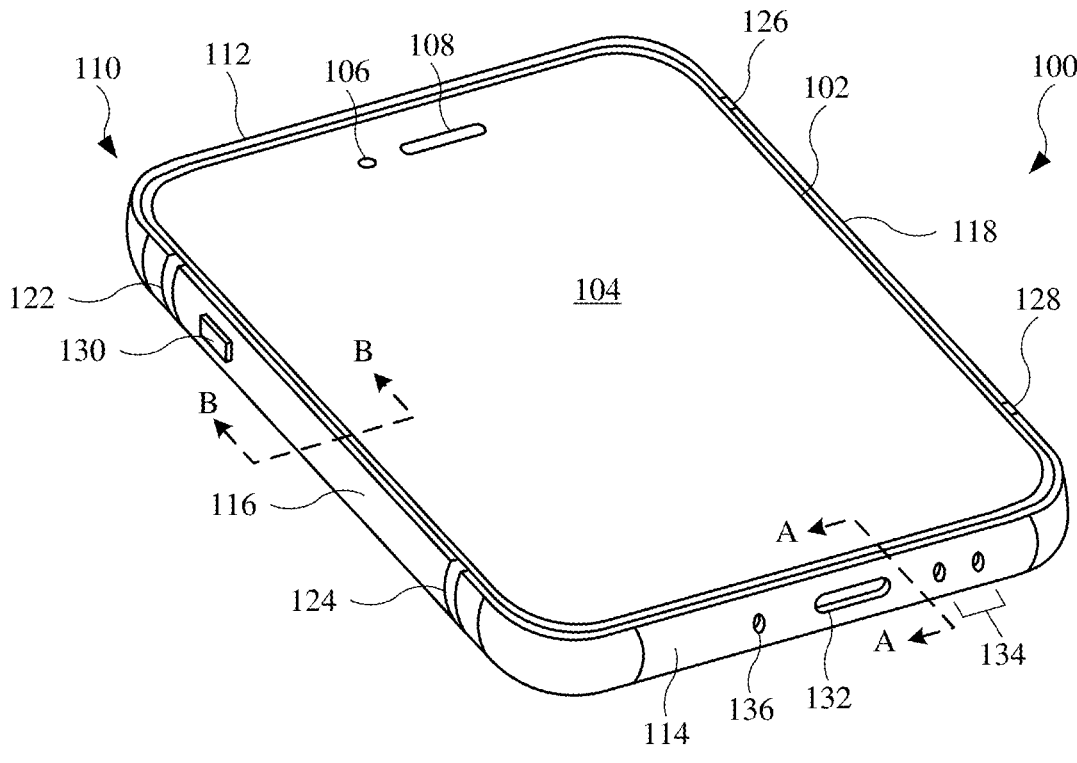
FIG. 1 illustrates a front isometric view of an embodiment of an electronic device, in accordance with some described embodiments.

Those skilled in the art will appreciate and understand that, according to common practice, various features of the drawings discussed below are not necessarily drawn to scale, and that dimensions of various features and elements of the drawings may be expanded or reduced to more clearly illustrate the embodiments of the present invention described herein.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting such that other embodiments may be used, and changes may be made without departing from the spirit and scope of the described embodiments.

The following disclosure relates to an electronic device. The electronic device may include several enhancements over traditional devices. For example, the electronic device may include an enclosure that defines an internal volume of the electronic device. The electronic device may further include a display that extends to the enclosure in at least some locations, thereby increasing the size of the display. The display may be part of a display assembly that further includes a touch sensitive layer and a force sensitive layer. In order to accommodate the increased display size, the electronic device may include a border (or frame) surrounding the display, with the frame having a decreased size. However, without certain modifications, the reduced size of the border may expose electrical and mechanical connections between the display assembly components and flexible circuits (in the electronic device). In this regard, some components of the display assembly may be electrically and mechanically coupled with their respective circuitry (including flexible circuits) in different locations throughout the electronic device so as to hide the electrical and mechanical connections from view. For example, the touch sensitive layer and the display may electrically and mechanically couple with their respective circuitry at one location inside the electronic device, while the force sensitive layer electrically and mechanically couples with circuitry at a different location away from the electrical and mechanical connections between the touch sensitive layer, the display, and their respective flexible circuits. Also, by routing the electrical and mechanical connections in different locations, the volume occupied by the display assembly (and its components) can be reduced, and additional room in the internal volume of the electronic device is available for use by a different component(s) in the electronic device.

The electronic device may further include a circuit board assembly designed to occupy less space in the electronic device. For example, the circuit board assembly may be divided into a first circuit board stacked over a second circuit board. A stacked configuration of multiple circuit boards (one stacked over the other) may reduce the footprint of the circuit board assembly in two dimensions. Also, the aforementioned circuit boards may include operational components (such as integrated circuits or processor circuits) positioned on multiple, opposing surfaces. Also, the circuit board assembly may include several interposers, or interconnects, designed to carry signals between the first and second circuit boards, such that the first and second circuit boards (as well as their respective operational components) are in communication with one another.

In some instances, the stacked circuit board assembly may include an operational component (located on one of the circuit boards) that includes a recess and an additional operational component (located on one of the other circuit board) that includes a protrusion (or protruding feature) that is partially positioned in the recess. In this manner, the circuit boards can be positioned closer together based on the recess receiving a portion of the additional operational component, thereby further reducing the footprint of the stacked circuit board assembly. Further, in some instances, the operational components may electrically couple with one another. For example, the recess may include a connector and the protrusion may include a connector that electrically couples to the connector of the recess. As a result of the electrical connection between the operational components, the circuit boards may also be in electrical communication with each other. This may reduce the requirements for separate and dedicated electrical connectors used to electrically couple the circuit boards.

The electronic device may further include a battery assembly, or internal power supply. Due in part to the modifications to the display assembly and the circuit board assembly that create additional space in the enclosure, the battery assembly may increase in size and occupy at least some of the additional space, thereby increasing the charge capacity of the battery assembly. Furthermore, the battery assembly may include a shape other than a traditional rectilinear shape. For example, the battery assembly may include an L-shaped configuration formed by die cutting several electrodes in an L-shaped configuration, similar to that of the battery assembly, to form the battery assembly. Also, additional components, such as antennae and circuits, may be repositioned in the electronic device in order to increase the size of the battery assembly. In addition, the battery assembly may include modifications, such as a channel, designed to accommodate a flexible circuit routed across the battery assembly, and in particular, across the channel.

Also, in some instances, the enclosure may include a metal band that couples with a transparent protective layer (such as a cover glass) that covers the display assembly. The metal band may include a metal such as aluminum, or a metal alloy that includes aluminum. The enclosure may further include an additional protective layer coupled with the metal band. The additional protective layer may include a non-metal material, such as glass, sapphire, plastic, or the like. The additional protective layer may substantially define a rear or bottom wall of the electronic device. Accordingly, the ability of the enclosure to distribute and dissipate heat from the electronic device may be limited, as an amount of metal used for the enclosure is limited to the metal band, and glass includes a significantly lower thermal conductivity as compared to that of the metal that forms the metal band.

When one or more components (such as integrated circuits) in the electronic device generate heat, it may be necessary to remove the heat from the internal volume to avoid damage to a component (or components) in the electronic device. In this regard, the electronic device may include a thermal distribution assembly disposed against or near the additional protective layer. The thermal distribution assembly is designed to dissipate (or redistribute) thermal energy generated from the heat-generating component(s) to the metal band, allowing the thermal energy to dissipate from the electronic device. The thermal distribution assembly may include several layers of metal, one of which may include a relatively high thermal conductivity (as compared to the remaining layers). Accordingly, the electronic device may include an enclosure with a bottom wall made of glass, which may improve the overall aesthetics of the electronic device, while also having the ability to remove heat from the electronic device before the temperature inside the electronic device increases and causes damage to any of the internal components of the electronic device. Moreover, the layers of relatively low thermal conductivity may prevent heat transfer to the glass bottom wall, thereby preventing or limiting thermal energy reaching a user of the electronic device while holding the electronic device.

Also, when a user interacts with the display assembly, the force sensitive layer may determine an amount of force exerted on the display in order to generate a command in accordance with the amount of determined force. However, the force applied to the display assembly (by way of the protective layer that covers the display assembly) may bend the display assembly and the protective layer, thereby reducing the internal volume and increasing the internal air pressure. The increased internal air pressure may affect other components, such as an audio module designed to generate acoustical energy. In order to shield the audio module from increased air pressure, the audio module may include a housing, or enclosure, that encloses the components of the audio module, including a back volume of the audio module, and provides a shield from the air in the internal volume of the electronic device, and accordingly, shields the back volume of the audio module from pressure changes in the electronic device. In this manner, the audio module is unaffected from pressure changes in the electronic device and generates acoustical energy without disturbances from the pressure changes.

These and other embodiments are discussed below with reference to FIGS. 1-51. However, those skilled in the art will readily appreciate that the detailed description given herein with respect to these Figures is for explanatory purposes only and should not be construed as limiting.

FIG. 1 illustrates a front isometric view of an embodiment of an electronic device 100, in accordance with some described embodiments. In some embodiments, the electronic device 100 is a tablet computer device. In other embodiments, the electronic device 100 is a wearable electronic device that includes one or more straps (not shown) designed to wrap around an appendage (such as a wrist) of a user to secure the electronic device 100 with the user. In the embodiment shown in FIG. 1, the electronic device 100 is a mobile communication device, such as a smartphone. Accordingly, the electronic device 100 may enable wireless communication in the form of cellular network communication, Bluetooth communication (2.4 GHz), and/or wireless local area network (WLAN) communication (2.4 GHz to 5 GHZ), as non-limiting examples. As shown, the electronic device 100 may include a display assembly 102 that includes a display layer designed to present visual information in the form of textual information, still images, and/or video information. Although not shown, the display assembly 102 may further include a touch sensitive layer designed to detect a touch input to the display assembly 102 in order to, for example, control the information presented on the display assembly 102. Also, the display assembly 102 may further include a force sensitive layer designed to detect an amount of force applied to the display assembly 102. The determined amount of force may correspond to a particular input or command to a processor circuit (not shown) that controls the display assembly 102. For example, different detected amounts of force may correspond to different or distinct commands.

In order to protect the display assembly 102, the electronic device 100 may include a first protective layer 104 that overlays the display assembly 102. A second protective layer (not shown) of the electronic device 100 will be shown and discussed below. The first protective layer 104 may include a transparent material(s), including glass, sapphire, or plastic, as non-limiting examples. As shown, the first protective layer 104 may include openings that facilitate user interaction with the electronic device 100. For example, the first protective layer 104 may include a first opening 106 and a second opening 108. The electronic device 100 may include an image capture device (not shown) that captures an image (or images) through the first opening 106. The electronic device 100 may further include an audio module (not shown) that generates acoustical energy in the form of audible sound, which exits the electronic device 100 via the second opening 108.

Also, the electronic device 100 may include a band 110 that defines an outer perimeter of the electronic device 100. Generally, the band 110 includes a shape similar to that of a 4-sided ring. However, other shapes are possible. Also, the band 110 may define multiple sidewalls and an opening to at least partially receive and secure with the first protective layer 104 and a second protective cover (not shown). In some embodiments, the band 110 includes a metal, such as aluminum or an alloy that includes aluminum. In this regard, the band 110 may provide a rigid support structure for the electronic device 100. Also, when the band 110 is formed from a metal, the band 110 may include several sidewalls, some of which are used to support wireless communication. For example, the band 110 may include a first sidewall component 112 that forms a U-shape design, as well as a second sidewall component 114 that also forms a U-shape design. The first sidewall component 112 and the second sidewall component 114 may each function in conjunction with a radio circuit (not shown) in the electronic device 100 such that the first sidewall component 112 and the second sidewall component 114 each form at least part of an antenna for their respective radio circuits. For example, the first sidewall component 112 may function in conjunction with a WLAN radio circuit, and the second sidewall component 114 may function in conjunction with a cellular network radio circuit.

Also, the band 110 may further include a third sidewall component 116 and a fourth sidewall component 118, with the third sidewall component 116 and the fourth sidewall component 118 separated from both the first sidewall component 112 and the second sidewall component 114 by split regions, or openings. For example, the band 110 may include a first split region 122 and a second split region 124 that combine to separate the third sidewall component 116 from the first sidewall component 112 and the second sidewall component 114. Also, the band 110 may include a third split region 126 and a fourth split region 128 that combine to separate the fourth sidewall component 118 from the first sidewall component 112 and the second sidewall component 114. The aforementioned split regions may be filled with a non-metal material, such as molded plastic (or other non-electrically conductive material), to provide a flush, co-planar surface with the various parts of the band 110. With the first sidewall component 112 and the second sidewall component 114 being electrically isolated from the third sidewall component 116 and the fourth sidewall component 118, the first sidewall component 112 and the second sidewall component 114 may function as part of an antenna, while the third sidewall component 116 and the fourth sidewall component 118 may function as an electrical ground for one or more internal components (not shown) that are electrically coupled with the third sidewall component 116 and the fourth sidewall component 118, respectively. Also, each of the first sidewall component 112, the second sidewall component 114, the third sidewall component 116, and the fourth sidewall component 118 may provide a protective structural component for at least some internal components, as well as provide thermal dissipation and heat removal for some heat-generating components (not shown) of the electronic device 100, provided the heat-generating components are thermally coupled with at least one of the aforementioned parts. Also, the first sidewall component 112, the second sidewall component 114, the third sidewall component 116, and the fourth sidewall component 118 may each represent at least a portion of first sidewall, a second sidewall, a third sidewall, and a fourth sidewall, respectively.

The electronic device 100 may further include one or more input devices. For example, the electronic device 100 includes a first button 130 designed to generate an input when depressed. The input may generate an electrical signal sent to a processor circuit (not shown) in the electronic device 100, in order to alter the visual information presented on the display assembly 102. As shown, the first button 130 is located along the third sidewall component 116. However, other locations are possible. Also, although not shown, the electronic device 100 may include a switch designed to provide an additional user input function.

Also, the electronic device 100 may further include a data port 132 designed to receive and electrically couple with a cable assembly (not shown). The data port 132 may receive data/communication from the cable assembly, as well as electrical energy to charge a battery assembly (not shown) located in the electronic device 100. Also, the electronic device 100 may include additional openings designed for various user interactions. For example, the electronic device 100 may an audio module (not shown) located near openings 134, or through holes, formed in the second sidewall component 114. The openings 134 allow acoustical energy generated from the audio module to exit the electronic device 100. Also, the electronic device 100 may further include a microphone (not shown) located near an opening 136, or through hole, formed in the second sidewall component 114. The microphone may be positioned to receive acoustical energy through the opening 136.

Figure 2:
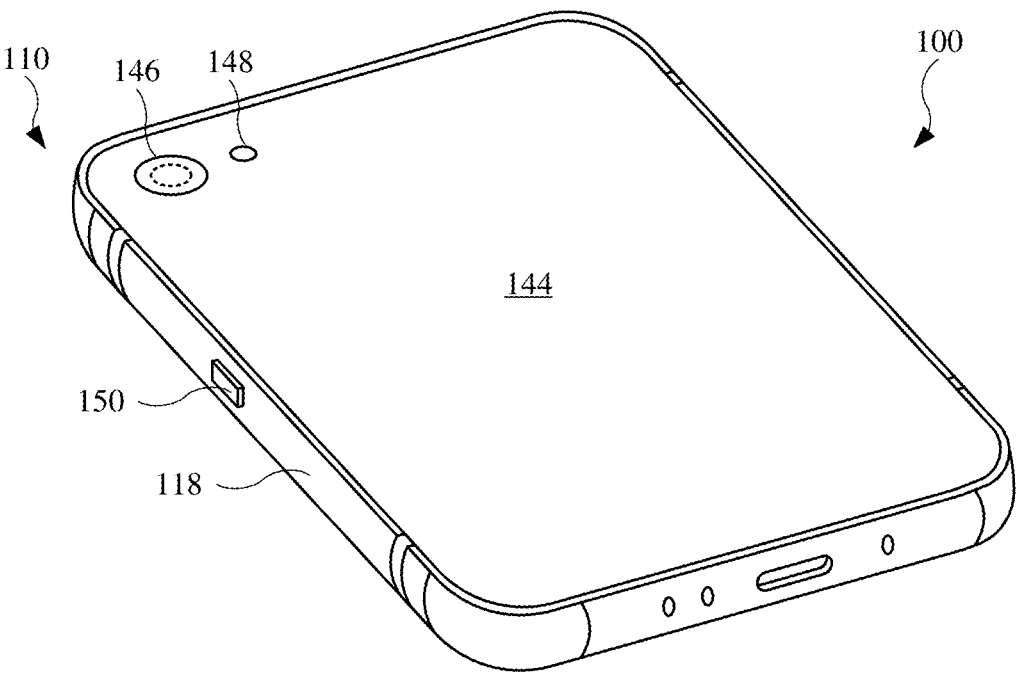
FIG. 2 illustrates a rear isometric view of the electronic device shown in FIG. 1, further showing additional features of the electronic device.

FIG. 2 illustrates a rear isometric view of the electronic device 100 shown in FIG. 1, further showing additional features of the electronic device 100. As shown, the electronic device 100 may include a second protective layer 144 secured with the band 110. The second protective layer 144 may combine with the band 110 to define an enclosure that includes an internal volume, or cavity, that receives several internal components, such as circuit boards, integrated circuits, and a battery assembly, as non-limiting examples. In this regard, the band 110 may include a first edge region that receives the first protective layer 104 (shown in FIG. 1), as well as a second edge region that receives the second protective layer 144, with the first edge region and the second edge region in opposite, or opposing, locations of the band 110. Also, the second protective layer 144 may be referred to as a bottom wall or back wall.

Generally, the second protective layer 144 may include a material (or materials) that provides an aesthetic finish, such as glass, sapphire, or plastic. Also, in some instances, the material makeup of the second protective layer 144 may allow radio frequency ("RF") communication, generated from internal radio circuits (not shown) of the electronic device 100, to permeate through the second protective layer 144. In this manner, the electronic device 100 may be in wireless communication with other devices (not shown) by way of RF communication that is substantially uninhibited by the second protective layer 144.

Also, the second protective layer 144 may include openings that facilitate user interaction with the electronic device 100. For example, the second protective layer 144 may include a first opening 146 and a second opening 148. The electronic device 100 may include an image capture device (not shown) that captures an image (or images) through the first opening 146. The electronic device 100 may further include a flash module (not shown) aligned with the second opening 148, with the flash module generating light energy passing through the second opening 148 during an image capture event from the image capture device in order to enhance image quality of the image(s) taken by the image capture device. Also, in addition to the first button 130 (shown in FIG. 1), the electronic device 100 may further include a second button 150 designed to generate an input when depressed, in a manner similar to that for the first button 130. As shown, the second button 150 is located along the fourth sidewall component 118. However, other locations are possible.

Figure 3:
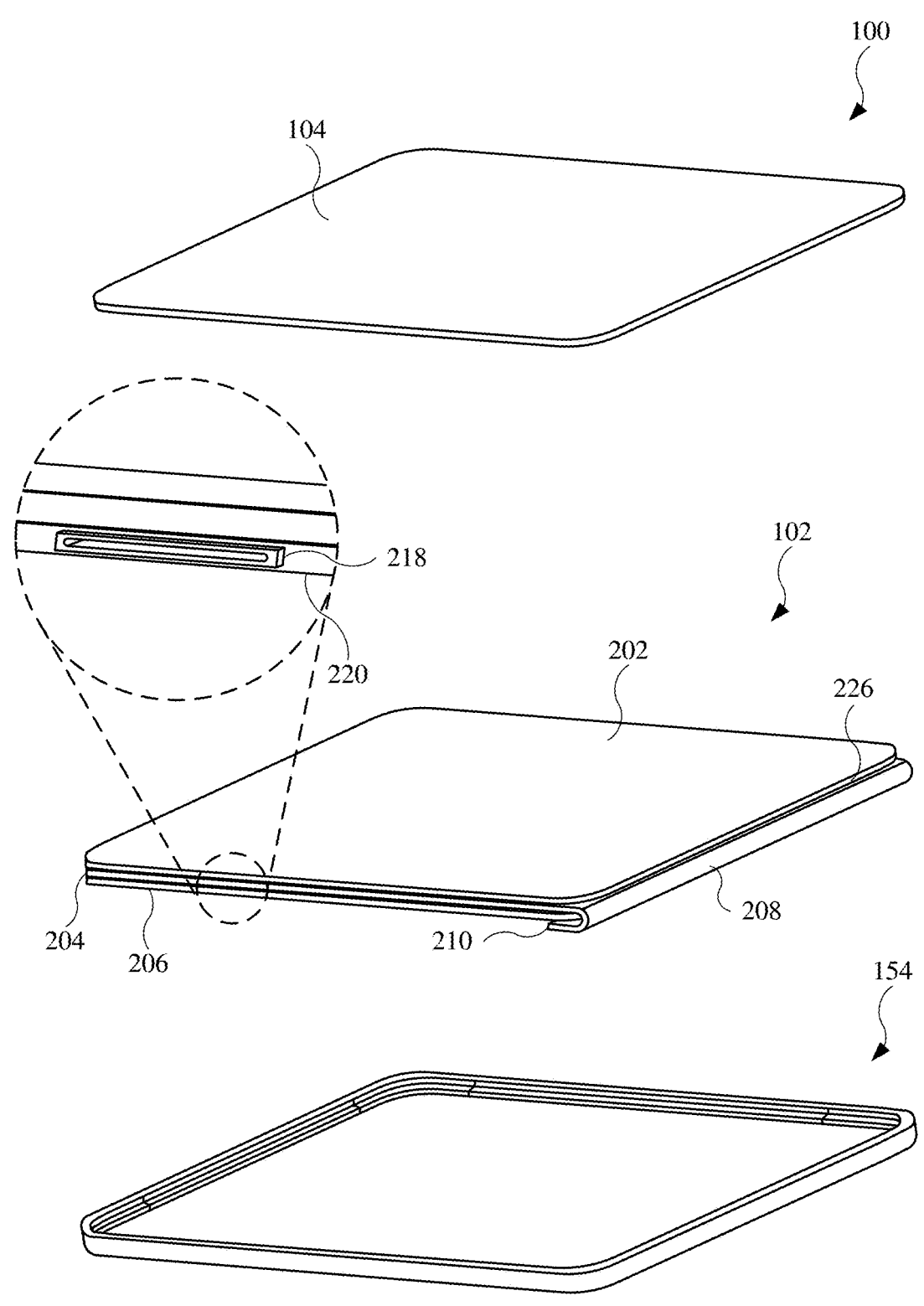
FIG. 3 illustrates a partial exploded view of the electronic device shown in FIG. 1, showing various components of the electronic device.

FIG. 3 illustrates a partial exploded view of the electronic device 100 shown in FIG. 1, showing various components of the electronic device 100. Several features of the electronic device 100 are not shown for purposes of simplicity. As shown, the first protective layer 104 may overlay the display assembly 102. Also, the first protective layer 104 may adhesively secure with the display assembly 102 by an adhesive layer (not shown).

As shown, the display assembly 102 may include a touch sensitive layer 202 designed to receive a touch input, a display layer 204 designed to present visual information, and a force sensitive layer 206 designed to detect an amount of force applied to, or exerted on, the display layer 204 by way a force applied to at least one of the first protective layer 104, the touch sensitive layer 202, and the display layer 204. Also, although not shown, the display assembly 102 may include adhesive layers to adhesively secure the touch sensitive layer 202 with the display layer 204, and to adhesively secure the display layer 204 with the force sensitive layer 206.

The touch sensitive layer 202 is designed to receive a touch input when, for example, a user (not shown) depresses the first protective layer 104. The touch sensitive layer 202 may include capacitive touch-sensitive technology. For example, the touch sensitive layer 202 may include a layer of capacitive material that holds an electrical charge. The layer of capacitive material is designed to form a part of multiple capacitive parallel plates throughout a location corresponding to the display layer 204. In this regard, when a user touches the first protective layer 104, the user forms one or more capacitors. Moreover, the user causes a volt drop across the one or more capacitors, which in turns causes the electrical charge of the capacitive material to change at a specific point (or points) of contact corresponding to a location of the user's touch input. The capacitance change and/or voltage drop can be measured by the electronic device 100 to determine the location of the touch input. Also, the touch sensitive layer 202 may include an edge region 226 that includes a connector (shown later).

In some embodiments, the display layer 204 includes a liquid crystal display ("LCD") that relies upon backlighting to present the visual information. In the embodiment shown in FIG. 3, the display layer 204 includes an organic light emitted diode ("OLED") display designed to illuminate individual pixels, when needed. When the display layer 204 includes OLED technology, the display layer 204 may include a reduced form factor as compared to that of an LCD display. In this regard, the display assembly 102 may include a smaller footprint, thereby creating more space for other components such as a battery assembly (shown later). Furthermore, when the display layer 204 includes OLED technology, the display layer 204 can curve or bend without causing damage to the display layer 204. For example, as shown in FIG. 3, the display layer 204 includes a bend 208. The bend 208 may include a 180-degree bend, or approximately 180-degree bend. The bend 208 allows the display layer 204 to bend or curve around at least a portion of the force sensitive layer 206, as shown in FIG. 3. Also, the display layer 204 may include an edge region 210 that includes a connector (not shown) used to electrically and mechanically couple the display layer 204 with a flexible circuit (not shown) that electrically couples with a circuit board assembly (shown below), with flexible circuit placing the display layer 204 in communication with the circuit board assembly. Also, in some embodiments, the display layer 204 may include an active matrix organic light emitting diode ("AMOLED") display. Also, as shown in FIG. 3, the edge region 226 of the touch sensitive layer 202 is parallel, or at least substantially parallel, with respect to the edge region 210 of the display layer 204, even when the display layer 204 includes the bend 208.

The force sensitive layer 206 may operate by determining an amount of force or pressure applied to the first protective layer 104, the touch sensitive layer 202, and/or the display layer 204. In this regard, the force sensitive layer 206 may distinguish between different amounts of force applied to the electronic device 100. The different amounts of force may correspond to different user inputs. The force sensitive layer 206 may include multiple parallel capacitor plate arrangements, with one plate of each capacitor plate arrangement having an electrical charge. When a force to the first protective layer 104 causes the distance between one or more pairs of parallel plate capacitor to reduce, a change in capacitance between the one or more pairs of parallel plate capacitor may occur. The amount of change in capacitance corresponds to an amount of force exerted on the first protective layer 104. Also, as shown in the enlarged view, the force sensitive layer 206 may include a connector 218 located on an edge region 220 of the force sensitive layer 206, with the edge region 220 perpendicular, or at least substantially perpendicular, with respect to the edge region 210 of the display layer 204 and the edge region 226 of the touch sensitive layer 202. Accordingly, the connector 218 can be positioned perpendicular, or at least substantially perpendicular, with respect to the connector (shown later) of the display layer 204.

Further, in order to support the first protective layer 104 and facilitate assembly of the first protective layer 104 with the band 110 (shown in FIG. 1), the electronic device 100 may include a frame 154 that receives and secures with the first protective layer 104 by an adhesive layer 166. Accordingly, the frame 154 may include a size and shape in accordance with that of the first protective layer 104. The frame 154 may be positioned at least partially between the first protective layer 104 and the band 110. The frame 154 may be formed from a polymeric material, such as plastic, and may also include a metal ring (not shown) that is partially embedded in the polymeric material during an insert molding operation. In this regard, the frame 154 may structurally support the first protective layer 104, as well as one or more components of the display assembly 102. This will be shown below.

Figure 4:
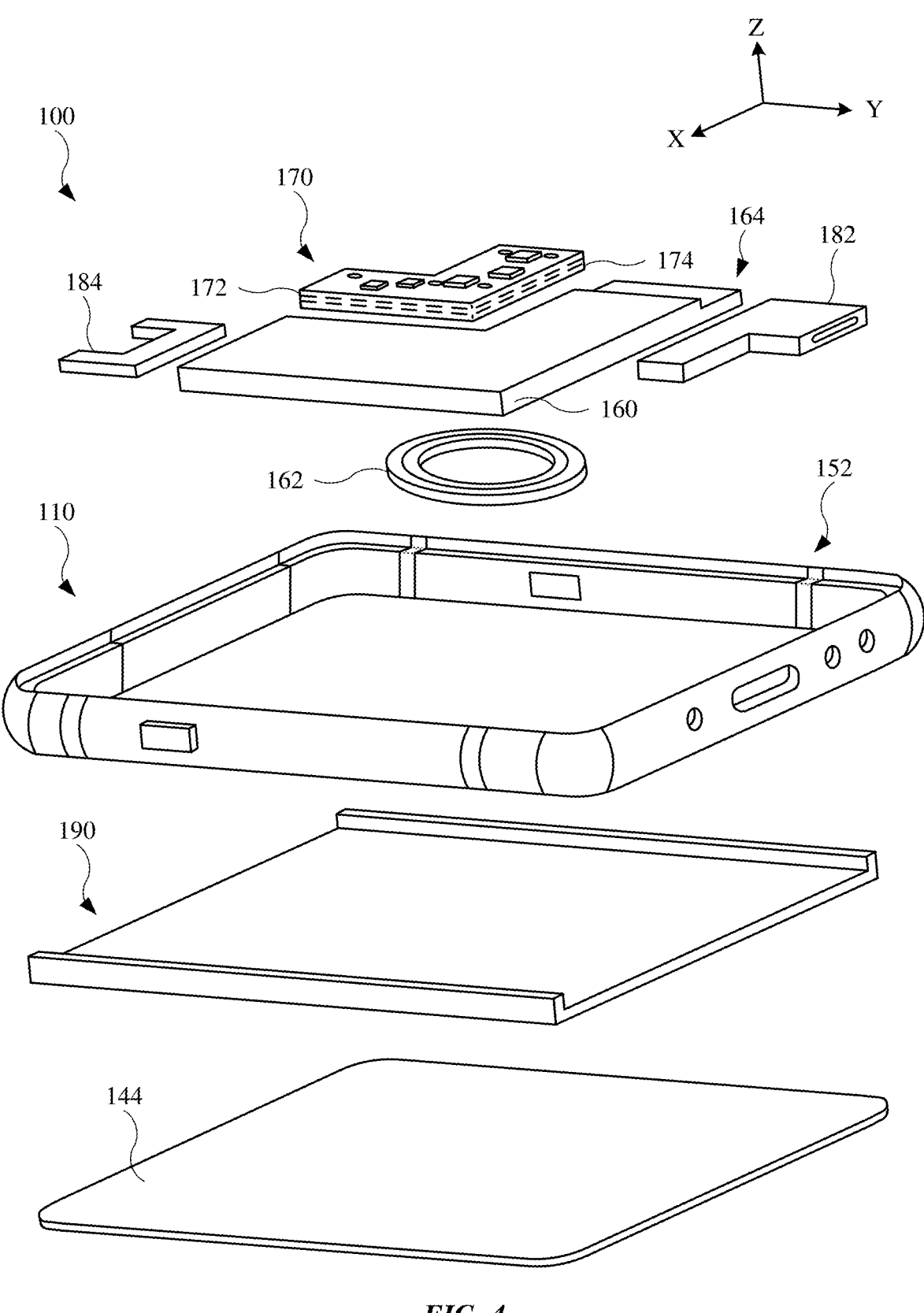
FIG. 4 illustrates a partial exploded view of the electronic device shown in FIG. 1, further showing additional compo-nents of the electronic device.

FIG. 4 illustrates a partial exploded view of the electronic device 100 shown in FIG. 1, further showing additional components of the electronic device 100. Several features of the electronic device 100 are not shown for purposes of simplicity. As shown, the band 110 and the second protective layer 144 may combine to provide an internal volume 152 for several internal components. For example, the electronic device 100 may include a battery assembly 160 designed to distribute electrical current to operational components of the electronic device 100. The battery assembly 160 may include a rechargeable battery designed to receive electrical current during a recharge. For example, the electronic device 100 may include an inductive receiver coil 162 (formed from a metal, such as steel) electrically coupled to the battery assembly 160. The inductive receiver coil 162, when placed in proximity to an alternating magnetic field from a device (not shown) external to the electronic device, may receive an induced electrical current from the alternating magnetic field. The induced electrical current from the inductive receiver coil 162 passes through a transformer to convert alternating current to direct current, which is then used to charge (or recharge) the battery assembly 160. Also, the second protective layer 144 provides little or no impedance to the external magnetic field so that the alternating magnetic field reaches the inductive receiver coil 162.

Also, the battery assembly 160 may further include a channel 164 that includes a reduced dimension (in the z-dimension in Cartesian coordinates, for example), thereby allowing a component, such as a flexible circuit (not shown), to extend along the battery assembly 160 and pass over the battery assembly 160 along the channel 164. Due in part to the increase space provided by the channel 164, other internal components, such as an antenna element (not shown), can be repositioned in the internal volume 152 of the electronic device 100, thereby creating create additional space for the battery assembly 160. In this manner, the volume (size) of the battery assembly 160 may increase, and the increased volume allows the battery assembly 160 to increase electrical storage capacity such that the electronic device 100 provides a longer usage of the electronic device 100 between charging events of the battery assembly 160.

The electronic device 100 may further include a circuit board assembly 170 that includes multiple operational components. As shown, the circuit board assembly 170 may include a first circuit board 172 and a second circuit board 174, with the first circuit board 172 stacked over the second circuit board 174. In this manner, the circuit board assembly 170 can conserve space, in the x- and y-dimensions, in the internal volume 152. Also, the first circuit board 172 and the second circuit board 174 may include multiple surfaces, with each of the multiple surfaces designed to carry one or more components (such as processor circuits). The various features of the circuit board assembly 170 will be discussed below.

The electronic device 100 may further include a first audio module 182 and a second audio module 184, both of which are designed to generate acoustical energy in the form of audible sound. Each of the audio modules may include an opening to emit acoustical energy. However, each audio module is designed to include an acoustical volume (defined by their respective audio modules) that is isolated from the internal volume 152 of the electronic device 100. In this manner, when the internal volume 152 changes by, for example, depressing and bending the first protective layer 104 (shown in FIG. 3) to provide a touch input and/or a force input to the electronic device 100, the audio modules are not affected (acoustically) from the change in the internal volume 152, and associated increased air pressure in the internal volume 152. This will be further discussed below.

The electronic device 100 may further include a thermal distribution assembly 190. Although not shown, the thermal distribution assembly 190 may include several layers of material. In some embodiments, the layers of material differ. For example, some layers are formed from a first type material, while other layers are formed from a second type material different than the first type material. The first type material may include a material having a relatively high thermal conductivity. As an example, the first type material may include copper, known to include a thermal conductivity of approximately 400 W/m*K (Watts per meter per Kelvin degree). Alternatively, the first type may include graphite known to include a thermal conductivity of approximately 170 W/m*K. Accordingly, the first type material is well suited to receive thermal energy and transfer or distribute the thermal energy from one location in the electronic device 100 to another location, thereby facilitating removal of the thermal energy from the electronic device 100. The second type material may include a more robust material, such as stainless steel. In this regard, the second type material may include a relatively lower thermal conductivity. However, the second type material may provide 1) a protective cover for the first type material, 2) structural support for the electronic device 100, and/or 3) a workable surface to secure a component (not shown) with the thermal distribution assembly 190 by, for example, a welding operation. The various layers of the thermal distribution assembly 190 will be further described below.

The thermal distribution assembly 190 is designed to redirect or redistribute heat generated in the electronic device 100. For example, the circuit board assembly 170 may include operational components, such as integrated circuits, known to convert electrical energy (supplied by the battery assembly 160) into thermal energy during operation. The thermal distribution assembly 190 can be thermally coupled with the circuit board assembly 170 by contact between the thermal distribution assembly 190 and the circuit board assembly 170, as a non-limiting example. Also, the thermal distribution assembly 190 may be thermally coupled with the band 110 such that thermal energy received by the thermal distribution assembly 190 from the circuit board assembly 170 may at least partially transfer to the band 110. Accordingly, at least some thermal conductivity lost by using the second protective layer 144 (a non-metal) is regained by using the thermal distribution assembly 190. Also, the thermal distribution assembly 190 may include a size and shape in accordance with the second protective layer 144 such that thermal distribution assembly 190 covers, or at least substantially covers, a surface of the second protective layer 144. For example, the x- and y-dimensions of the thermal distribution assembly 190 may be the same, or substantially similar, to the x- and y-dimensions, respectively, of the second protective layer 144.

Although not shown, the electronic device 100 may include additional components, such a haptic engine and internal antennae, as non-limiting examples. Also, although not shown, the electronic device 100 may include several flexible circuits that place the electronic components (e.g., display assembly 102, circuit board assembly 170) in electrical communication with one another as well as the battery assembly 160.

Figures 5, 6:
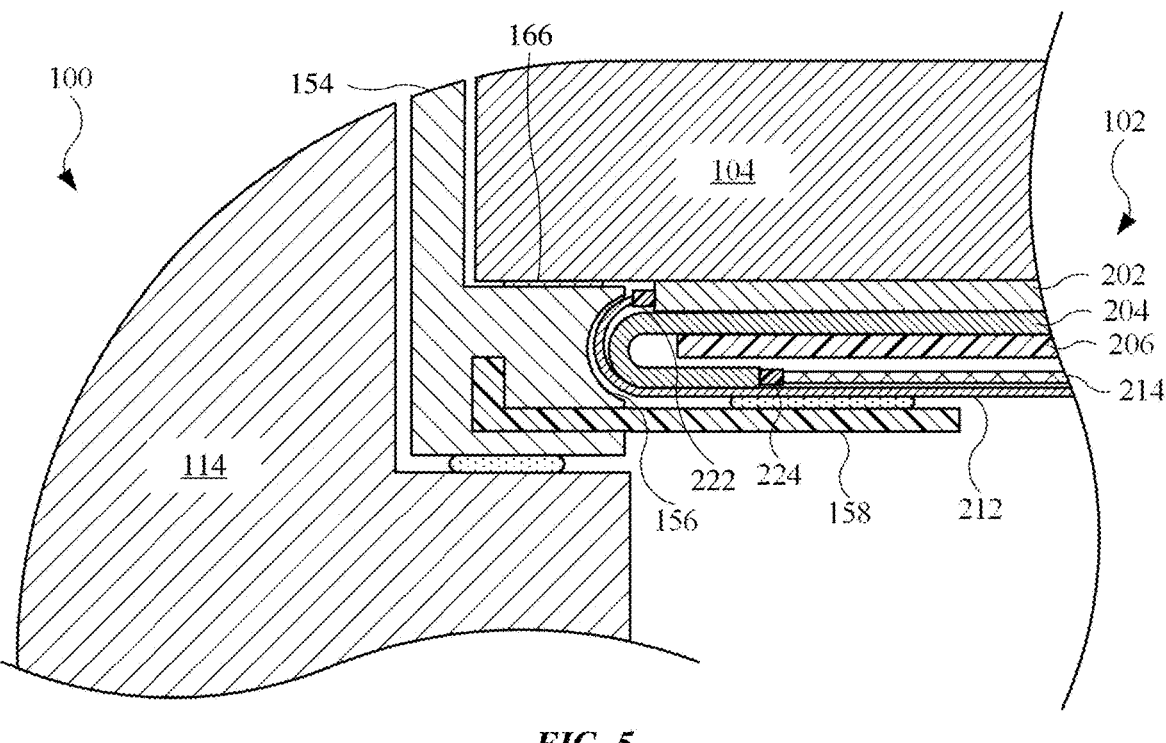
FIG. 5 illustrates a cross sectional view of the electronic device shown in FIG. 1, taken along line A-A in FIG. 1.
FIG. 6 illustrates a cross sectional view of an alternate embodiment of an electronic device, in accordance with some described embodiments.

FIG. 5 illustrates a cross sectional view of the electronic device 100 shown in FIG. 1, taken along line A-A in FIG. 1. As shown, the layer of the display assembly 102—the touch sensitive layer 202, the display layer 204, and the force sensitive layer 206—are assembled. Although not shown, the display assembly 102 may include adhesive layers to adhesively secure the touch sensitive layer 202 with the display layer 204, and to adhesively secure the display layer 204 with the force sensitive layer 206.

The touch sensitive layer 202 is designed to receive a touch input when, for example, a user (not shown) depresses the first protective layer 104. The touch input can be relayed from the touch sensitive layer 202 to the circuit board assembly 170 (shown in FIG. 4) by a first flexible circuit 212 electrically and mechanically coupled with the touch sensitive layer 202 by a connector 222 of the touch sensitive layer 202. The connector 222 can be located on an edge region 226 (shown in FIG. 3) of the touch sensitive layer 202. As shown, the first flexible circuit 212 may bend or curve around the display layer 204 and the force sensitive layer 206 to electrically and mechanically couple with touch sensitive layer 202.

The frame 154 may include design considerations that accommodate the display assembly 102. For example, the frame 154 may include a notch 156, or undercut region, designed to at least partially receive the first flexible circuit 212 and/or the display layer 204. As shown in FIG. 5, the notch 156 includes a size and shape to receive a bent/curved region of both the display layer 204 as well the first flexible circuit 212. While the notch 156 includes a curvature generally corresponding to that of the first flexible circuit 212 and the display layer 204, other shapes, including straight edges, are possible for the notch 156. Also, the notch 156 may be formed during a molding operation of the frame 154. Alternatively, the notch 156 may be formed subsequent to a molding operation by, for example, a cutting operation.

Also, the frame 154 is adhesively secured with the first protective layer 104 and the second sidewall component 114 (of the band 110, shown in FIG. 1) by adhesive layers (not labeled). The frame 154 may include a supporting element 158 partially embedded in the frame 154. In some embodiments, the supporting element 158 includes a ring formed from a metal material that continuously extends around the display assembly 102 in accordance with the frame 154. However, the supporting element 158 may also be discontinuous, and accordingly, may be selectively embedded in the frame 154. As shown, the supporting element 158 may extend along the frame 154 to support the display assembly 102 and the first protective layer 104. Also, the first flexible circuit 212 may adhesively secure with the supporting element 158 by an adhesive layer (not labeled).

FIG. 5 further shows the some components of the display assembly 102 coupled with the flexible circuits at one location while other components are not. For example, the touch sensitive layer 202 is electrically and mechanically coupled with the first flexible circuit 212 by the connector 222, and the display layer 204 is electrically and mechanically coupled with a second flexible circuit 214 by a connector 224, with the connector 222 and the connector 224 located proximate to the second sidewall component 114 (defined by a U-shape configuration, as shown in FIG. 1). The connector 218 (shown in FIG. 3) of the force sensitive layer 206 is located along a different edge region of the force sensitive layer 206 (see FIG. 3). Moreover, the connector 222 and connector 224 electrically and mechanically coupled with the first flexible circuit 212 and the second flexible circuit 214, respectively, at a location proximate to the notch 156 in the frame 154, while the force sensitive layer 206 is not. In addition, the connector 222 may be positioned parallel, or at least substantially parallel, with respect to the connector 224. The force sensitive layer 206 may electrically and mechanically couple to a flexible circuit (not shown) in another separate location (such as the connector 218 on the edge region 220, shown in FIG. 3). This will be shown and described below.

FIG. 6 illustrates a cross sectional view of an alternate embodiment of an electronic device 250, in accordance with some described embodiments. The electronic device 250 may include any feature(s) or component(s) previously described for an electronic device. For example, the electronic device 250 may include a display assembly 252 that includes a touch sensitive layer 262, a display layer 264, and a force sensitive layer 266. However, as shown in FIG. 6, the display layer 264 may include a substantially flat configuration throughout the display layer 264, with a flexible circuit 274 bending around the force sensitive layer 266 to electrically and mechanically couple with the display layer 264.

Figure 7:
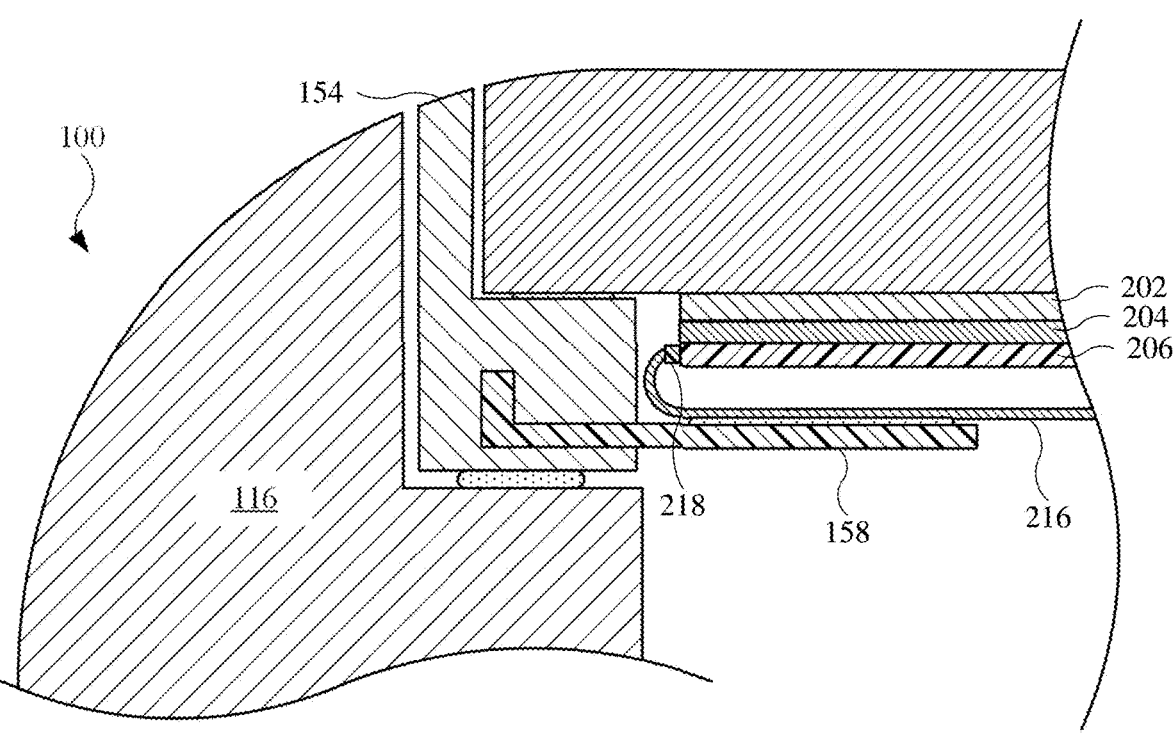
FIG. 7 illustrates a cross sectional view of the electronic device shown in FIG. 1, taken along line B-B in FIG. 1.

FIG. 7 illustrates a cross sectional view of the electronic device 100 shown in FIG. 1, taken along line B-B in FIG. 1. As shown, the connector 218 (also shown in FIG. 3) of the force sensitive layer 206 electrically and mechanically couples the force sensitive layer 206 with a third flexible circuit 216 that electrically couples with the circuit board assembly 170 (shown in FIG. 4) to place the force sensitive layer 206 in communication with the circuit board assembly 170. Also, the third flexible circuit 216 may adhesively secure with the supporting element 158 by an adhesive layer (not labeled).

As shown in FIG. 7, only the force sensitive layer 206 includes an electrical and mechanical connection with a flexible circuit. In other words, the connector 218 that provides the electrical and mechanical connection between the force sensitive layer 206 and the third flexible circuit 216 is in a different location of the electronic device 100, as compared to the connector 222 (shown in FIG. 5) of the touch sensitive layer 202 and the connector 224 (shown in FIG. 5) of the display layer 204. Also, based on the locations of the respective edge regions, the connector 218 of the force sensitive layer 206 is positioned perpendicular, or at least substantially perpendicular, with respect to the connector 222 of the touch sensitive layer 202 and the connector 224 of the display layer 204.

Further, the connector 218 is proximate to the third sidewall component 116 (also shown in FIG. 1), which is defined in part a sidewall that is perpendicular, or approximately perpendicular, to a portion of the second sidewall component 114 (shown in FIGS. 1 and 5). As a result, the frame 154 may not require a notch 156 (shown in FIG. 5) to accommodate the display layer 204 and the first flexible circuit 212 (shown in FIG. 5). Accordingly, the frame 154 may include an asymmetrical frame. Moreover, the additional material of the frame 154 may allow for additional structural rigidity to support the display assembly 102 and the first protective layer 104.

Figure 8:
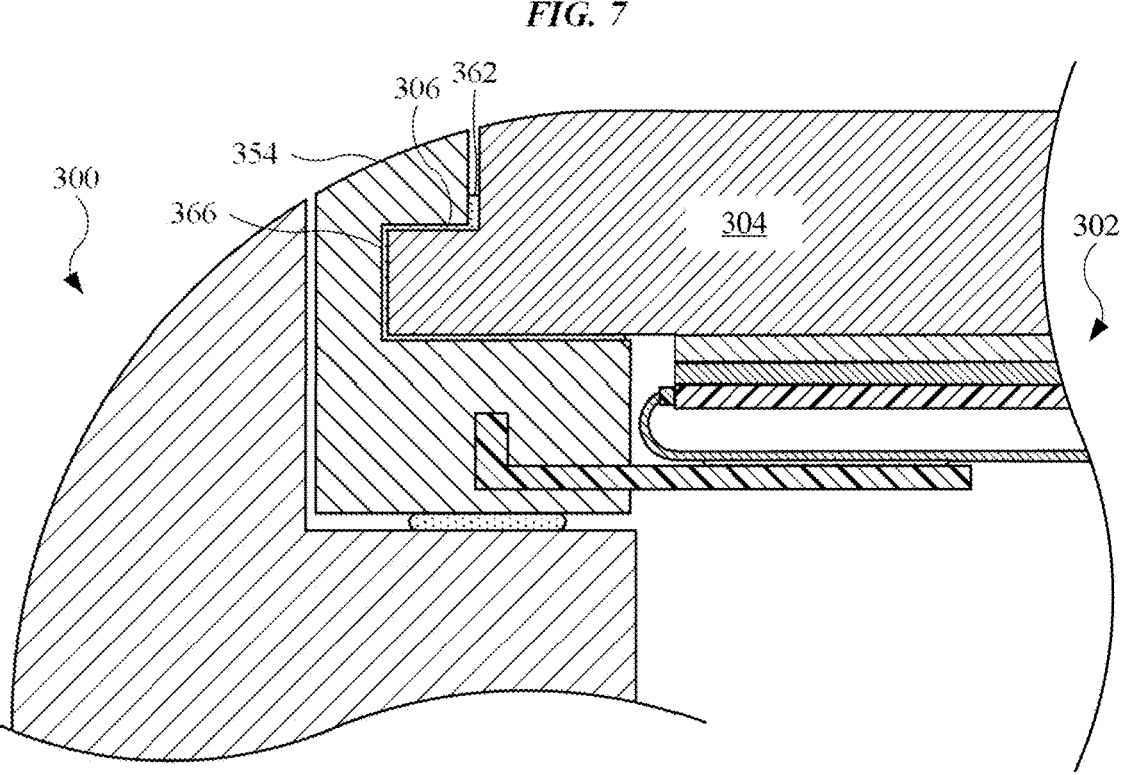
FIG. 8 illustrates a cross sectional view of an alternate embodiment of an electronic device, in accordance with some described embodiments.

FIG. 8 illustrates a cross sectional view of an alternate embodiment of an electronic device 300, in accordance with some described embodiments. The electronic device 300 may include any feature(s) or component(s) previously described for an electronic device. For example, the electronic device 300 may include a first protective layer 304 secured with a display assembly 302, and a frame 354 that carries the first protective layer 304. However, the first protective layer 304 may include an extension 306 that at least partially extends radially outward from the first protective layer 304 in a circumferential manner. In order to accommodate the extension 306, the frame 354 may include a notch 366 that receives the extension 306. The extension 306 provides the first protective layer 304 with an additional structural profile, and can also provide additional surface area to adhesively bond the first protective layer 304 with the frame 354. For example, as shown in FIG. 8, the first protective layer 304 is adhesively secured with the frame 354 by an adhesive layer 362 that extends through a region defined in part by an interface between the frame 354 and the first protective layer 304, including the extension 306. Also, the distance or gap between the frame 354 and the first protective layer 304 (including the extension 306) may cause the adhesive layer 362 to extend through the interface region by capillary forces. As a result, the frame 354 is adhesively secured with the first protective layer 304 by multiple (perpendicular) surfaces in order to form a stronger adhesive bond that counters or offsets forces to the electronic device 300 in multiple directions.

Figure 9:
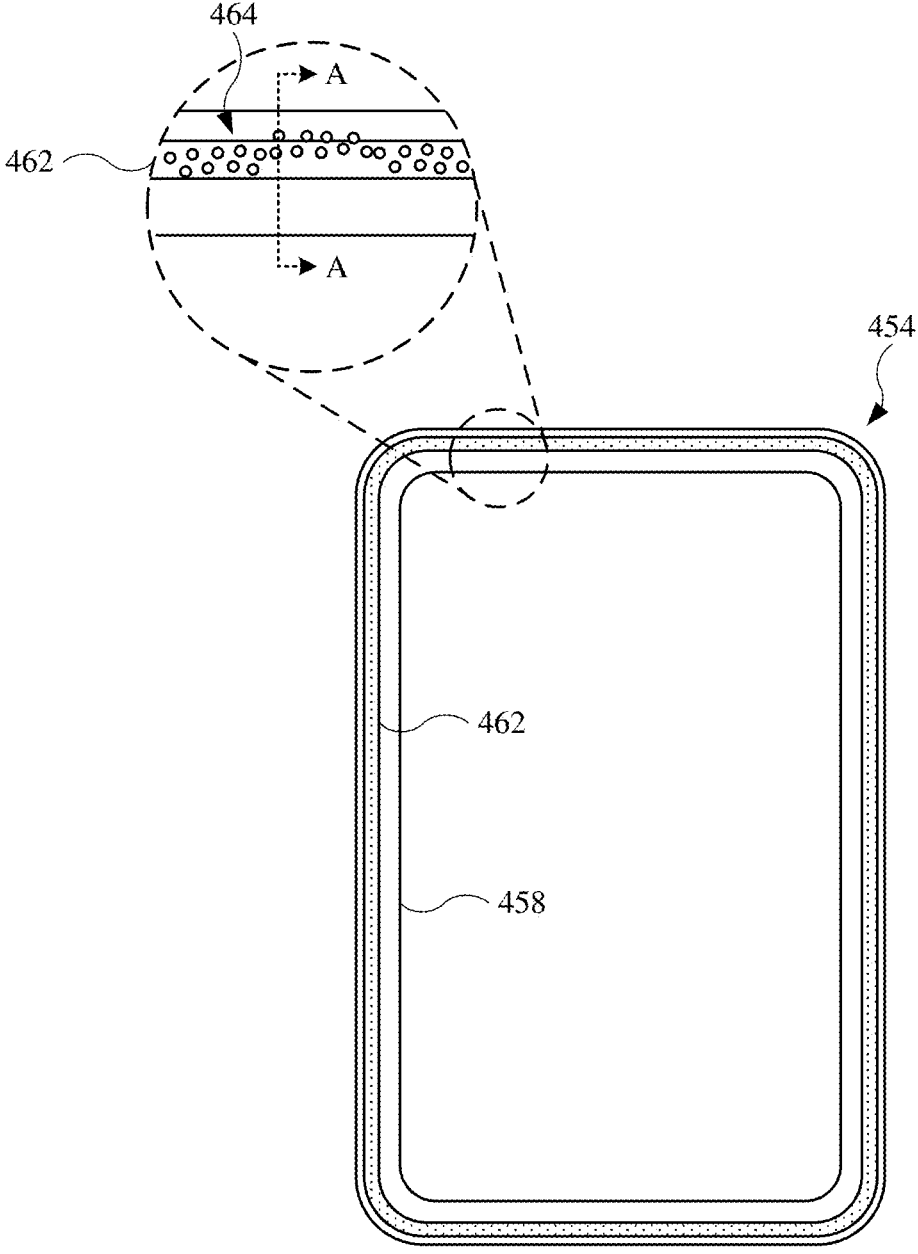
FIG. 9 illustrates a plan view of an embodiment of a frame, in accordance with some described embodiments.

FIG. 9 illustrates a plan view of an embodiment of a frame 454, in accordance with some described embodiments. As shown, the frame 454 may include a supporting element 458, which may include a metal ring molded into the frame 454. The frame 454 may be implemented into one or more of the electronic devices described herein, and may include any features previously described for a frame. In order to improve adhesion forces between an adhesive (not shown) and a surface 462 of the frame 454, the surface 462 may include certain modifications. For example, as shown in the enlarged view, the surface 462 may include a textured region 464 designed to increase the surface tension, or surface energy, of the surface 462. The textured region 464 may enhance an adhesive bond between the frame 454 and a transparent cover (such as the first protective layer 104 shown in FIG. 5) by an adhesive (such as the adhesive layer 166 shown in FIG. 5).

Figure 10:
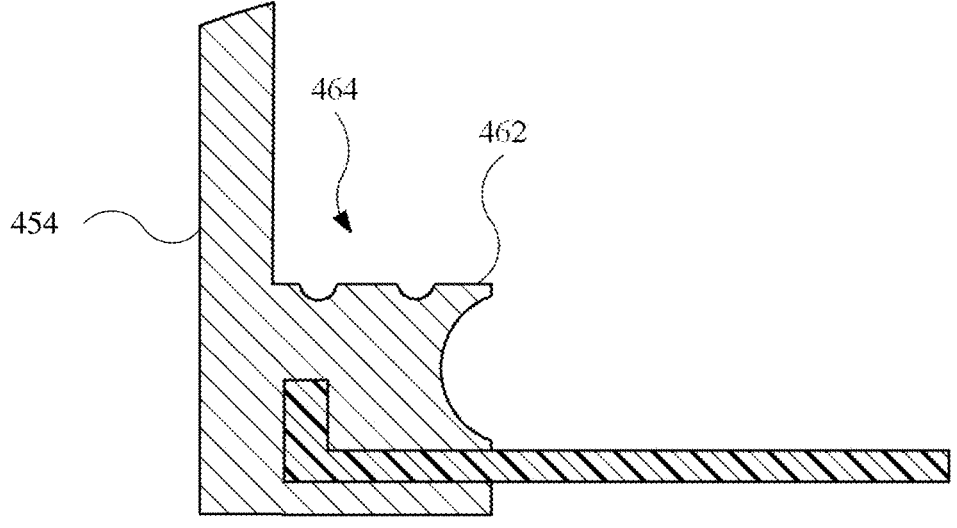
FIG. 10 illustrates a cross sectional view of the frame shown in FIG. 9 taken along line A-A.

FIG. 10 illustrates a cross sectional view of the frame 454 shown in FIG. 9 taken along line A-A. As shown, the textured region 464 may include multiple dimples or divots formed into the frame 454 along the surface 462. The textured region 464 provides additional surface area for the aforementioned adhesive. Several different processes may be used to form the textured region 464. For example, a molding tool (not shown) used to mold the frame 454 may include protruding features that include a shape corresponding to the shape of the textured region 464. Alternatively, the frame 454 may be formed with a molding tool that does not include the protruding features, and subsequent to the molding operation that forms the frame 454, the surface 462 can be etched by a laser, for example, to form the textured region 464. Also, while the textured region 464 defines several dimples or divots formed into the frame 454, several shapes other than dimples or divots are possible. For example, the textured region 464 may include several indentations, linear and/or non-linear.

Figure 11:
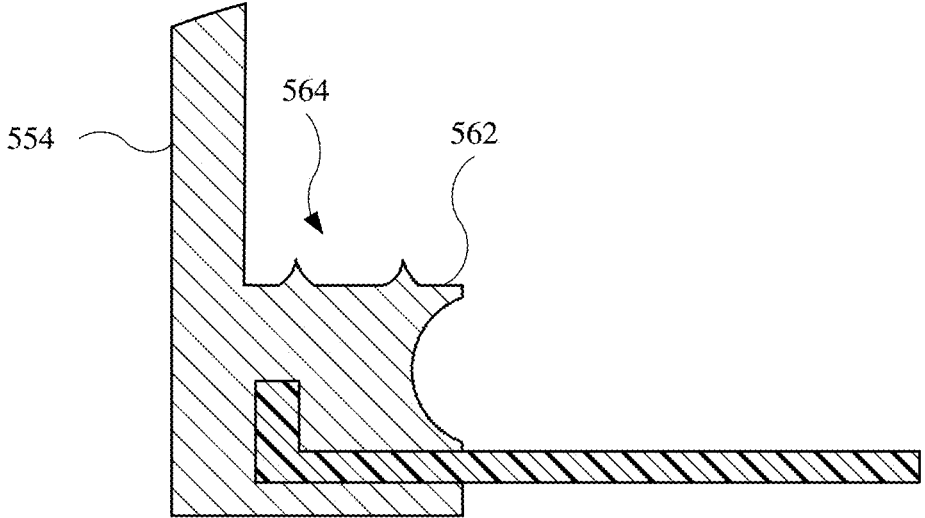
FIG. 11 illustrates a cross sectional view of an alternate embodiment of a frame, showing a surface of the frame having protruding features, in accordance with some described embodiments.

FIG. 11 illustrates a cross sectional view of an alternate embodiment of a frame 554, showing a surface 562 of the frame 554 having protruding features 564, in accordance with some described embodiments. The frame 554 may include any features previously described for a frame. In this regard, the surface 562 may be used to receive a transparent cover (such as the first protective layer 104 shown in FIG. 5) by an adhesive (such as the adhesive layer 166 shown in FIG. 5). As shown, the protruding features 564 may extend from the surface 562. The frame 554, and in particular, the protruding features 564, may be formed by a molding tool (not shown) that includes inserts designed to draw out some of the molding material (used to form the frame 554), thereby causing the protruding features 564 to extend from the surface 562. The protruding features 564 provide additional surface area for the aforementioned adhesive.

Figure 12:
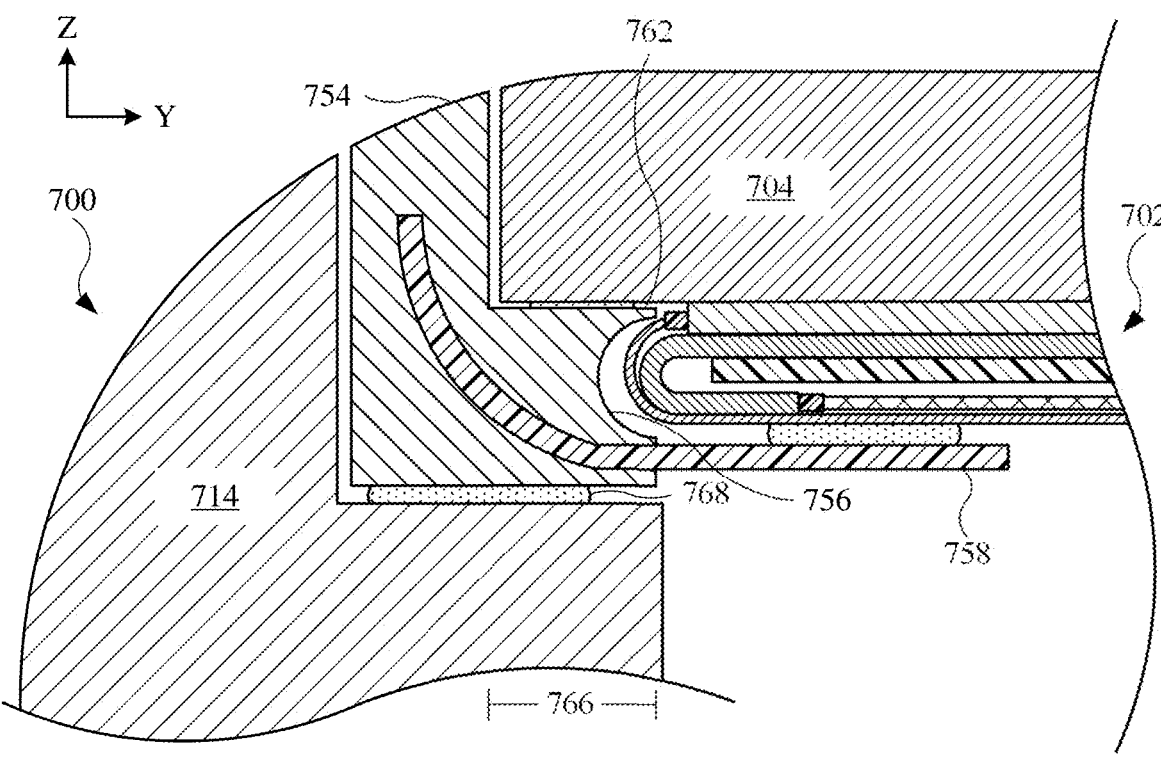
FIG. 12 illustrates a cross sectional view of an embodiment of an electronic device, showing the electronic device having a frame and a supporting element partially embedded in the frame and extending substantially into the frame.

FIG. 12 illustrates a cross sectional view of an embodiment of an electronic device 700, showing the electronic device 700 having a frame 754 and a supporting element 758 partially embedded in the frame 754 and extending substantially into the frame 754. The electronic device 700 may include any features described herein for an electronic device. Also, similar to a prior embodiment, the supporting element 758 may include a ring formed from a metal material that extends around a display assembly 702 of the electronic device 700 and in accordance with the frame 754. As shown, the supporting element 758 may extend, in a z-dimension, beyond the display assembly 702 and also beyond a protective cover 704 (similar to the first protective layer 104 shown in FIG. 1).

In order to extend the supporting element 758 further in the z-dimension, the frame 754 may be widened in the y-dimension. Also, the dimensions of a sidewall component 714 (similar to the second sidewall component 114 shown in FIG. 1) of the electronic device 700 can be reduced in the y-dimension to offset the increased dimension of the frame 754. Further, the material(s) that form the frame 754 may be altered to accommodate the supporting element 758. For example, the frame 754 may include a nylon material mixed with a glass filler material that enhances the overall strength and rigidity of the frame 754. However, in some embodiments, the frame 754 is formed from ceramic. In this regard, the sidewall component 714, as well as any remaining sidewall components, may also be formed from ceramic.

When the supporting element 758 is extended in a manner described, other factors should be taken into consideration. For example, in some instances, the sidewall component 714 forms part of an antenna assembly (not shown) that includes an antenna component designed to provide wireless communication for the electronic device 700. The supporting element 758, when formed from a metal, may cause some interference with the antenna component. This may include forming a parallel plate capacitor between the antenna assembly (including the sidewall component 714) and the supporting element 758. Accordingly, the size, shape, material, and position of the supporting element 758 should be considered in order to prevent unwanted interference. It should be noted that additional techniques can used to optimize the size of the supporting element 758 the proximity to the sidewall component 714. This may include, for example, reducing the z-dimension of the supporting element 758 and/or provide openings, or discontinuities, in the supporting element 758.

The electronic device 700 may include a surface 762 that receives, and adhesively combines with, the protective cover 704. The surface 762 may include a dimension 766 that provides a generally flat surface. However, in some embodiments, the surface 762 is modified to enhance the adhesive bond with the protective cover 704. Also, the frame 754 may include a notch 756, or undercut, formed into the frame 754 that allows the frame 754 to receive the display assembly 702, including flexible circuits and flexible layers of the display assembly 702. The notch 756 can be resized (increased, for example) based upon the increased dimension of the frame 754. However, by increasing the size (in the y-dimension) of the notch 756, additional material of the frame 754 may be removed in a location below the surface 762. It should be noted that additional techniques are be used to optimize the size of the notch 756 with the dimension 766 of the surface 762.

Also, in order to secure the frame 754 with the sidewall component 714, the electronic device 700 may include an adhesive 768 that bonds the frame 754 to the sidewall component 714. As shown, the amount of adhesive 768 used generally allows the sidewall component 714, the frame 754, and the protective cover 704 to form a generally continuous and planar configuration, as denoted by the edges of the aforementioned parts being aligned with one another. However, in order to provide additional protection to the protective cover 704 by the sidewall component 714, the amount of adhesive 768 used can be reduced, causing the protective cover 704 to lower in the z-dimension with respect to the sidewall component 714. In this manner, the sidewall component 714 may additionally cover part of the protective cover 704 and provide additional protection to the protective cover 704 from forces having a force component the y-dimension. It should be noted that additional techniques can used to optimize the amount of adhesive 768 used as well as adjust the size of the frame 754, the sidewall component 714, and the protective cover 704 in order to maintain the generally continuous and planar configuration.

Figure 13:
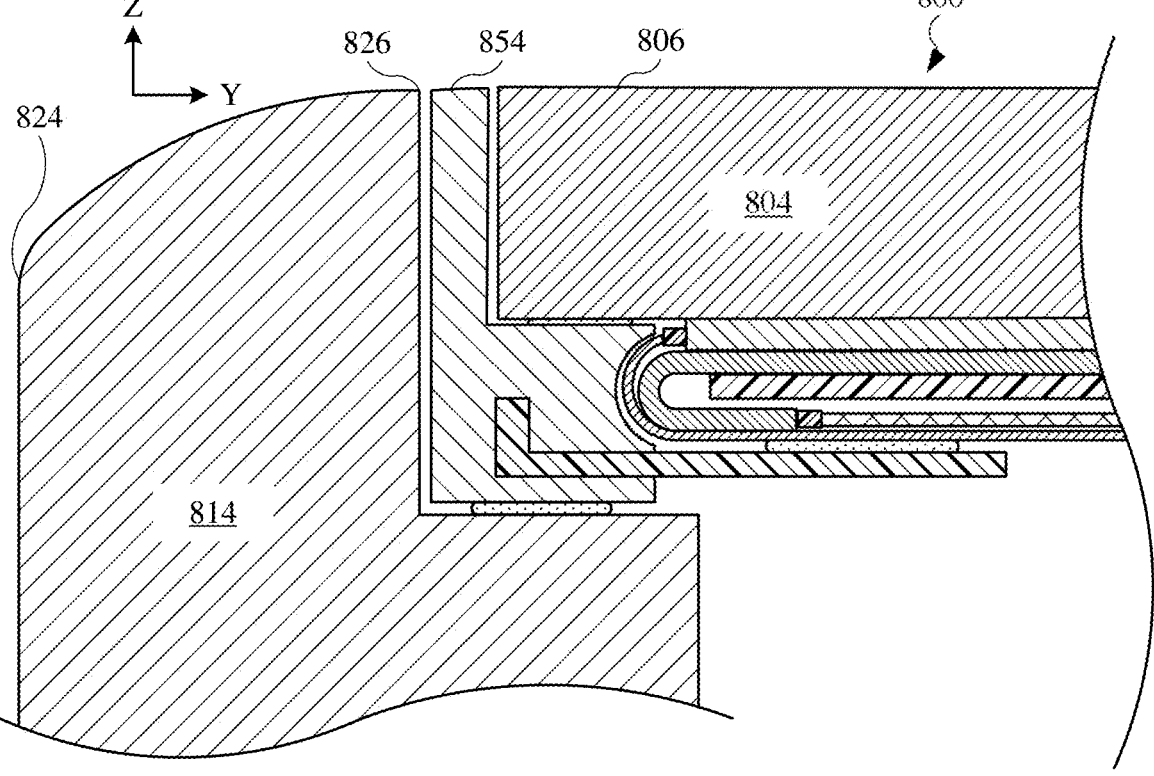
FIG. 13 illustrates a cross sectional view of an embodiment of an electronic device, showing the electronic device having a protective cover and a sidewall component that is extended to provide additional support for the protective cover, in accordance with some described embodiments.

FIG. 13 illustrates a cross sectional view of an embodiment of an electronic device 800, showing the electronic device 800 having a protective cover 804 and a sidewall component 814 that is extended to provide additional support for the protective cover 804, in accordance with some described embodiments. The electronic device 800 may include any features described herein for an electronic device. As compared to prior embodiments, the sidewall component 814 includes an outer perimeter 824 that is raised or elevated in the z-dimension. As a result, the material (in the y-dimension) forming the sidewall component 814 increases and provides additional support for the protective cover 804. Further, the sidewall component 814 may include an edge 826 that is parallel, or at least substantially parallel, with respect to a surface 806 of the protective cover 804. As a result, the sidewall component 814 may further provide additional support to the protective cover 804 and a frame 854 between the protective cover 804 and the sidewall component 814.

Figure 14:
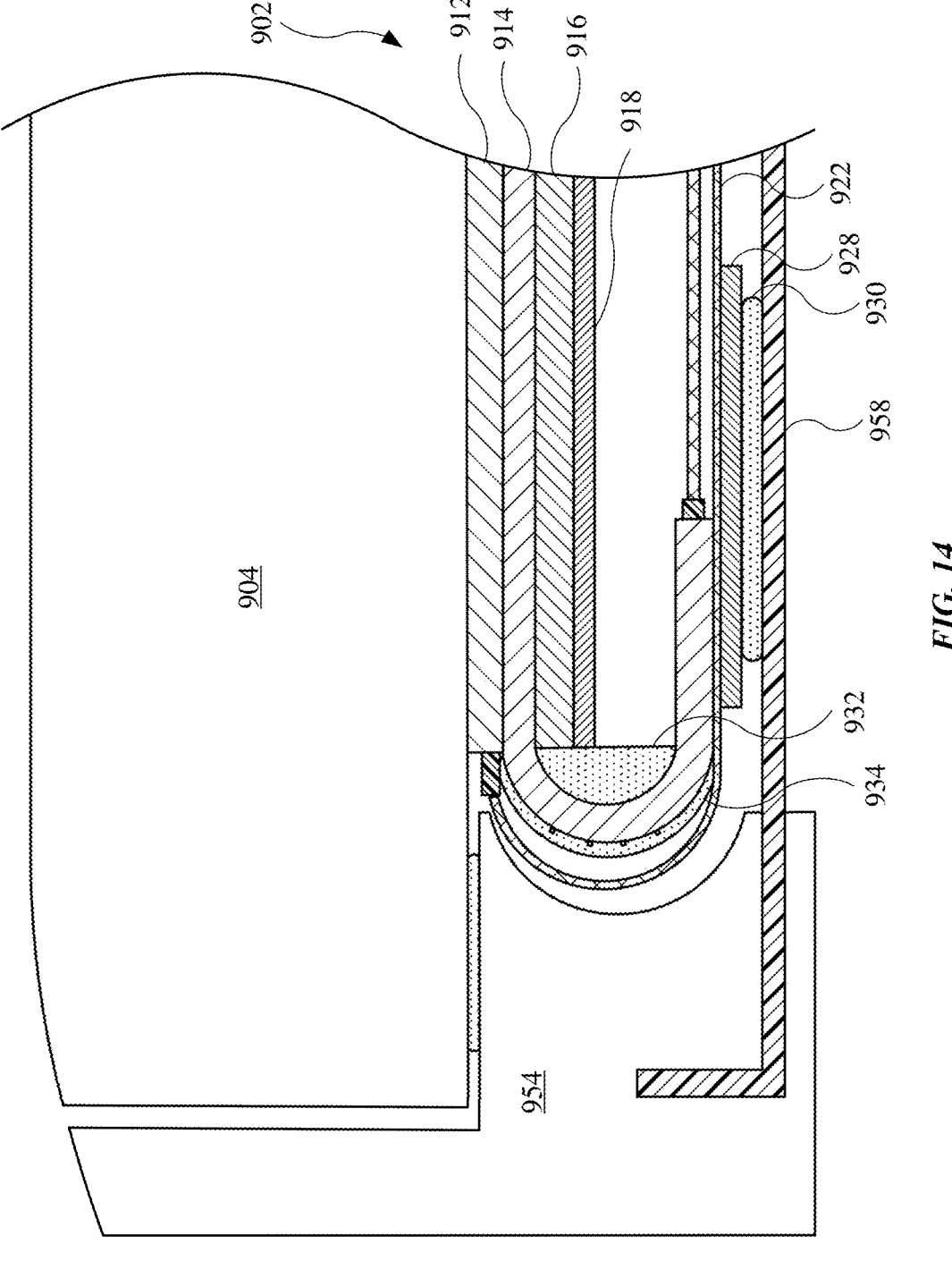
FIG. 14 illustrates a cross sectional view of an embodiment of an electronic device, showing the electronic device having various structural enhancements, in accordance with some described embodiments.

FIG. 14 illustrates a cross sectional view of an embodiment of an electronic device 900, showing the electronic device 900 having various structural enhancements, in accordance with some described embodiments. The electronic device 900 may include any features described herein for an electronic device. Similar to prior embodiments, the electronic device 900 may include a display assembly 902 that includes a touch sensitive layer 912 designed to receive a touch input, a display layer 914 designed to present visual information, and a force sensitive layer 916 designed to detect an amount of force applied to, or exerted on, the display layer 914 by way a force applied to at least one of the touch sensitive layer 912, the display layer 204, and a protective cover 904 that overlays the display assembly 902. The display assembly 902 may further include a plate 918 secured to the force sensitive layer 916. As shown, the plate 918 is below the force sensitive layer 916. However, in some embodiments (not shown), the plate 918 is positioned between the display layer 914 and the force sensitive layer 916.

The plate 918 may include a rigid material, such as metal or plastic. The plate 918 may provide structural support and stiffness to the display assembly 902. As a result, the plate 918 may shield the display assembly 902 from impact due to another component (not shown) in the electronic device 900 when the electronic device 900 is dropped. Also, the plate 918 may prevent bending of the layers of the display assembly 902, which in turn may prevent the layers from overcoming adhesive bonds and peeling away from each other.

In some embodiments, an electronic device includes a flexible circuit coupled to a touch input layer. In order to limit movement of the flexible circuit, an adhesive is applied to a supporting element (embedded in a frame) to adhere the flexible circuit with the supporting element. However, the adhesive is known to shrink upon curing. The shrinking effect of the adhesive may provide a pulling force to the flexible circuit, which in turn causes an unwanted pulling force to other components, which may alter the position of some components or even damage some components.

Generally, the amount of shrinking of the adhesive (from an uncured state to a cured state) depends on the amount of adhesive used. In order to reduce the pulling force caused by shrinking, electronic devices may be modified to limit the amount of adhesive required. For example, FIG. 14 shows the electronic device 900 having a plate 928 positioned between a flexible circuit 922 (similar to the first flexible circuit 212 shown in FIG. 5) and a supporting element 958 embedded in a frame 954. The plate 928 can be positioned between the supporting element 958 and an adhesive 930 disposed on the supporting element 958. The plate 928 may include a metal plate used as a shim that can be secured to the flexible circuit 922. The plate 928 may occupy space between the flexible circuit 922 and the supporting element 958 that would otherwise be occupied by the adhesive 930. In this manner, an amount of adhesive 930 used can be reduced, and accordingly, the shrinking effect caused by the adhesive 930 is also reduced. Also, the plate 928 is designed and positioned to absorb some forces that would otherwise impact the display assembly 902. As a result, the plate 928 may limit or prevent visual issues, such as display artifacts, when the display assembly 902 is on and is presenting visual information.

Similar to prior embodiments, the display layer 914 extends beyond the force sensitive layer 916 and includes a bend. However, as shown in FIG. 14, the display layer 914 may include a first material 932 covering a surface of the display layer 914. The first material 932 may include a potting material that protects the display layer 914, and in particular the bent region of the display layer 914, from external forces. In order to supply the first material, a needle (not shown) can be inserted into a location within the bend region of the display layer 914. The needle can disperse the material while being pulled out of the electronic device 900.

The display layer 914 may further include a second material 934 covering a surface of the display layer 914 include several metal traces (not labeled). The second material 934 is designed to provide a compression force to the metal traces, and prevent tension forces from acting on the metal traces, thereby preventing damage to the metal traces. Also, the second material 934 may provide stiffness and structural support to the display layer 914.

Figure 15:
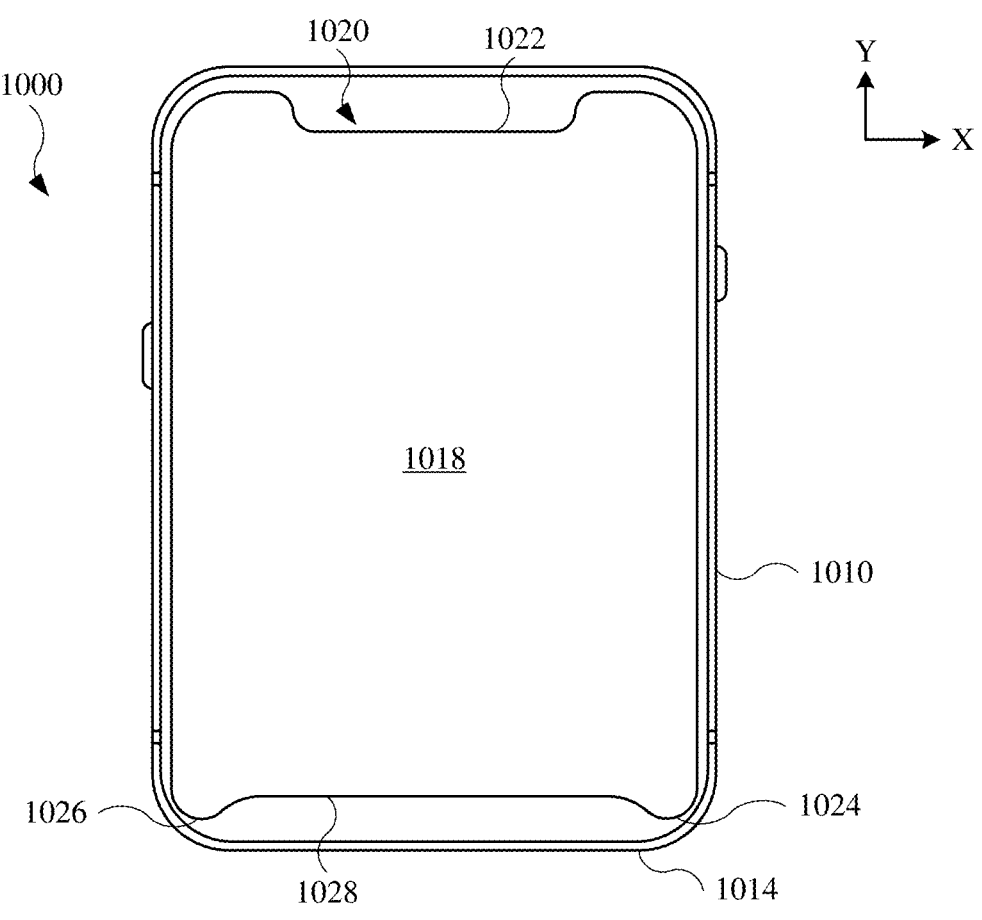
FIG. 15 illustrates a plan view of an embodiment of an electronic device, showing a plate positioned in an enclosure of the electronic device, in accordance with some described embodiments.

FIG. 15 illustrates a plan view of an embodiment of an electronic device 1000, showing a plate 1018 positioned in an enclosure 1010 of the electronic device 1000, in accordance with some described embodiments. For purposes of illustration, several features-including a transparent cover and a display assembly—are removed. The electronic device 1000, the enclosure 1010, and the plate 1018 may include any features described herein for an electronic device, an enclosure, and a plate, respectively. The plate 1018 is designed for use with a display assembly (now shown). In this regard, the plate 1018 may include any features previously described for the plate 918 (shown in FIG. 14).

The plate 1018 may include a notch 1020 designed to receive part of a display assembly. As an example, the notch 1020 may receive the bending regions of a display assembly (similar to the display assembly 102, shown in FIG. 5) and/or flexible circuits (such as the first flexible circuit 212, shown in FIG. 5) associated with the display assembly. In other words, the bending regions associated with the display assembly may bend around the plate 1018 along a planar edge 1022 of the plate 1018 and avoid contacting the enclosure 1010. Accordingly, the notch 1020 may be referred to as a cut out region of the plate 1018.

Additionally, the plate 1018 may include extensions, such as a first extension 1024 and a second extension 1026. As shown, the first extension 1024 and the second extension 1026 extend beyond a planar edge 1028 of the plate 1018. A display assembly (not shown) may include bending regions and flexible circuits that bend around the planar edge 1028 in a manner previously described, and can be positioned between the first extension 1024 and the second extension 1026. The first extension 1024 and the second extension 1026 expand the plate 1018 in the y-dimension. In this manner, an external force applied to the electronic device 1000 with a force component in the y-dimension may cause the plate 1018 (and a display assembly carried by the plate 1018) to shift relative to the enclosure 1010 in the y-dimension. However, the first extension 1024 and the second extension 1026 are designed to engage a sidewall component 1014 (similar to the second sidewall component 114 shown in FIG. 1) of the enclosure 1010 prior to the bending regions of the display assembly and/or flexible circuits engaging the enclosure 1010. As a result, damage and/or electrical disconnections of the display assembly may be prevented.

Figure 16:
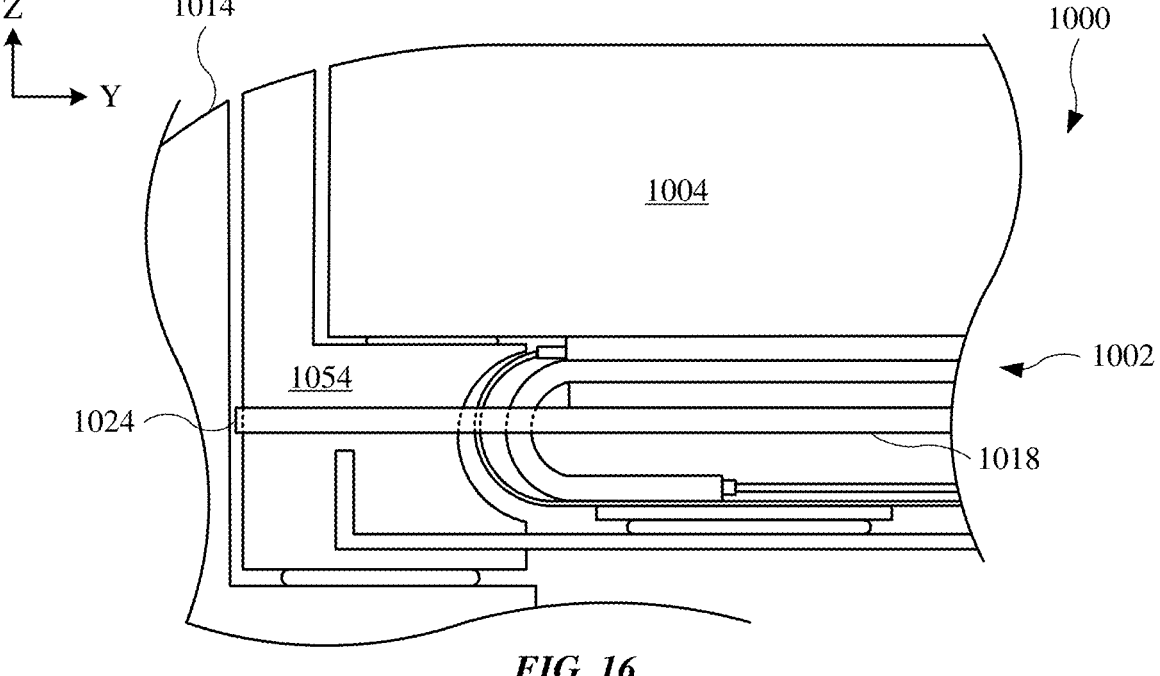
FIG. 16 illustrates a partial side view of the electronic device shown in FIG. 15, further showing the first extension of the plate secured with a display assembly.

FIG. 16 illustrates a partial side view of the electronic device 1000 shown in FIG. 15, further showing the first extension 1024 of the plate 1018 secured with a display assembly 1002. As shown, the display assembly 1002 may curve around the plate 1018. Also, the plate 1018 may extend laterally, in the y-dimension, beyond the display assembly 1002 and a frame 1054 that secures a protective cover 1004 over the display assembly 1002. As a result, the first extension 1024 and the second extension 1026 (shown in FIG. 15) may combine to provide a buffer for the display assembly 1002 against a force applied to the display assembly 1002 that causes the display assembly to move toward the sidewall component 1014 of the enclosure 1010 (labeled in FIG. 15). The frame 1054, the protective cover 1004, and the display assembly 1002 may include any features previously described for a frame, a protective cover, and a display assembly, respectively.

Figure 17:
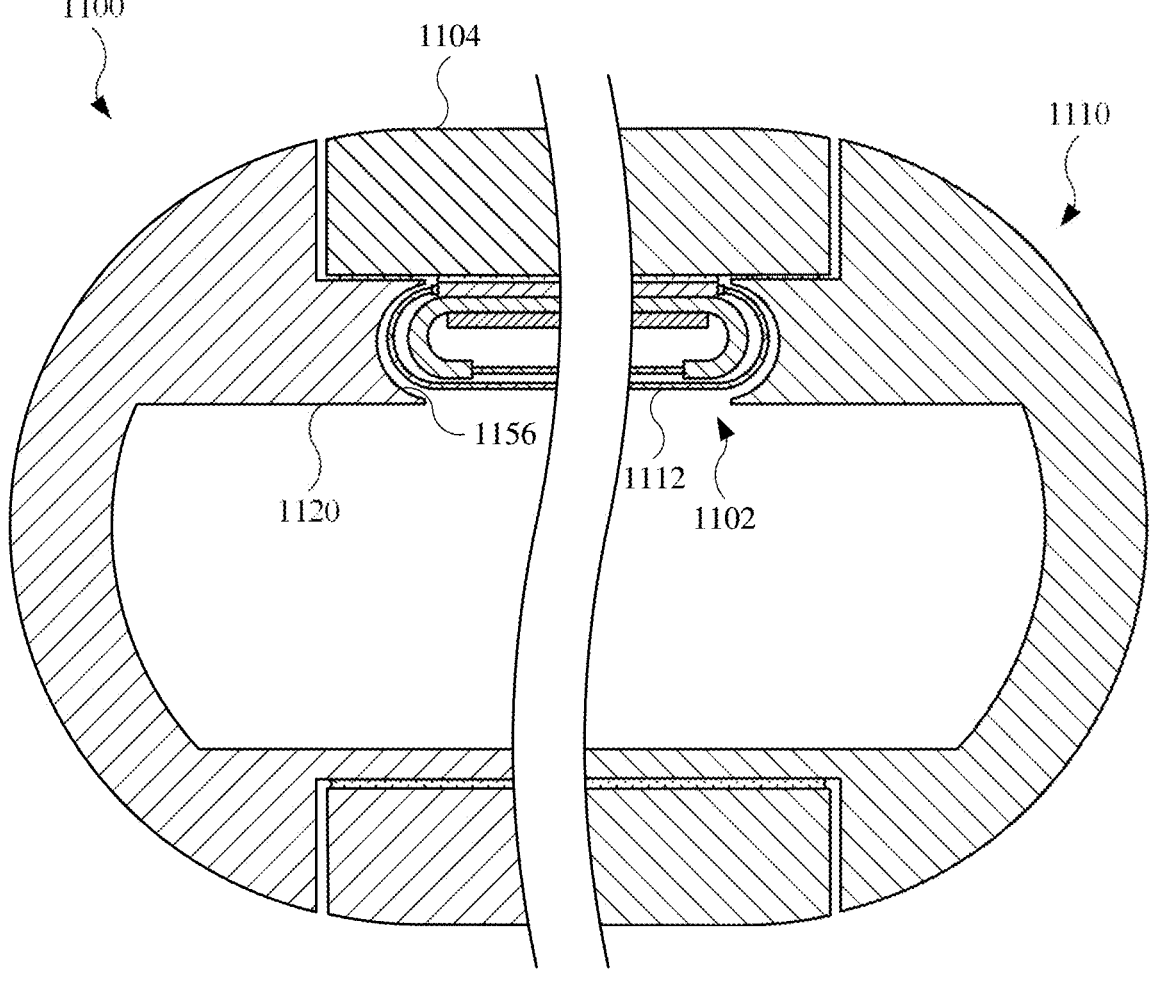
FIG. 17 illustrates a cross sectional view of an embodiment of an electronic device, showing the electronic device with an enclosure and a support structure integrally formed with the enclosure, in accordance with some described embodiments.

FIG. 17 illustrates a cross sectional view of an embodiment of an electronic device 1100, showing the electronic device 1100 with an enclosure 1110 and a support structure 1120 integrally formed with the enclosure 1110, in accordance with some described embodiments. For purposes of simplicity, some features and components of the electronic device 1100 are not shown. However, the electronic device 1100 and the enclosure 1110 may include any features described herein for an electronic device and an enclosure, respectfully. Unlike prior embodiments of an electronic device having a frame that secures to an enclosure, the support structure 1120 can be part of the enclosure 1110. In some embodiments, the enclosure 1110 is formed from a metal, such as aluminum or an alloy that includes aluminum. In the embodiment shown in FIG. 17, the enclosure 1110 is formed from ceramic. A ceramic material may provide a robust housing while also minimizing the effects of RF interference with an antenna assembly (not shown) of the electronic device 1100.

The support structure 1120 can receive and support a protective cover 1104 (similar to the first protective layer 104 shown in FIG. 1). Also, the support structure 1120 may include a notch 1156 designed to receive bending regions of a display assembly 1102 and/or bending regions of a flexible circuit 1112 used with the display assembly 1102. The notch 1156 may extend circumferentially around the display assembly 1102. Accordingly, the notch 1156 may be integrated into the enclosure 1110. This may reduce the associated costs and manufacturing times associated with the use of a frame.

Figure 18:
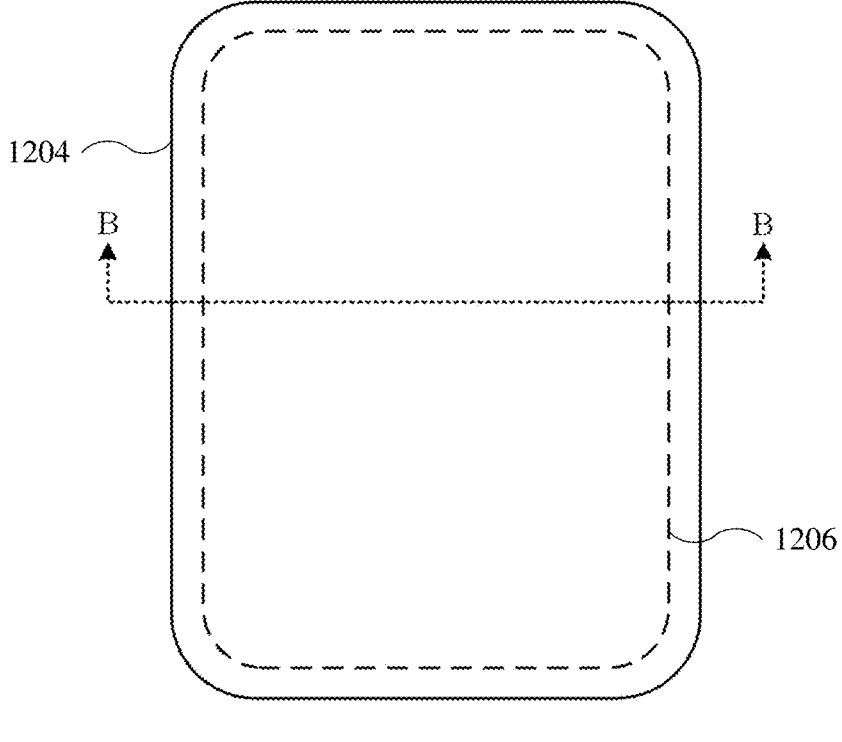
FIG. 18 illustrates a plan view of an embodiment of a protective cover, in accordance with some described embodiments.

FIG. 18 illustrates a plan view of an embodiment of a protective cover 1204, in accordance with some described embodiments. The protective cover 1204 may include any features described herein for a protective cover and/or a protective layer. Accordingly, the protective cover 1204 may include a transparent material, such as glass, sapphire, plastic, or the like. In this regard, the protective cover 1204 is designed to overlay a display assembly (not shown). The protective cover 1204 may include a base portion and a notch (shown below) defined in part by a dotted line 1206.

Figure 19:
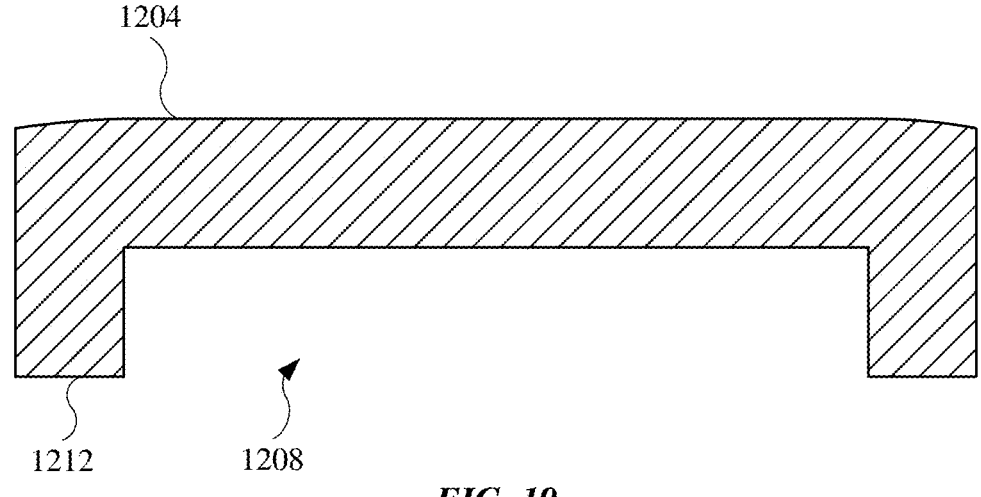
FIG. 19 illustrates a cross sectional view of the protective cover shown in FIG. 18 taken along line B-B, further showing the a notch formed in the protective cover.

FIG. 19 illustrates a cross sectional view of the protective cover 1204 shown in FIG. 18 taken along line B-B, further showing a notch 1208 formed in the protective cover 1204. The notch 1208 may define a cavity that extends partially into the material that forms the protective cover 1204. In this manner, the notch may receive, or at least partially receive, a display assembly. This will be further shown below. Also, the protective cover 1204 may include a base portion 1212 that extends around the notch 1208.

Figure 20:
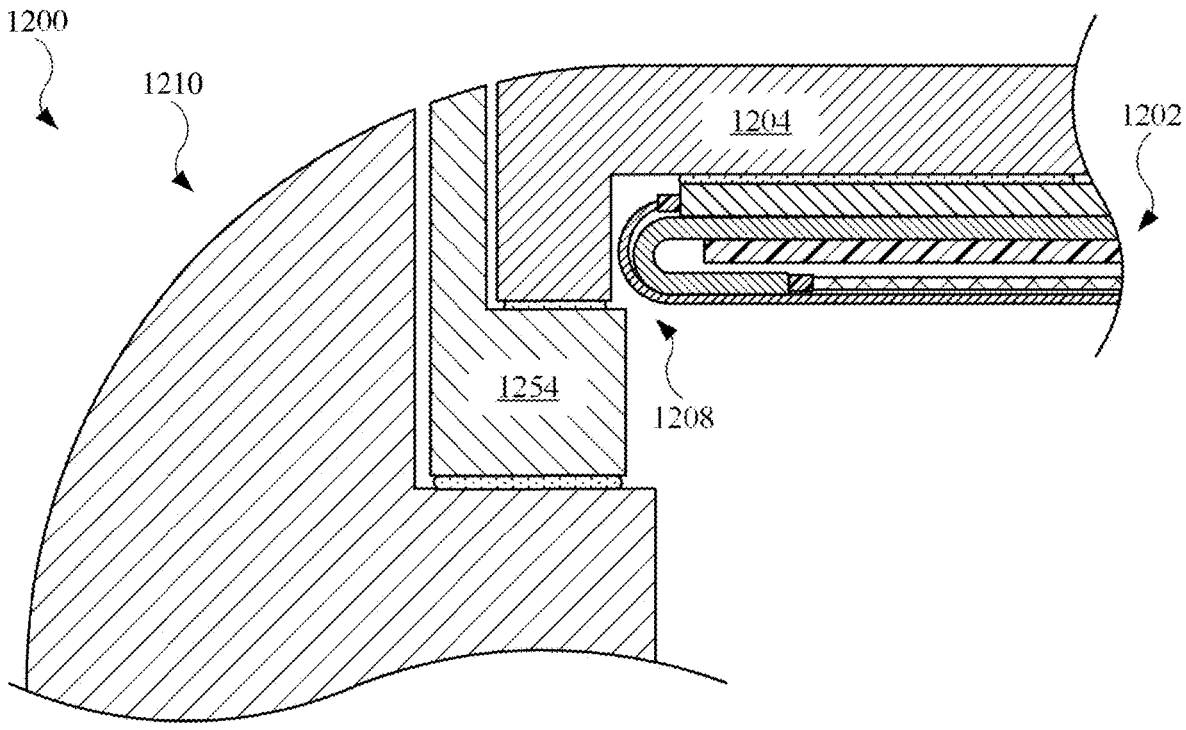
FIG. 20 illustrates a cross sectional view of an embodiment of an electronic device, showing the protective cover (shown in FIGS. 18 and 19) secured with an enclosure, in accordance with some described embodiments.

FIG. 20 illustrates a cross sectional view of an embodiment of an electronic device 1200, showing the protective cover 1204 (shown in FIGS. 18 and 19) secured with an enclosure 1210, in accordance with some described embodiments. For purposes of simplicity, some features and components of the electronic device 1200 are not shown. However, the electronic device 1200 may include any features described herein for an electronic device. As shown, the electronic device 1200 may include a display assembly 1202 secured to the protective cover 1204, and positioned in the notch 1208. The display assembly 1202 may partially fit into the notch 1208, or may fully fit into the notch 1208, depending upon the desired configuration. By fitting the display assembly 1202 into the notch 1208 of the protective cover 1204, the protective cover 1204 may increase the protection provided to the display assembly 1202 by covering multiple dimensions of the display assembly 1202. As a result, impact forces to the electronic device 1200 may be absorbed, or at least partially absorbed, by the protective cover 1204 prior to any impact to the display assembly 1202. Also, by modifying the protective cover 1204, the design modifications to other components may be limited, which reduces manufacturing and engineering costs. Also, the frame 1254 may not require a notch (such as the notch 156, shown in FIG. 5), and accordingly, may provide additional support to the protective cover 1204.

Figure 21:
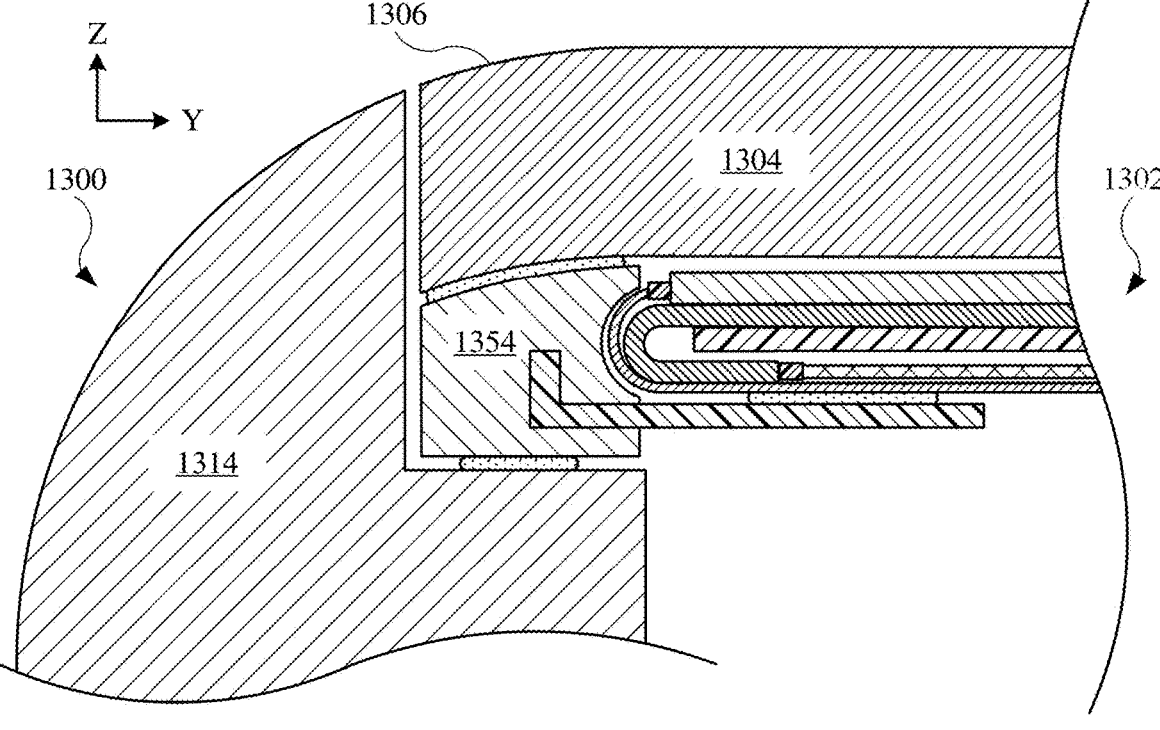
FIG. 21 illustrates a cross sectional view of an embodiment of an electronic device, showing a protective cover extending over a frame and positioned proximate to a sidewall component, in accordance with some described embodiments.

FIG. 21 illustrates a cross sectional view of an embodiment of an electronic device 1300, showing a protective cover 1304 extending over a frame 1354 and positioned proximate to a sidewall component 1314, in accordance with some described embodiments. The electronic device 1300, the sidewall component 1314, and the frame 1354 may include any features described herein for an electronic device, a sidewall component, and a frame, respectively. As shown, the frame 1354 can be modified and reduced in size to allow the protective cover 1304 to extend over the frame 1354 and border the sidewall component 1314. This allows the protective cover 1204, and in particular a curved portion 1306 of the protective cover 1304, to receive direct protection from the sidewall component 1314, as opposed to the frame 1354 extending between the sidewall component 1314 and the protective cover 1304 (as shown in other embodiments). Also, the protective cover 1304 may define an extended protective cover having a relatively greater length in the y-dimension. This may allow for modification to the display assembly 1302 of the electronic device 1300 to also increase in size in the y-dimension. Alternatively, or in combination, the extended length of the protective cover 1304 and the display assembly 1302 may promote a symmetric-appearing display assembly, which may also allow for modification to a display frame (not shown) that partially covers the symmetric-appearing display assembly. By providing a display assembly that is symmetric, the overall appearance of the electronic device 1300 may be enhanced.

Figure 22:
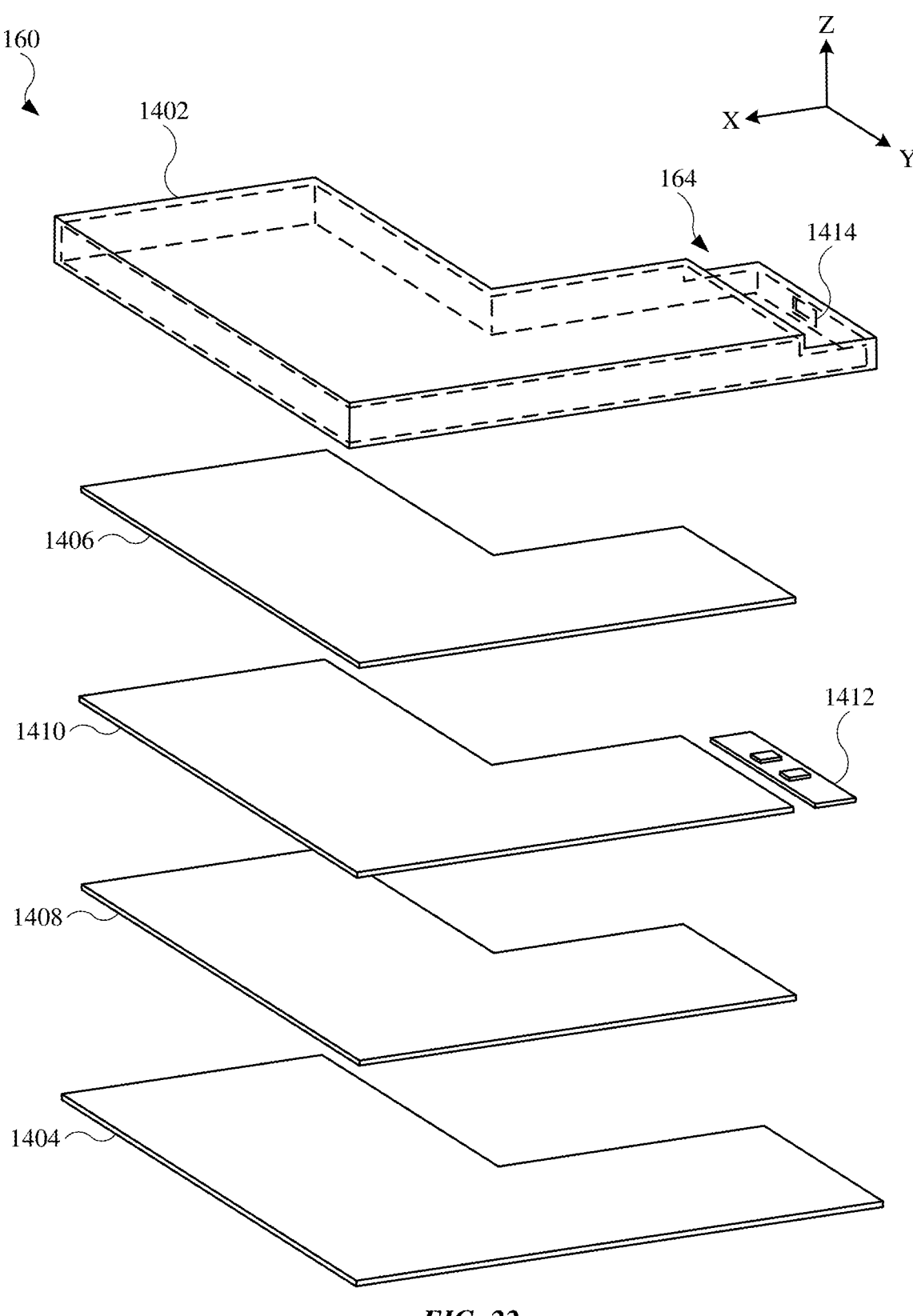
FIG. 22 illustrates an exploded view of the battery, in accordance with some described embodiments.

FIG. 22 illustrates an exploded view of the battery assembly 160, in accordance with some described embodiments. As shown, the battery assembly 160 may include a first cover element 1402 and a second cover element 1404, with the first cover element 1402 sealed with the second cover element 1404 to form a housing that shields the internal components of the battery assembly 160. The housing formed by the first cover element 1402 and the second cover element 1404 may define a cavity to receive and enclose internal components. For example, the battery assembly 160 may further include a first electrode 1406 and a second electrode 1408 separate from the first electrode 1406 (such that each of the first electrode 1406 and the second electrode 1408 include a single piece electrode), with a separator 1410 that provides some physical isolation between the first electrode 1406 and the second electrode 1408, while still allowing the flow of electrical charge between the first electrode 1406 and the second electrode 1408. As commonly known in the art for a battery, one of the first electrode 1406 and the second electrode 1408 includes an anode, while the remaining electrode (of the first electrode 1406 and the second electrode 1408) includes a cathode. Also, as commonly known, electrodes can be used to convert chemical energy into electricity for use by an electronic device (such as the electronic device 100, shown in FIG. 1). Further, the battery assembly 160, and battery assemblies described herein, may include a rechargeable battery assembly designed for reuse subsequent to the battery assembly 160 receiving electrical energy from an external source. The battery assembly 160 may further include a circuit board 1412 that includes one or more circuits designed to monitor electrical current flowing into and out of the battery assembly 160. Also, the circuit board 1412, as well as components of the circuit board 1412, may be in electrical communication with the circuit board assembly 170 (shown in FIG. 4).

Also, the first cover element 1402 may form a channel 164 that provides additional space, in the z-dimension, for a component (not shown), such as a flexible circuit. In other words, a dimension (such as the height) of the battery assembly 160 is reduced in a location corresponding to the channel 164, while still providing ample room for the circuit board 1412 to be positioned below the channel 164. In this manner, the component may be positioned across the channel 164, thereby allowing a rearrangement of other components in the electronic device 100 (shown in FIG. 1) to create additional room for the battery assembly 160. As a result, the battery assembly 160 may include a large size, which corresponds to greater charge capacity. While the first cover element 1402 and the second cover element 1404 may provide a shield, including an electrical shield, the aforementioned cover elements may allow for some electrical connections. For example, the first cover element 1402 may include an opening 1414 proximate to the circuit board 1412. Also, although not shown, the first cover element 1402 and/or the second cover element 1404 may include an additional opening to allow an additional component (or components) to electrically couple with the battery assembly 160. While traditional battery electrodes include a generally rectilinear shape, the electrodes in the battery assembly 160, and battery assemblies described herein, may include different shapes. For example, as shown in FIG. 22, the first electrode 1406 and the second electrode 1408 include an "L-shaped configuration," in which at least one surface include six different sides. This will be further discussed below.

Figure 23:
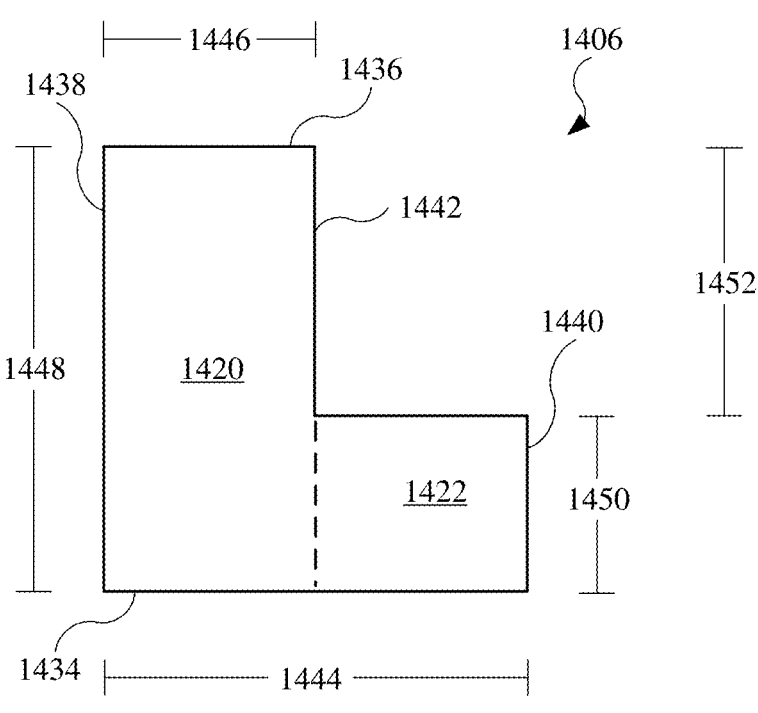
FIG. 23 illustrates a plan view of the first electrode shown in FIG. 22.

FIG. 23 illustrates a plan view of the first electrode 1406 shown in FIG. 22. As shown, the first electrode 1406 includes L-shaped configuration. In this regard, the first electrode 1406 may include a first part 1420, or first rectangular portion, and a second part 1422, or second rectangular portion, extending from the first part 1420. The dotted line denotes an interface region between the first part 1420 and the second part 1422. In some embodiments (not shown), the size of the first part 1420 is the same as, or substantially similar to, the second part 1422. However, in the embodiment shown in FIG. 23, the size of the first part 1420 is greater than that of the second part 1422.

The first electrode 1406 may also be characterized as including a first wall 1434 having a first dimension 1444, and a second wall 1436 having a second dimension 1446. As shown, the first wall 1434 is parallel, or at least substantially parallel, with respect to the second wall 1436, and the second dimension 1446 is less than the first dimension 1444. Also, the first electrode 1406 may include a third wall 1438 (separating the first wall 1434 from the second wall 1436) having a third dimension 1448, and a fourth wall 1440 having a fourth dimension 1450. As shown, the third wall 1438 is parallel, or at least substantially parallel, with respect to the fourth wall 1440, and the fourth dimension 1450 is less than the third dimension 1448. Further, the first electrode 1406 may include a fifth wall 1442 parallel, or at least substantially parallel, with respect to the third wall 1438. The fifth wall 1442 may include a fifth dimension 1452 that is less than the third dimension 1448. As shown in FIG. 23, the fourth dimension 1450 and the fifth dimension 1452 may combine to equal the third dimension 1448. Also, the third wall 1438 is perpendicular, or at least substantially perpendicular, with respect to the first wall 1434 and the second wall 1436. In some embodiments (not shown), the first dimension 1444 is the same as the second dimension 1446. Still, in some embodiments (not shown), the first dimension 1444 is less than the second dimension 1446. Also, it should be noted that the second electrode 1408 (shown in FIG. 22), and any additional electrode(s) and separator(s) included in the battery assembly 160 (shown in FIG. 22), may include the same size and shape as, or a size and shape substantially similar to, that of the first electrode 1406.

Figure 24:
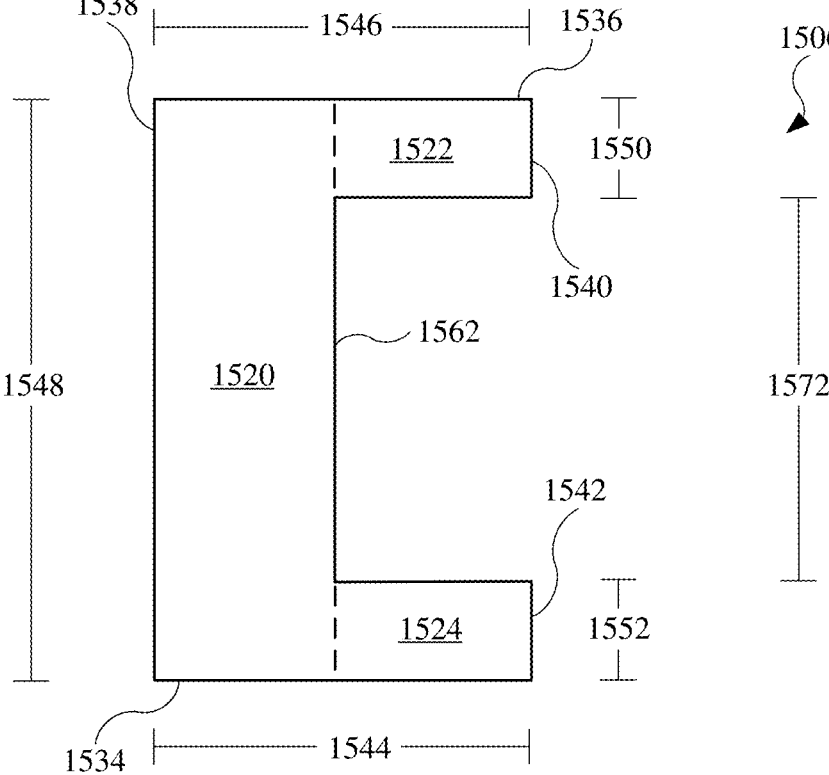
FIG. 24 illustrates a plan view of an alternate embodiment of an electrode suitable for use in a battery assembly, in accordance with some described embodiments.

FIG. 24 illustrates a plan view of an alternate embodiment of an electrode 1506 suitable for use in a battery assembly, in accordance with some described embodiments. As shown, the electrode 1506 may include a "C-shaped configuration." In this regard, the electrode 1506 may include a first part 1520, or first rectangular portion. The electrode 1506 may further include a second part 1522, or second rectangular portion, and a third part 1524, or third rectangular portion, both of which extend perpendicular, or substantially perpendicular, with respect to the first part 1520. The dotted lines denote interface regions between the first part 1520 and the second part 1522, as well as between the first part 1520 and the third part 1524. In some embodiments (not shown), the size of the first part 1520 is the same as, or substantially similar to, the second part 1522 and the third part 1524. However, in the embodiment shown in FIG. 24, the size of the first part 1520 is greater than that of the second part 1522, and also greater than that of the third part 1524. Also, as shown in FIG. 24, the size of the second part 1522 is the same as, or substantially similar to, that of the third part 1524. However, in some embodiments (not shown), the size of the second part 1522 may vary from that of the third part 1524. For example, the size of the second part 1522 may be larger or smaller than the size of the third part 1524.

The electrode 1506 may also be characterized as including a first wall 1534 having a first dimension 1544, and a second wall 1536 having a second dimension 1546. As shown, the first wall 1534 is parallel, or at least substantially parallel, with respect to the second wall 1536, and the second dimension 1546 includes a length that is the same, or at least substantially similar, to that of first dimension 1544. Also, the electrode 1506 may include a third wall 1538 (separating the first wall 1534 from the second wall 1536) having a third dimension 1548, a fourth wall 1540 having a fourth dimension 1550, and a fifth wall 1542 having a fifth dimension 1552. As shown, the third wall 1538 is parallel, or at least substantially parallel, with respect to the fourth wall 1540 and the fifth wall 1542. Also, each of the fourth dimension 1550 and the fifth dimension 1552 is less than the third dimension 1548. Also, the third wall 1538 is perpendicular, or at least substantially perpendicular, with respect to the first wall 1534 and the second wall 1536. As shown in FIG. 24, the first dimension 1544 is the same as the second dimension 1546. However, the first dimension 1544 may differ from the second dimension 1546, such as being less than or greater than. Further, the electrode 1506 may include a sixth wall 1562 parallel, or at least substantially parallel, with respect to the third wall 1538. The sixth wall 1562 may include a sixth dimension 1572 that is less than the third dimension 1548. As shown in FIG. 24, the fourth dimension 1550, the fifth dimension 1552, and the sixth dimension 1572 may combine to equal the third dimension 1548. Also, it should be noted that any additional electrode(s) and separator(s) included in a battery assembly (not shown) may include the same size and shape as, or a size and shape substantially similar to, that of the electrode 1506.

Figures 25, 26:
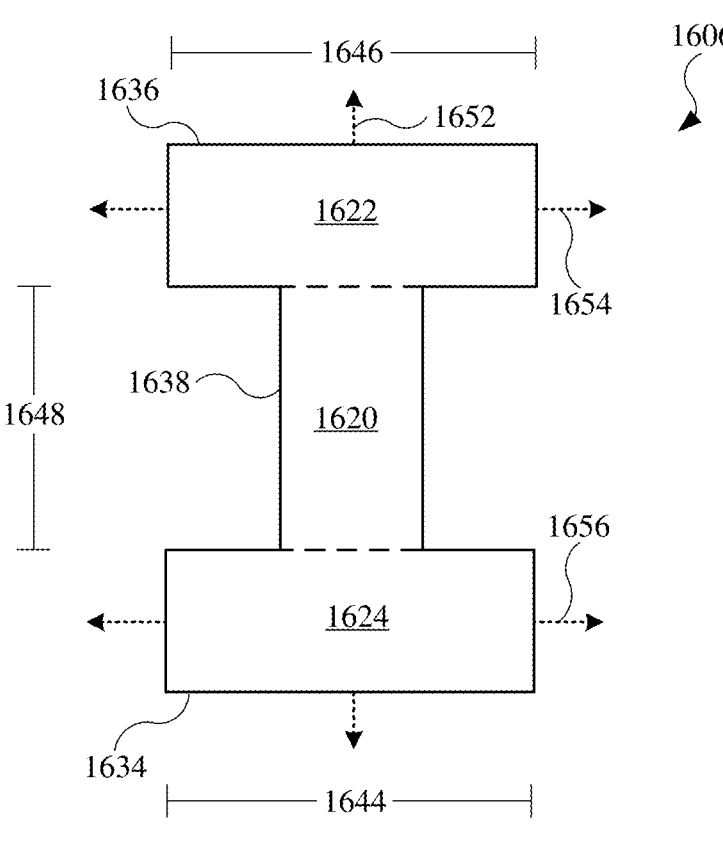
FIG. 25 illustrates a plan view of an alternate embodiment of an electrode suitable for use in a battery assembly, in accordance with some described embodiments.
FIG. 26 illustrates a plan view of an alternate embodiment of an electrode suitable for use in a battery assembly, in accordance with some described embodiments.

FIG. 25 illustrates a plan view of an alternate embodiment of an electrode 1606 suitable for use in a battery assembly, in accordance with some described embodiments. As shown, the electrode 1606 may include an "I-shaped configuration." In this regard, the electrode 1606 may include a first part 1620, or first rectangular portion, a second part 1622, or second rectangular portion, and a third part 1624, or third rectangular portion. The dotted lines denote interface regions between the first part 1620 and the second part 1622, as well as between the first part 1620 and the third part 1624. As shown, both the second part 1622 and the third part 1624 extend perpendicular, or substantially perpendicular to, the first part 1620. Similar to a shape resembling a letter "I", the first part 1620 may be centered, or substantially centered, with respect to the second part 1622 and the third part 1624. As shown, the size of the first part 1620 is the same as, or substantially similar to, the second part 1622 and the third part 1624. However, in some embodiments (not shown), the size of the first part 1620 is different than that of the second part 1622, and also different than that of the third part 1624. Also, as shown in FIG. 25, the size of the second part 1622 is the same as, or substantially similar to, that of the third part 1624. However, in some embodiments (not shown), the size of the second part 1622 may vary from that of the third part 1624. For example, the size of the second part 1622 may be larger or smaller than the size of the third part 1624. Also, in some embodiments, the third part 1624 is removed from the electrode 1606 such that the electrode 1606 includes a "T-shaped configuration."

The electrode 1606 may also be characterized as including a first wall 1634 having a first dimension 1644, and a second wall 1636 having a second dimension 1646. As shown, the first wall 1634 is parallel, or at least substantially parallel, with respect to the second wall 1636, and the second dimension 1646 includes a length that is the same as, or at least substantially similar to, that of first dimension 1644. Also, the electrode 1606 may include a third wall 1638 that includes a third dimension 1648. The third wall 1638 may be perpendicular, or at least substantially perpendicular, with respect to the first wall 1634 and the second wall 1636, and the third dimension 1648 includes a length that is the same as, or at least substantially similar to, that of first dimension 1644 and the second dimension 1646.

The electrode 1606 may be further characterized as having a first part 1620 aligned with, and symmetrically disposed about, a first longitudinal axis 1652 that extend through the first part 1620. The term "longitudinal" as used throughout this detailed description and in the claims refers to a direction extending along a major axis of a component, with a "major" dimension corresponding to the greatest (longest) dimension of a part or portion of an electrode. The electrode 1606 may also include a second part 1622 and a third part 1624 aligned with, and symmetrically disposed about, a second longitudinal axis 1654 and a third longitudinal axis 1656, respectively. The second longitudinal axis 1654 may be aligned parallel with respect to the third longitudinal axis 1656. Also, the first longitudinal axis 1652 may be perpendicular with respect to the second longitudinal axis 1654 and the third longitudinal axis 1656. Also, it should be noted that any additional electrode(s) and separator(s) included in a battery assembly (not shown) may include the same size and shape as, or a size and shape substantially similar to, that of the electrode 1606.

FIG. 26 illustrates a plan view of an alternate embodiment of an electrode 1706 suitable for use in a battery assembly, in accordance with some described embodiments. As shown, the electrode 1706 may include an "L-shaped configuration," similar to that of the first electrode 1406 (shown in FIG. 23). In this regard, the electrode 1706 may a first part 1720, or first rectangular portion, and a second part 1722, or second rectangular portion, that extends from the first part 1720 in a perpendicular manner. The dotted line denotes an interface region between the first part 1720 and the second part 1722. In some embodiments (not shown), the size of the first part 1720 is the same as, or substantially similar to, the second part 1722. However, in the embodiment shown in FIG. 26, the size of the first part 1720 is greater than that of the second part 1722. Also, the electrode 1706 may further include an opening 1730 defining a void or space in the electrode 1706. The opening 1730 may allow for a battery assembly (not shown) that includes the electrode 1706, as well as other electrodes having a similar size and shape as that of the electrode 1706, to position a component (not shown) at a location corresponding to the opening 1730. In this manner, the battery assembly may accommodate the component by way of the opening 1730, when the openings of the electrodes and separators are aligned with one another to form a continuous through hole through the layers of electrodes and separators of the battery assembly. This will be further discussed below. Also, while the opening 1730 is shown in the electrode 1706, other embodiments, such as the embodiments of an electrode shown in FIGS. 23-25, may include an opening.

The various embodiments of the electrodes shown and described in FIGS. 23-26 can be formed by a cutting operation, including die cutting. A die cutting operation may include an electrode sheet undergoing a cutting operation using a die of a predetermined size and shape. The die may include a size and shape corresponding to the size and shape of the electrodes shown in FIGS. 23-26. It should be noted that the separators can be die cut in a similar manner. Accordingly, the shape of electrodes described herein may include shapes other a rectilinear shape. In this regard, a battery assembly may include a size and shape in accordance with the electrodes and separators so that the battery assembly can take on various sizes and shape in order to increase the battery assembly size and or/to accommodate other internal components in an electronic device.

Figures 27, 28:
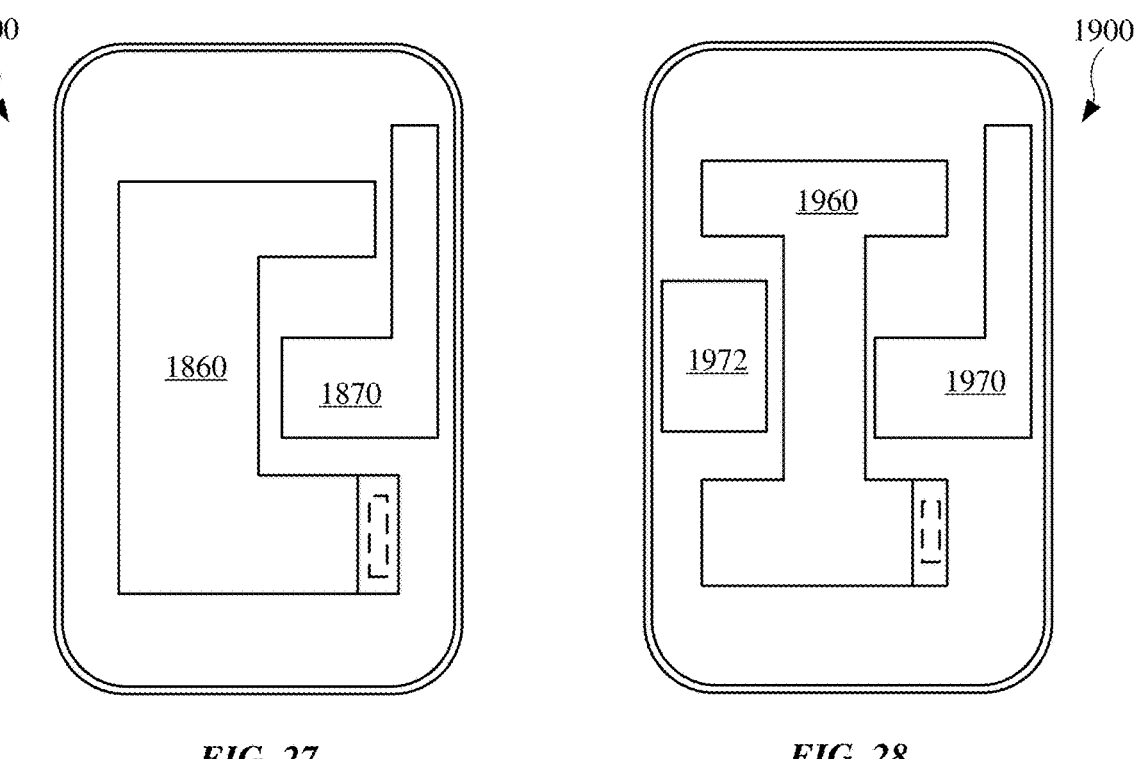
FIG. 27 illustrates an embodiment of a battery in an electronic device, with the battery having a shape that accommodates an internal component of the electronic device, in accordance with some described embodiments.
FIG. 28 illustrates an alternate embodiment of a battery assembly in an electronic device, with the battery assembly having a shape that accommodates multiple internal components of the electronic device, in accordance with some described embodiments.
Figure 29:
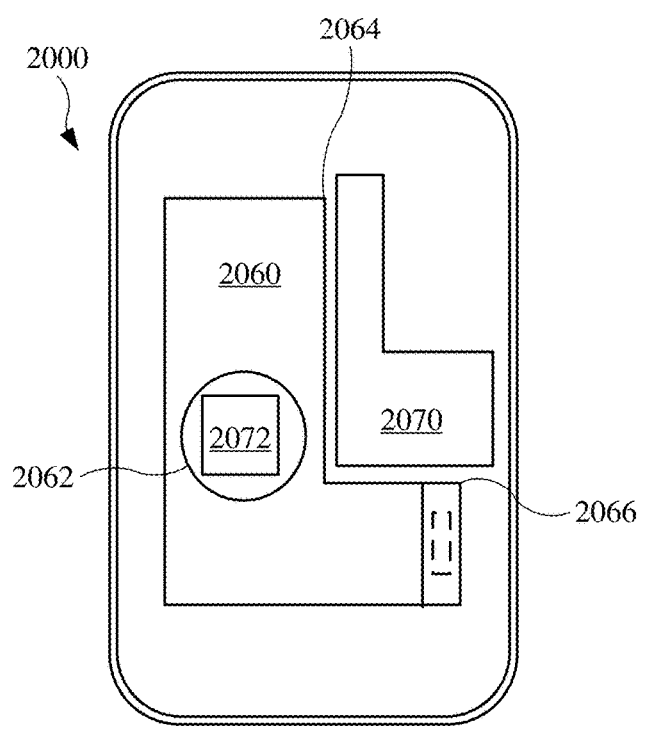
FIG. 29 illustrates an alternate embodiment of a battery assembly in an electronic device, with the battery assembly having an opening that accommodates an internal component of the electronic device, in accordance with some described embodiments.

FIGS. 27-29 illustrate various embodiments of a battery assembly suitable for use with electronic devices described herein. Some components of the electronic devices shown in FIGS. 27-29 are removed for purposes of illustration. The die cutting operation (described above) used to form the electrodes for the battery assemblies described herein may be cut into various sizes and shapes. In this regard, the battery assemblies may take on different sizes and shapes. Also, the electronic devices and battery assemblies shown in FIGS. 27-29 may include any component(s) and feature(s) previously described for an electronic device. Also, while a discrete number of embodiments for a battery assembly are shown, several other configurations are possible.

FIG. 27 illustrates an embodiment of a battery assembly 1860 in an electronic device 1800, with the battery assembly 1860 having a shape that accommodates an internal component 1870 of the electronic device 1800, in accordance with some described embodiments. As shown, the battery assembly 1860 may include a C-shape configuration to accommodate the internal component 1870, which may include a circuit board assembly (previously described). The term "accommodate" may refer to modifying the size and shape of a component (such as the battery assembly 1860) in order to avoid or mitigate modifying the size, shape, and/or position of another component (such as the internal component 1870) in the electronic device 1800. As an example, battery assemblies shown and described herein may accommodate another component(s) by providing space that would otherwise be occupied by a traditional, rectilinear battery. Also, any electrode(s) and separator(s) of the battery assembly 1860 also include a C-shape configuration having a shape similar to that of the electrode 1506 (shown in FIG. 24). Accordingly, the battery assembly 1860 may include a housing defined by one or more cover elements that includes a C-shaped configuration.

FIG. 28 illustrates an alternate embodiment of a battery assembly 1960 in an electronic device 1900, with the battery assembly 1960 having a shape that accommodates multiple internal components of the electronic device 1900, in accordance with some described embodiments. As shown, the battery assembly 1960 may include an "I-shape" configuration in order to accommodate both a first internal component 1970 and a second internal component 1972. Each of the first internal component 1970 and the second internal component 1972 may represent a component such as a circuit board, an audio module, a flexible circuit, or a similar component. FIG. 28 further shows the first internal component 1970 and the second internal component 1972 positioned in different spaces between extensions of the battery assembly 1960. Also, any electrode(s) and separator(s) of the battery assembly 1960 also include an I-shape configuration having a shape similar to that of the electrode 1606 (shown in FIG. 25). Accordingly, the battery assembly 1960 may include a housing defined by one or more cover elements that includes an I-shaped configuration.

FIG. 29 illustrates an alternate embodiment of a battery assembly 2060 in an electronic device 2000, with the battery assembly 2060 having an opening 2062 that accommodates an internal component 2072 of the electronic device 2000, in accordance with some described embodiments. As shown, the opening 2062 may include a size and shape such that internal component 2072 can be positioned with a perimeter of the opening 2062. While the opening 2062 includes a generally circular opening, the opening 2062 may take the form of other shapes, including three- and four-side shapes, as non-limiting examples. Also, as shown in FIG. 29, the battery assembly 2060 may include an L-shaped configuration (although other aforementioned shapes are possible) to accommodate an internal component 2070 (which may include a circuit board assembly), and may also include the opening 2062. The L-shaped configuration of the battery assembly 2060 allows for the internal component 2070 to be positioned at least partially between edges of the battery assembly 2060, such as a first edge 2064 and a second edge 2066. Also, a battery assembly that includes an L-shape configuration as well as an opening (similar to the opening 2062) may include electrodes and separators aligned with one another and having a shape similar to that of the electrode 1706 (shown in FIG. 26). In other words, any electrode(s) and separator(s) of the battery assembly 2060 also include an L-shape configuration with an opening, similar to that of the electrode 1706 (shown in FIG. 26). Accordingly, the battery assembly 2060 may include a housing defined by one or more cover elements that includes an L-shaped configuration as well as an opening.

Figure 30:
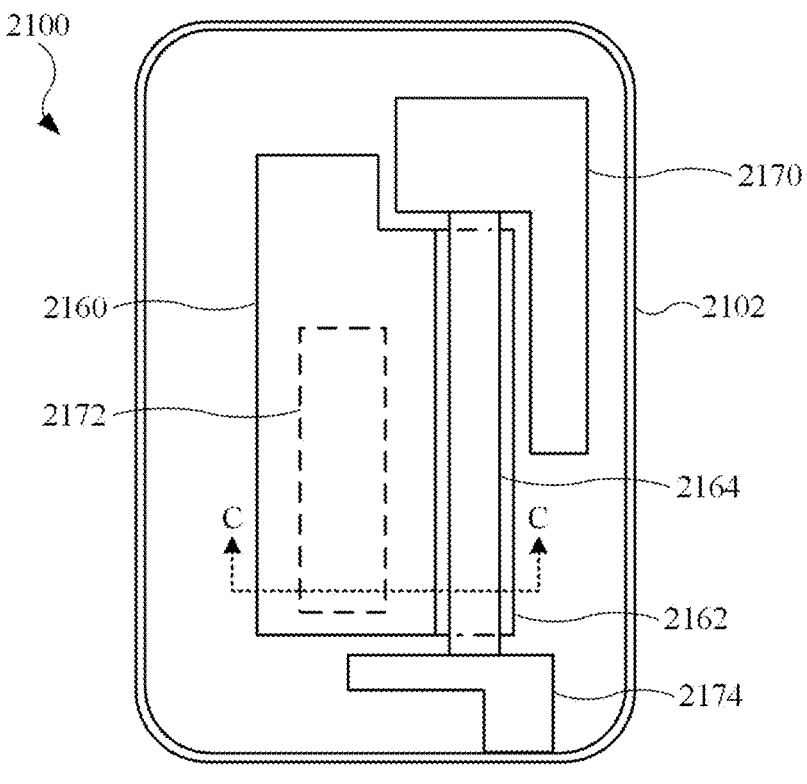
FIG. 30 illustrates an alternate embodiment a battery assembly in an electronic device, with the battery assembly positioned in an enclosure (of the electronic device) over a first internal component of the electronic device, in accordance with some described embodiments.

In addition to having various sizes and shapes (other than a traditional rectilinear shape), the battery assemblies described herein may include additional features. For example, FIG. 30 illustrates an alternate embodiment a battery assembly 2160 in an electronic device 2100, with the battery assembly 2160 positioned in an enclosure 2102 (of the electronic device 2100) over a first internal component 2172 (shown as a dotted line) of the electronic device 2100, in accordance with some described embodiments. Due in part to additional room provided by the display layer 204 (shown in FIG. 5), the battery assembly 2160 may cover or overlay some components, such as the first internal component 2172. Also, in order to accommodate the circuit board assembly 2170 within the enclosure 2102, the battery assembly 2160 may include an L-shaped configuration. In this manner, the battery assembly 2160 provides a location that accommodates a portion of the circuit board assembly 2170 (also including an L-shaped configuration, as shown herein), whereas an otherwise rectilinear battery may not accommodate the circuit board assembly 2170. As shown in FIG. 30, the circuit board assembly 2170 can "mate" with the battery assembly 2160 similar to puzzle pieces. Also, the battery assembly 2160 may further include a channel 2162 that defines a reduced dimension of the battery assembly 2160. In this manner, the electronic device 2100 may include a flexible circuit 2164 that passes over the battery assembly 2160, along the channel 2162, and electrically couples with the circuit board assembly 2170 as well as a second internal component 2174, which may include an operational component (such as an audio module, as a non-limiting example), in order to place the second internal component 2174 in electrical communication with the circuit board assembly 2170. While the flexible circuit 2164 is described as being electrically coupled to the second internal component 2174, the flexible circuit 2164 may also electrically couple with a third internal component (not shown), such as an antenna. In either event, the channel 2162 formed in the battery assembly 2160 allows for the rearrangement of various internal components. Also, the battery assembly 2160 may include an increased size, corresponding to an increased electrical storage capacity, as the battery assembly 2160 can be positioned over the first internal component 2172.

Figure 31:
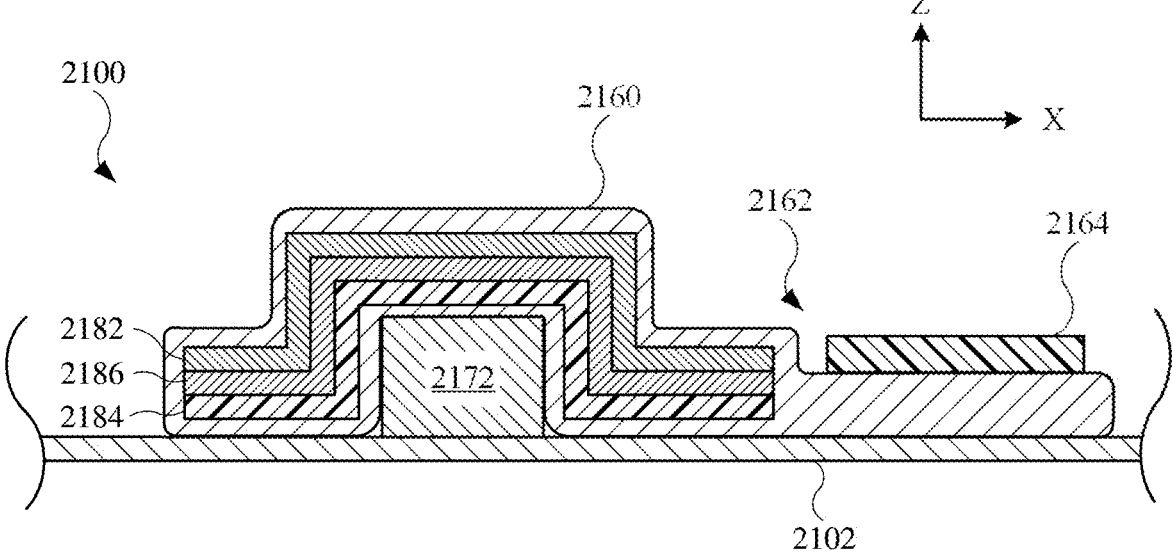
FIG. 31 illustrates a cross sectional view of the electronic device shown in FIG. 30, taken along line C-C in FIG. 30.

FIG. 31 illustrates a cross sectional view of the electronic device 2100 shown in FIG. 30, taken along line C-C in FIG. 30. Due in part to the die cutting operation (described above) for electrodes and separators, the battery assembly 2160 may pass over the first internal component 2172. Moreover, as shown in FIG. 31, a portion of the battery assembly 2160 may lie flat on the enclosure 2102, while another portion of the battery assembly 2160 covers the first internal component 2172. In other words, the battery assembly 2160 can elevate over the first internal component 2172, and also at least partially conform to the size and shape of the first internal component 2172. Further, the electrodes may also pass over the first internal component 2172. For example, the battery assembly 2160 includes a first electrode 2182 and a second electrode 2184, with a separator 2186 positioned between the first electrode 2182 and the second electrode 2184. As shown in FIG. 31, the first electrode 2182, the second electrode 2184, and the separator 2186 may pass over the first internal component 2172. Further, the die cutting operation can form the first electrode 2182 and the second electrode 2184 such that the electrodes terminate prior to entering a location in the battery assembly 2160 corresponding to the channel 2162, thereby allowing the channel 2162 to reduce the dimensions of the battery assembly 2160 to receive the flexible circuit 2164. Although not shown, the channel 2162 may include a size and shape to receive two or more flexible circuits in order to electrically couple additional internal components (not shown) with the circuit board assembly 2170 (shown in FIG. 30). Accordingly, the flexible circuit 2164 (or additional flexible circuits) need not be positioned around a perimeter of the battery assembly 2160.

Figure 32:
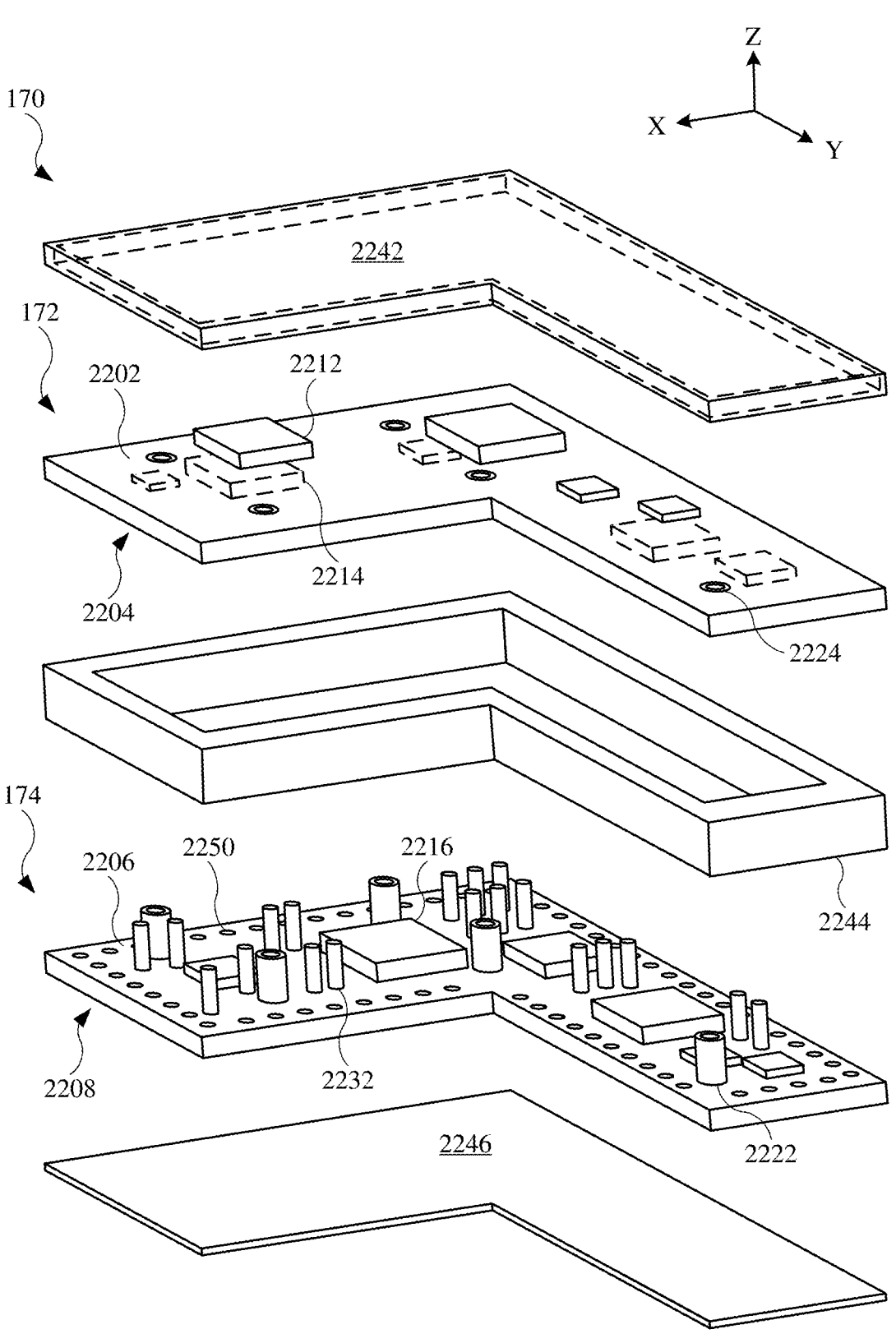
FIG. 32 illustrates an exploded view of the circuit board assembly shown in FIG. 4, in accordance with some described embodiments.

FIG. 32 illustrates an exploded view of the circuit board assembly 170 shown in FIG. 4, in accordance with some described embodiments. As shown, the circuit board assembly 170 may include a first circuit board 172 and a second circuit board 174. In some embodiments, each of the first circuit board 172 and the second circuit board 174 includes a printed circuit board. Also, the first circuit board 172 may be secured with, and positioned over, the second circuit board 174 in a stacked configuration. As shown in FIG. 32, the first circuit board 172 includes a size and shape that is the same as, or at least substantially similar to, the size and shape of the second circuit board 174. However, in some embodiments (not shown), the first circuit board 172 includes at least some differences, as compared to the second circuit board 174, with regard to size and/or shape. While the stacked configuration of the circuit board assembly 170 increases the footprint of the circuit board assembly 170 in the electronic device 100 (shown in FIG. 1) in the z-dimension, the stacked configuration decreases the footprint of the circuit board assembly 170 in both the x- and y-dimensions. The additional space provided by stacking the aforementioned circuit boards may provide additional space in the electronic device 100 for other components, such as the battery assembly 160 (shown in FIG. 4). Also, the additional space provided by reduced dimensions of the display assembly 102 (shown in FIG. 5) provides room for the circuit board assembly 170. In other words, additional space in the z-dimension, due in part to the reduced dimensions of the display assembly 102, allow for the stacked configuration of the circuit board assembly 170. Although not shown, the circuit board assembly 170 may include three or more circuit boards in a stacked configuration and in electrical communication with each other.

The first circuit board 172 and/or the second circuit board 174 may include several operational components. An "operational component" may refer to a component, such as an integrated circuit or processor circuit that performs an operation (or operations) such as executing instructions from a software application that is stored on a memory circuit. An operational component may also refer to a transistor. Operational components on either of the first circuit board 172 and/or the second circuit board 174 may convert electrical energy to thermal energy during operation. However, a thermal distribution assembly (not shown) is designed to remove the thermal energy from the circuit board assembly 170. This will be discussed below. As shown in FIG. 32, the circuit boards may include operational components on multiple surfaces. For example, the first circuit board 172 may include a first mounting surface 2202 and a second mounting surface 2204 opposite the first mounting surface 2202, with the first mounting surface 2202 having a first operational component 2212 and the second mounting surface 2204 having a second operational component 2214 (shown as a dotted line). As shown in FIG. 32, both the first mounting surface 2202 and the second mounting surface 2204 may include additional operational components. Also, it should be noted that the operational components on the first circuit board 172 are in electrical communication with each other. The communication means may include, for example, at least one via (not shown) that extends through the first circuit board 172.

The second circuit board 174 may include a first mounting surface 2206 that includes several operational components, such as an operational component 2216. The second circuit board 174 also includes a second mounting surface 2208 opposite the first mounting surface 2206. In some embodiments, the second mounting surface 2208 includes an operational component (or components) in electrical communication with the operational components located on the first mounting surface 2206. Also, it should be noted that when the circuit board assembly 170 is assembled, the second circuit board 174 is overlaid (or covered) by the first circuit board 172 in the stacked configuration. However, it should be noted that the first circuit board 172 is still separated from the second circuit board 174 by at least some gap or space. Also, when the circuit board assembly 170 is assembled, the first mounting surface 2206 of the second circuit board 174 is facing the second mounting surface 2204 of the first circuit board 172, and vice versa.

The first circuit board 172 may mechanically connect with the second circuit board 174 by several standoffs connected with rivets. For example, as shown in FIG. 32, the second circuit board 174 includes a first standoff 2222 designed to connect with a first rivet 2224 located on the first circuit board 172. Each of the remaining standoffs (not labeled) shown in FIG. 19 may connect with a rivet (not labeled) shown in FIG. 32. The standoffs are designed to not only provide mechanical connections, but also to maintain a desired distance between the first circuit board 172 and the second circuit board 174 such that components on the second mounting surface 2204 of the first circuit board 172 do not interfere (physically) with components on the first mounting surface 2206 of the second circuit board 174, and vice versa. Also, the positioning of the standoffs and the rivets may be reversed such that the first circuit board 172 includes the standoffs and the second circuit board 174 includes the rivets.

In order to electrically couple the first circuit board 172 with the second circuit board 174, several interposers may be used to route electrical signals between the first circuit board 172 and the second circuit board 174. For example, as shown in FIG. 32, the second circuit board 174 may include several interposers, such as an interposer 2232, electrically with the second circuit board 174 by, for example, a soldering operation. Several additional interposers (not labeled) are shown. Also, although not shown, the second circuit board 174 may include several metal traces that electrically couple the interposers with one or more operational components on the second circuit board 174. Also, when the first circuit board 172 is electrically coupled to the second circuit board 174, each of the interposers may electrically couple with one or more metal traces (not shown) on the second mounting surface 2204 of the first circuit board 172.

The circuit board assembly 170 may include several shielding elements that shield the components of the circuit board assembly 170 from electromagnetic interference ("EMI"). For example, the circuit board assembly 170 may include a first shielding element 2242 that covers components located on the first mounting surface 2202 of the first circuit board 172. The first shielding element 2242 may include a metal-based material designed to provide an EMI shield to the components on the first mounting surface 2202. The circuit board assembly 170 may further include a second shielding element 2244 designed to provide an EMI shield for components located on the second mounting surface 2204 of the first circuit board 172 and the first mounting surface 2206 of the second circuit board 174. The second shielding element 2244 may include a metal, such as copper or brass. The second shielding element 2244 may secure with (and between) the first circuit board 172 and the second circuit board 174 by several solder joints disposed on each circuit board. For example, FIG. 32 shows the second circuit board 174 having a first solder joint 2250 positioned around an outer perimeter of the second circuit board 174. Several additional solder joints in addition to the first solder joint 2250 are shown but not labeled. The first circuit board 172 may also include solder joints (not shown) in locations corresponding to the solder joints on the second circuit board 174. In some embodiments, the second shielding element 2244 includes several discontinuous structural elements. In the embodiment shown in FIG. 32, the second shielding element 2244 may include a single, continuous structural component designed to extend along an outer perimeter of the circuit board assembly 170. Alternatively, the second shielding element 2244 may include several shielding element parts that combine with one another to form the second shielding element 2244.

The circuit board assembly 170 may further include a third shielding element 2246 positioned on the second mounting surface 2208 of the second circuit board 174. The third shielding element 2246 is designed to combine with the first shielding element 2242 and the second shielding element 2244 to provide an EMI shield to the circuit board assembly 170. Also, the second mounting surface 2208 of the second circuit board 174 may include metal traces (throughout the second mounting surface 2208). In this regard, in addition to forming an EMI shield, the third shielding element 2246 may define at least part of an electrical ground path for the circuit board assembly 170, as the third shielding element 2246 is electrically connect to the second mounting surface 2208 by way of the metal traces. Also, when the component (or components) of the circuit board assembly 170 generates EMI during operation, the aforementioned shielding elements may shield components of the electronic device 100 (shown in FIG. 1) that are external with respect to the circuit board assembly 170 from EMI generated by the component(s) of the circuit board assembly 170.

Figure 33:
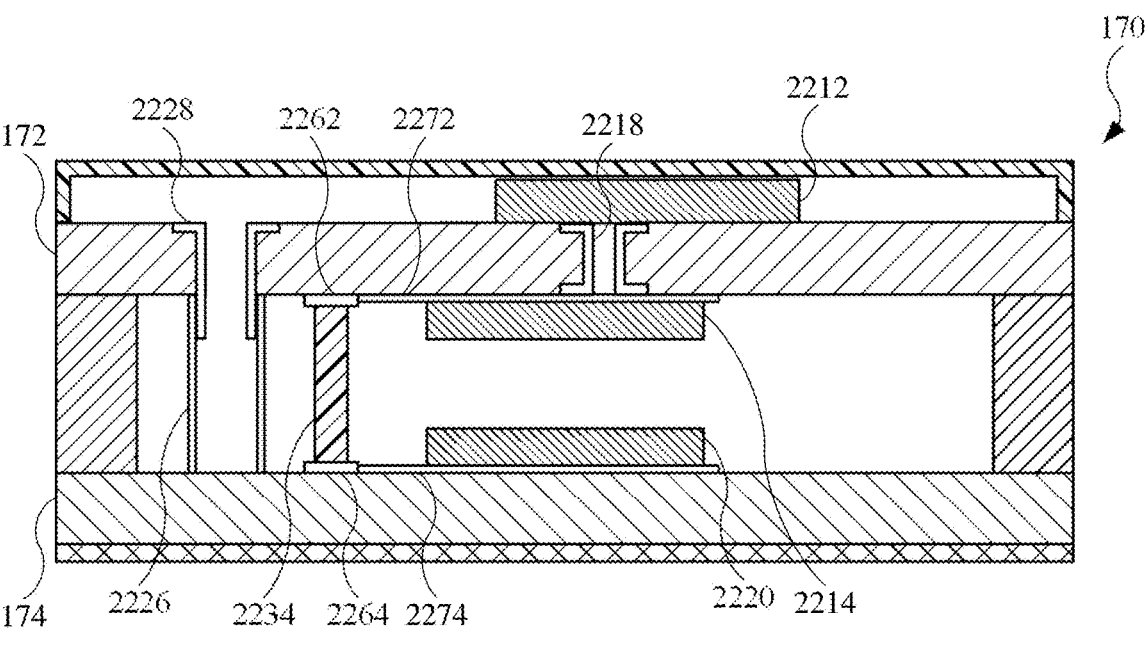
FIG. 33 illustrates a cross sectional view of the circuit board assembly shown in FIG. 32, showing various internal components of the circuit board assembly.

FIG. 33 illustrates a cross sectional view of the circuit board assembly 170 shown in FIG. 32, showing various internal components of the circuit board assembly 170. As shown, the first circuit board 172 may be separated from the second circuit board 174 by a standoff 2226. Further, in order to mechanically couple the first circuit board 172 with the second circuit board 174, the standoff 2226 can be mechanically coupled with the a rivet 2228, with the standoff 2226 and the rivet 2228 electrically isolated from components of the first circuit board 172 and the second circuit board 174.

The first circuit board 172 may include a via 2218 formed from a metal to provide an electrical connection between the first operational component 2212 and the second operational component 2214. Also, the first circuit board by 172 may be in electrical communication with the second circuit board 174 by way of an interposer 2234. As shown, the interposer 2234 may electrically and mechanically connect with a first solder joint 2262 located on the first circuit board 172, and may also electrically and mechanically connect with a second solder joint 2264 located on the second circuit board 174. In addition to the interposer 2234, several additional interposers (not shown) may be used to carry signals between the circuit boards. The first circuit board 172 may include a first metal trace 2272 electrically connected with the second operational component 2214 as well as the via 2218, and the second circuit board 174 may include a second metal trace 2274 electrically connected with a third operational component 2220 located on the second circuit board 174. In this manner, the third operational component 2220 may electrically communicate with the second operational component 2214 by way of the interposer 2234 and the metal traces. The third operational component 2220 may electrically communicate with the first operational component 2212 by way of the via 2218, the interposer 2234, and the metal traces. The circuit board assembly 170 may use several additional metal traces, vias, and solder joints to provide additional electrical communication pathways.

Figure 34:
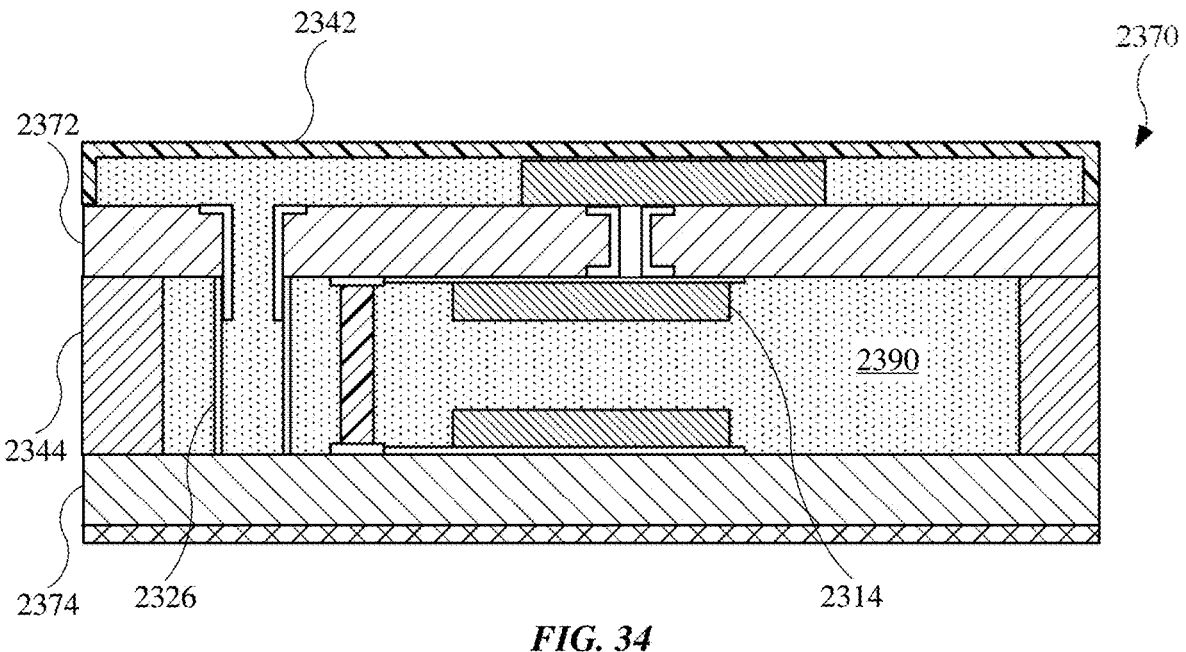
FIG. 34 illustrates an alternative embodiment of a circuit board assembly, showing the circuit board assembly modified for ingress protection.

FIG. 34 illustrates an alternative embodiment of a circuit board assembly 2370, showing the circuit board assembly 2370 modified for ingress protection. The circuit board assembly 2370 may include any components and features previously described for a circuit board assembly, such as a first circuit board 2372 and a second circuit board 2374. However, as shown in FIG. 34, the circuit board assembly 2370 may include a potting material 2390 embedded in the circuit board assembly 2370 between the first circuit board 2372 and a second circuit board 2374. The potting material 2390 may include resin that cures to form a liquid-resistant shield for the various operational components of the circuit board assembly 2370, such as an operational component 2314. In this regard, the potting material 2390 may prevent damage caused by liquid ingress to the circuit board assembly 2370, and in particular, to the components of the circuit board assembly 2370. Further, the potting material 2390 may extend to a first shielding element 2342 and a second shielding element 2344 of the circuit board assembly 2370, in order to prevent corrosion to components, such as a standoff 2326. The potting material 2390 may be used with the circuit assemblies described herein.

Figure 35:
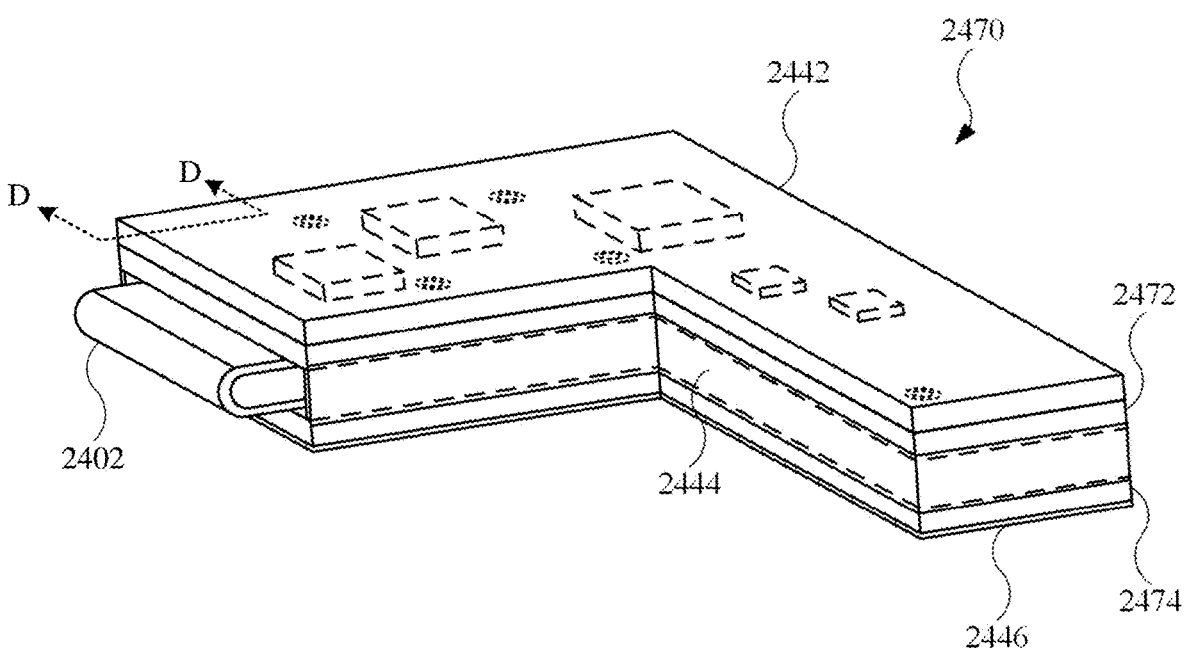
FIG. 35 illustrates an alternate embodiment of a circuit board assembly, showing the circuit board assembly having a flexible circuit electrically coupled with the circuit boards of the circuit board assembly, in accordance with some described embodiments.

FIG. 35 illustrates an alternate embodiment of a circuit board assembly 2470, showing the circuit board assembly 2470 having a flexible circuit 2402 electrically coupled with the circuit boards of the circuit board assembly, in accordance with some described embodiments. The circuit board assembly 2470 may include any components and/or features previously described for a circuit board assembly. For example, as shown, the circuit board assembly 2470 may include a first circuit board 2472 and a second circuit board 2474. The circuit board assembly 2470 may further include a first shielding element 2442 disposed over the first circuit board 2472 and at least some of its components. The circuit board assembly 2470 may further include a second shielding element 2444 covering a gap between the first circuit board 2472 and the second circuit board 2474. The circuit board assembly 2470 may further include a third shielding element 2446 disposed over the second circuit board 2474. However, rather than using interposers for electrical communication between the first circuit board 2472 and the second circuit board 2474 (and their respective components), the circuit board assembly 2470 in FIG. 35 uses the flexible circuit 2402 for communication of electrical signals between operational components located on the first circuit board 2472 and/or the second circuit board 2474.

The flexible circuit 2402 may electrically and mechanically couple with the first circuit board 2472 and form a loop to electrically and mechanically couple with the second circuit board 2474. The electrical and mechanical coupling may be performed using a hot bar soldering operation. A thermode (not shown) may be used as a "hot bar" that is heated in order to supply thermal energy to the flexible circuit 2402 and to soldering elements (not shown) on the first circuit board 2472 and the second circuit board 2474, resulting in an electro-mechanical connection of the flexible circuit 2402 to the first circuit board 2472 and the second circuit board 2474. It should be noted that multiple hot bar soldering operations may be used to couple the flexible circuit 2402 with the first circuit board 2472 and the second circuit board 2474.

Figure 36:
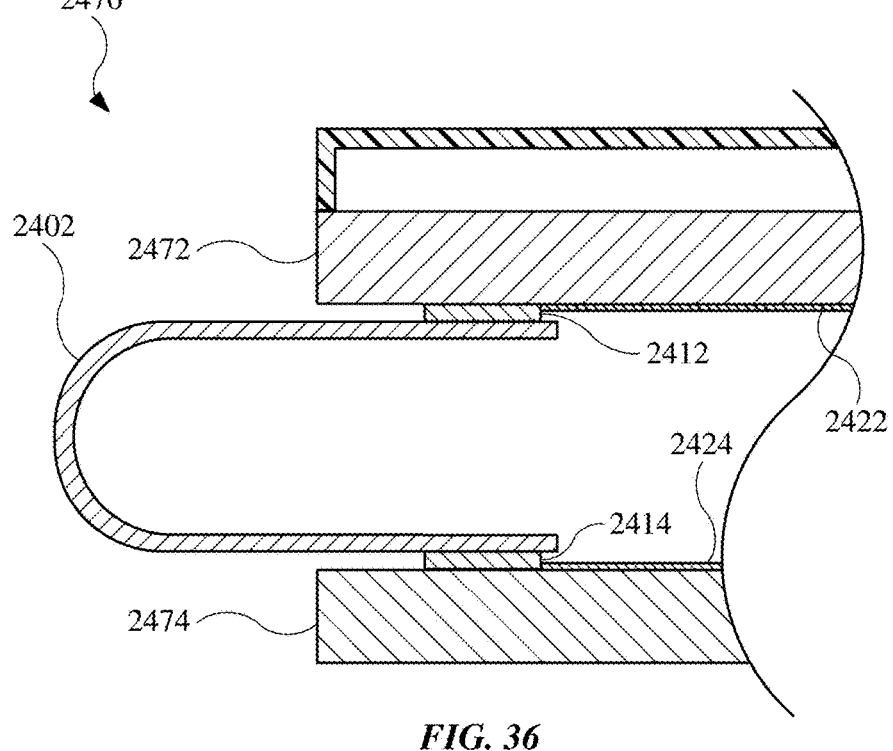
FIG. 36 illustrates a cross sectional view of the circuit board assembly shown in FIG. 35, showing the flexible circuit extending between the circuit boards.

FIG. 36 illustrates a cross sectional view of the circuit board assembly 2470 shown in FIG. 35, taken along line D-D, showing the flexible circuit 2402 extending between the circuit boards. As shown, the flexible circuit 2402 is electro-mechanically coupled with a first solder joint 2412 and a second solder joint 2414, located on the first circuit board 2472 and the second circuit board 2474, respectively. Also, the first solder joint 2412 may electrically couple with a first metal trace 2422 on the first circuit board 2472, and the second solder joint 2414 may electrically couple with a second metal trace 2424 on the second circuit board 2474. As a result, the flexible circuit 2402 may electrically couple with several operational components (not shown), some of which are electrically coupled with the first metal trace 2422 and located on the first circuit board 2472, and some of which are electrically coupled with the second metal trace 2424 and located on the second circuit board 2474.

Figure 37:
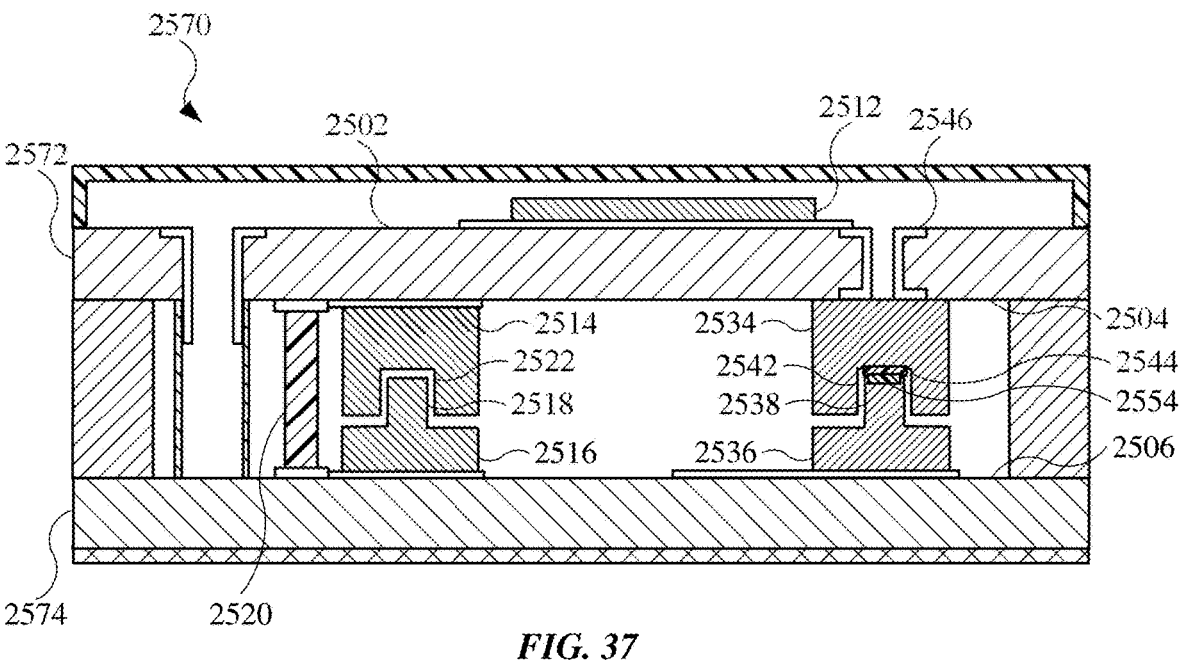
FIG. 37 illustrates a cross sectional view of an alternate embodiment of a circuit board assembly, showing internal components of the circuit board assembly having corresponding geometries, in accordance with some described embodiments.

FIG. 37 illustrates a cross sectional view of an alternate embodiment of a circuit board assembly 2570, showing internal components of the circuit board assembly 2570 having corresponding geometries, in accordance with some described embodiments. The circuit board assembly 2570 may include any components and/or features previously described for a circuit board assembly. For example, the circuit board assembly 2570 may include a first circuit board 2572 and a second circuit board 2574, with the first circuit board 2572 in electrical communication with the second circuit board 2574 by way of an interposer 2520. Additional interposers (not shown) may electrically couple the first circuit board 2572 (and components thereon) with the second circuit board 2574 (and components thereon). The first circuit board 2572 may include a first mounting surface 2502 having a first operational component 2512 and a second mounting surface 2504 (opposite the first mounting surface 2502) that includes a second operational component 2514 electrically coupled to a metal trace (not labeled). Further, the second circuit board 2574 may include a third operational component 2516 electrically coupled to a metal trace (not labeled), with the third operational component 2516 and the metal trace located on a first mounting surface 2506 of the second circuit board 2574.

As shown in FIG. 37, the second operational component 2514 and the third operational component 2516 may be in a nested configuration. For example, the third operational component 2516 may include a protrusion 2518 that at least partially extend into a recess 2522 of the second operational component 2514. The corresponding geometry between the second operational component 2514 and the third operational component 2516 may allow for a reduced dimension (or reduced height) of the circuit board assembly 2570, thereby reducing the overall space occupied by the circuit board assembly 2570 in an electronic device (not shown). In other words, the separation or gap between the first circuit board 2572 and the second circuit board 2574 may decrease, as compared to prior embodiments, due to the corresponding, or nested, configurations of the components of the first circuit board 2572 and the second circuit board 2574 in a manner similar to that of the second operational component 2514 and the third operational component 2516.

Also, in some instances, components on different circuit boards may electrically and mechanically couple with one another by direct means. For example, FIG. 37 further shows the first circuit board 2572 having a fourth operational component 2534 located on the second mounting surface 2504, and a fifth operational component 2536 located on the first mounting surface 2506 of the second circuit board 2574. The fourth operational component 2534 may include a recess 2542 and a connector 2544 positioned in the recess 2542. Further, the fifth operational component 2536 may include a protrusion 2538 that extends into the recess 2542. The protrusion 2538 may include a connector 2554 that electrically and mechanically couples with the connector 2544. In this manner, the fourth operational component 2534 is electrically and mechanically coupled with the fifth operational component 2536.

Moreover, when the circuit board assembly 2570 includes operational components, such as the fourth operational component 2534 and the fifth operational component 2536, the first circuit board 2572 may be electrically coupled to the second circuit board 2574 by way of the fourth operational component 2534 and the fifth operational component 2536. As a result, the circuit board assembly 2570 may not require interposers (such as the interposer 2520) to provide electrical communication between the first circuit board 2572 and the second circuit board 2574. Further, as shown in FIG. 37, the first circuit board 2572 may include a via 2546 electrically coupled with fourth operational component 2534 as well as a metal trace (not labeled). In this manner, the first operational component 2512 may electrically connect to the fifth operational component 2536 by way of the metal trace, the via 2546, and the fourth operational component 2534. It should be noted that in some embodiments, the circuit board assembly 2570 includes either a combination of the second operational component 2514 and the third operational component 2516, as well as the fourth operational component 2534 and the fifth operational component 2536.

Figure 38:
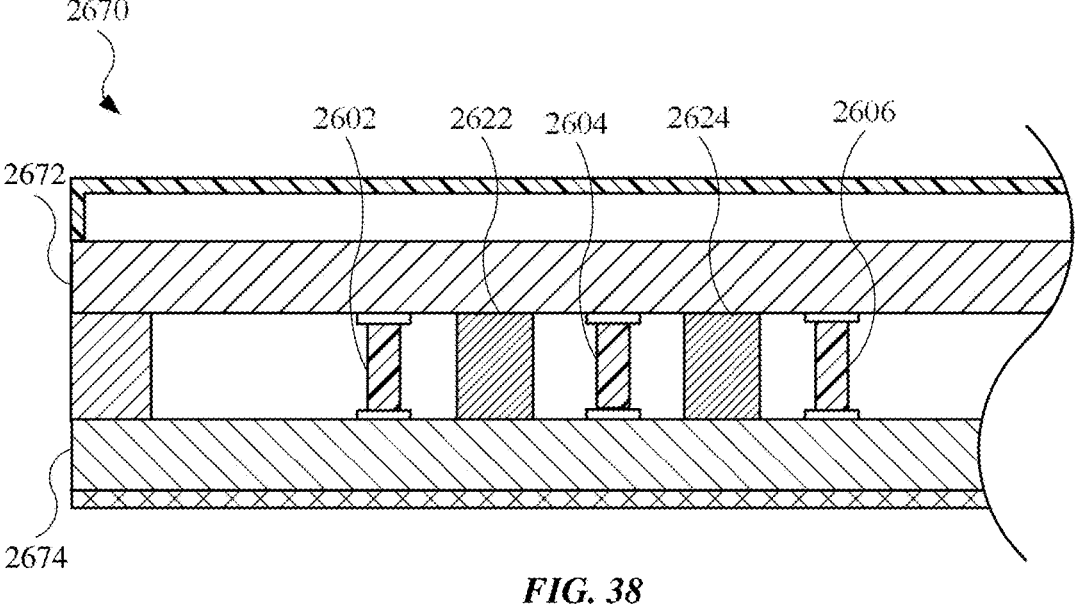
FIG. 38 illustrates a cross sectional view of an alternate embodiment of a circuit board assembly, showing the circuit board assembly having several solder masks used to support a circuit board, an accordance with some described embodiments.

FIG. 38 illustrates a cross sectional view of an alternate embodiment of a circuit board assembly 2670, showing the circuit board assembly 2670 having several solder masks used to support a circuit board, an accordance with some described embodiments. The circuit board assembly 2670 may include any components and/or features previously described for a circuit board assembly. For example, the circuit board assembly 2670 may include a first circuit board 2672 and a second circuit board 2674. Further, each the first circuit board 2672 and the second circuit board 2674 may include several solder joints (not labeled), with an interposer electrically coupled with a solder joint from the first circuit board 2672 and with a solder joint from the second circuit board 2674. For example, FIG. 38 shows the circuit board assembly 2670 having a first interposer 2602 electrically and mechanically coupled with a solder joint (not labeled) on the first circuit board 2672 and the second circuit board 2674, a second interposer 2604 electrically and mechanically coupled with a solder joint (not labeled) on the first circuit board 2672 and the second circuit board 2674, and a third interposer 2606 electrically and mechanically coupled with a solder joint (not labeled) on the first circuit board 2672 and the second circuit board 2674.

In order to prevent oxidation of the solder joints and/or to prevent solder "bridges" from forming between adjacent solder joints during a soldering operation, the circuit board assembly 2670 may include several soldering masks. For example, the circuit board assembly 2670 may include a first solder mask 2622 between the first interposer 2602 and the second interposer 2604, and a second solder mask 2624 between the second interposer 2604 and the third interposer 2606. Based on their positions, the first solder mask 2622 may prevent a solder bridge from forming between the first interposer 2602 and the second interposer 2604 (thereby preventing unwanted electrical coupling between the first interposer 2602 and the second interposer 2604), and the second solder mask 2624 may prevent a solder bridge from forming between the second interposer 2604 and the third interposer 2606 (thereby preventing unwanted electrical coupling between the second interposer 2604 and the third interposer 2606). Moreover, the first solder mask 2622 and the second solder mask 2624 may provide a support structure that maintains a desired distance or separation between the first circuit board 2672 and the second circuit board 2674. Further, in order to maintain the first circuit board 2672 with the second circuit board 2674, both the first circuit board 2672 and the second circuit board 2674 may clamp onto ends of the first solder mask 2622 and the second solder mask 2624. The interposers, solder joints, and solder masks may be representative of several additional interposers, solder joints, and solder masks, respectively.

Figure 39:
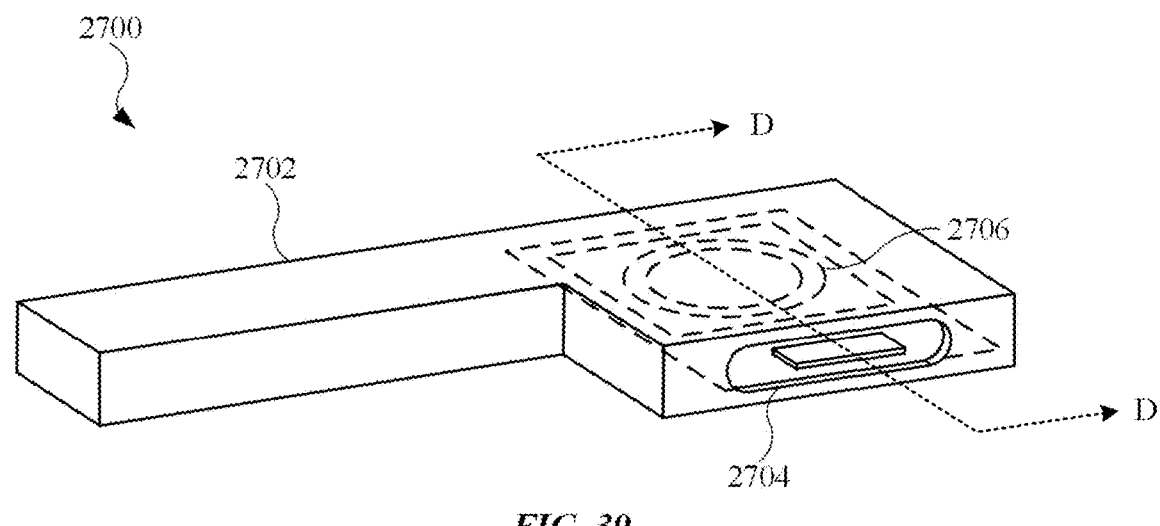
FIG. 39 illustrates an isometric view of an embodiment of an audio module, in accordance with some described embodiments.

FIG. 39 illustrates an isometric view of an embodiment of an audio module 2700, in accordance with some described embodiments. The audio module 2700 may be used in place of the first audio module 182 (shown in FIG. 4). The audio module 2700 may be used as a receiver module designed to generate acoustical energy in the form of audible sound. Generally, a receiver module is used in low power applications associated with relatively low frequency output. However, the audio module 2700 may include modifications for enhanced audio performance associated with an audio speaker module.

The audio module 2700 may include an audio module housing 2702 having an audio module opening 2704. The audio module housing 2702 may define an internal acoustical volume partitioned into a front volume and a back volume. This will be shown below. The audio module housing 2702 may carry a diaphragm 2706, or membrane, designed to vibrate, thereby generating acoustical energy in the form of audible sound. Accordingly, the diaphragm 2706 may be referred to as a membrane, or acoustical membrane. The diaphragm 2706 may include additional thickness to handle additional vibrational energy (associated with additional power supplied to the audio module 2700), and accordingly, additional audio frequencies. Also, the audio module opening 2704 may represent a single, unaltered opening in the audio module housing 2702, and any other openings in the audio module housing 2702 (used for wiring and electrical communication, as an example) may be air-sealed and liquid-sealed. In this regard, the diaphragm 2706 may be prevented from unwanted vibration due to air entering the audio module housing 2702 during a change in air pressure inside an electronic device (not shown). This will be further illustrated below. Also, in some embodiments, the diaphragm 2706 includes a liquid-resistant diaphragm (or liquid-resistant membrane) designed to withstand damage due to expose to liquids, such as water.

Figure 40:
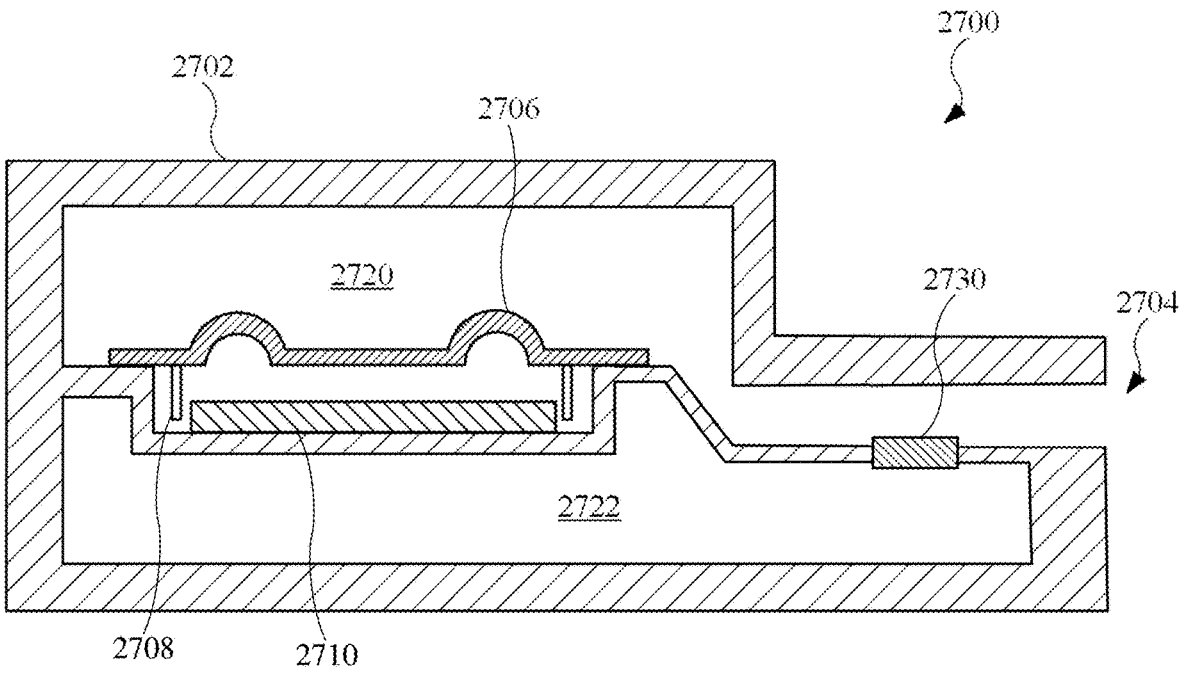
FIG. 40 illustrates a cross sectional view of the audio module shown in FIG. 39, taken along line D-D in FIG. 39, showing several internal features.

FIG. 40 illustrates a cross sectional view of the audio module 2700 shown in FIG. 39, taken along line D-D in FIG. 39, showing several internal features of the audio module 2700. As shown, the audio module 2700 includes a sound coil 2708 and a magnet 2710. The sound coil 2708 is designed to receive an alternating electrical current to form an electromagnet with an alternating magnetic polarity. The alternating magnetic polarity may cause the sound coil to vibrate based on interaction (attraction and repulsion) with an external magnetic field of the magnet 2710.

The diaphragm 2706 is positioned in the audio module housing 2702 and separates an acoustical volume (defined in part by the audio module housing 2702) into a front volume 2720 and a back volume 2722. As shown, the front volume 2720 may open to the audio module opening 2704, while the back volume 2722 is sealed from the audio module opening 2704. Further, when the audio module 2700 is positioned in the electronic device 100 (shown in FIG. 1), the audio module housing 2702 can seal components of the audio module 2700 from air in the electronic device 100 so that, for example, the diaphragm 2706 is not acoustically driven, or otherwise influenced, by air pressure changes in the electronic device 100. As shown, the front volume 2720 and the back volume 2722 may be shielded from air pressure changes in the electronic device 100. However, when the diaphragm 2706 vibrates to create acoustical energy, the acoustical energy exits the audio module opening 2704. Also, in some embodiments, the audio module 2700 includes an air vent 2730 that allows air into the back volume 2722 (by way of air entering the audio module opening 2704), and out of the back volume 2722 to the audio module opening 2704 such that the back volume 2722 can equilibrate with ambient air when the air pressure of the external ambient air changes. Also, while the audio module 2700 may substitute for the first audio module 182 (shown in FIG. 4), the audio module 2700 may include different designs and shapes such that the audio module 2700 may also substitute for the second audio module 184 (shown in FIG. 4).

Figure 41:
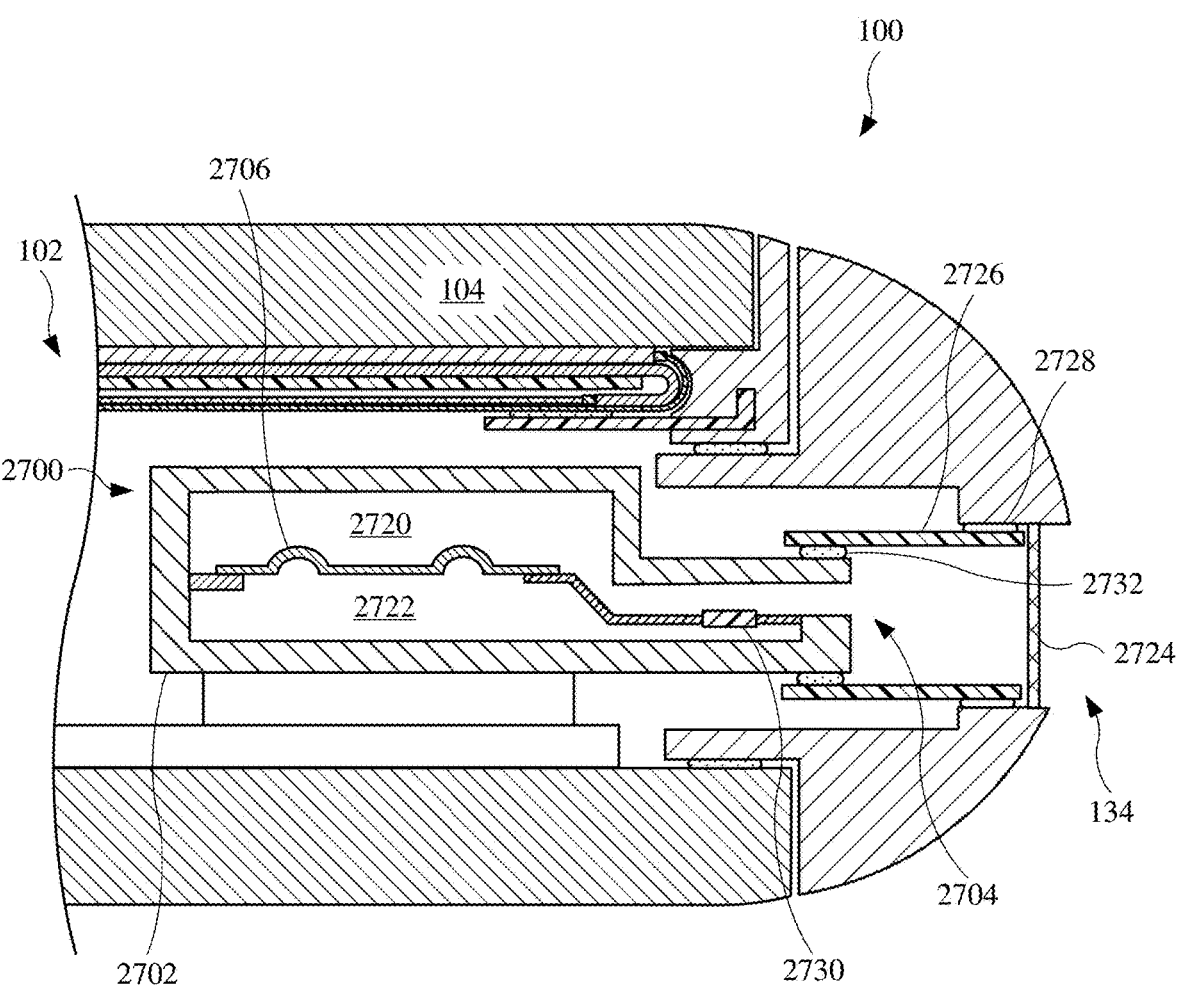
FIG. 41 illustrates a cross sectional view of the electronic device, showing the audio module positioned in the electronic device.

FIG. 41 illustrates a cross sectional view of the electronic device 100, showing the audio module 2700 positioned in the electronic device 100. As shown, the audio module 2700, and in particular, the audio module opening 2704, is aligned with at least the one of the openings 134 (both of which are shown in FIG. 1). Also, a mesh material 2724 may cover the openings 134 and provide an aesthetic finish. Also, in some embodiments, the audio module 2700 is fitted with a bracket 2726. The bracket 2726 may secure with the audio module 2700 by an adhesive 2728, which may include a liquid-resistant adhesive to prevent liquid from entering the electronic device 100 around the bracket 2726. Also, the bracket 2726 may include a scaling element 2732 positioned between the audio module 2700 and the bracket 2726 to form an ingress barrier between the audio module 2700 and the bracket 2726. In this manner, the audio module 2700 is positioned in the electronic device 100 such that any liquid entering the openings 134 may extend into the front volume 2720 but not into the back volume 2722. Also, any air entering the openings 134 may extend into both the front volume 2720 and the back volume 2722, with the latter using the air vent 2730 to receive air. The air vent 2730 may allow air to exit the back volume 2722 as well. Accordingly, the audio module 2700 may provide acoustical energy while preventing liquid ingress into the electronic device 100. Also, any acoustical energy generated by the diaphragm 2706 can exit the audio module 2700 via the audio module opening 2704, and can also exit the electronic device 100 via the openings 134.

Further, as shown in FIG. 41, the audio module 2700 can be positioned in the electronic device 100 such that the audio module opening 2704 is exposed only ambient air (external to the electronic device 100) that enters the electronic device 100 through the openings 134. In other words, the audio module housing 2702 is sealed in a manner such that an internal volume change that causes an air pressure change in the electronic device 100 by, for example, depressing the first protective layer 104 and the display assembly 102, will not cause air to enter the audio module housing 2702, thereby preventing the diaphragm 2706 from generating unwanted acoustical noise.

Figure 42:
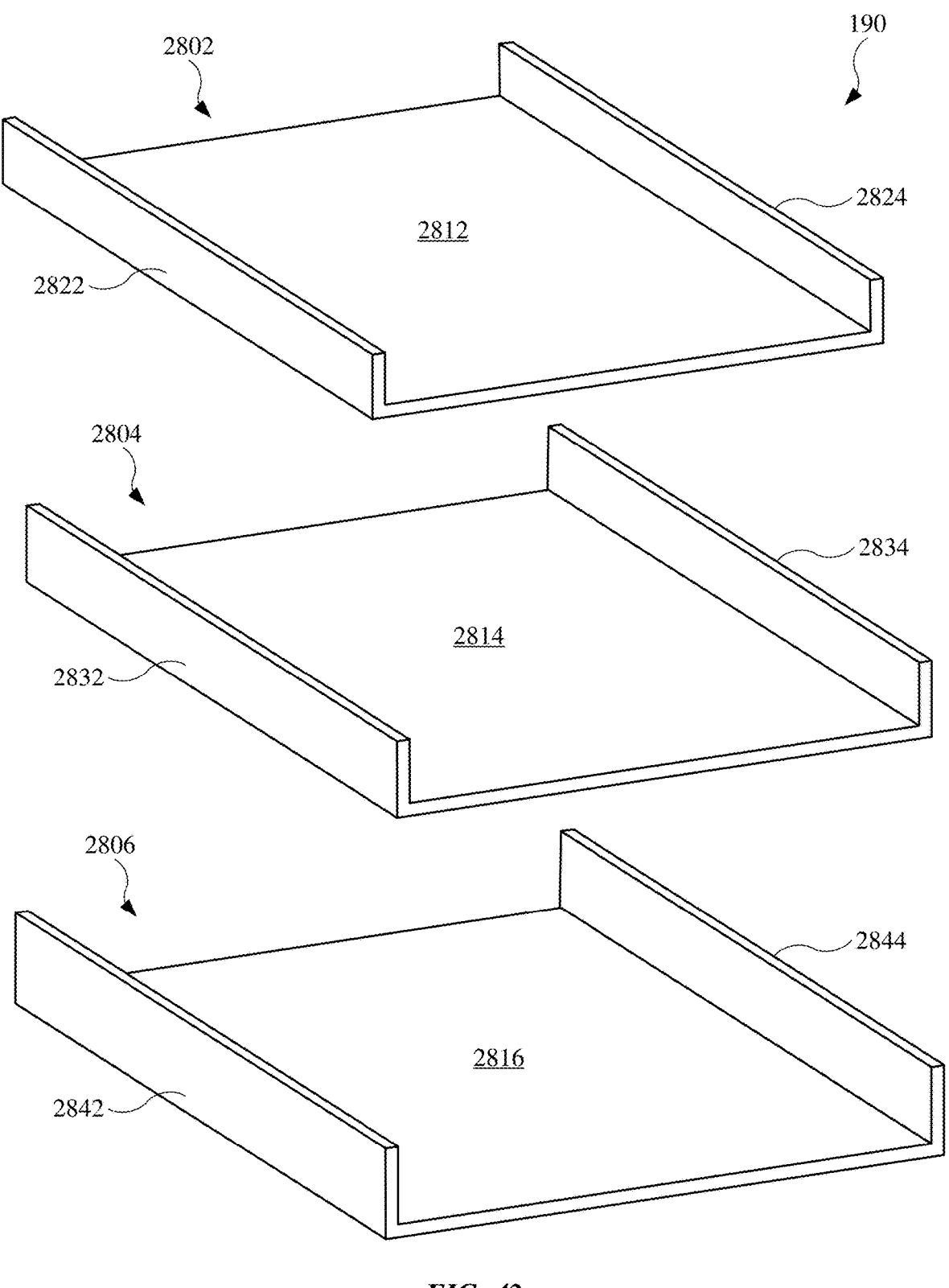
FIG. 42 illustrates an exploded view of a thermal distribution assembly, in accordance with some described embodiments.

FIG. 42 illustrates an exploded view of the thermal distribution assembly 190, in accordance with some described embodiments. The thermal distribution assembly 190 may include several layers of material that provide not only enhanced heat transfer properties, but also structural support. The enhanced heat transfer properties and structural support may be useful when the thermal distribution assembly 190 is used in an electronic device having a substantially non-metal exterior and thus reduced heat transferred capabilities, such as the electronic device 100 having a second protective layer 144 (shown in FIG. 2). In this regard, the thermal distribution assembly 190 can be used in an electronic device to direct thermal energy away from a non-metal bottom wall toward another structural feature of the electronic device, such as the aforementioned sidewall components.

As shown, the thermal distribution assembly 190 may include several layers of material. For example, the thermal distribution assembly 190 may include a first layer 2802 formed from a first type material, which may include a durable material, such as stainless steel. The first layer 2802 may include a bottom wall 2812, along with a first sidewall 2822 and a second sidewall 2824, both of which extend from the bottom wall 2812 in a perpendicular, or at least substantially perpendicular, manner. When assembled in the electronic device 100 (shown in FIGS. 1 and 2), the thermal distribution assembly 190, and in particular the first layer 2802, is thermally coupled to one or more heat-generating components in the electronic device 100. At least one of the bottom wall 2812, the first sidewall 2822, and the second sidewall 2824 may include a contact surface that is in direct thermal contact, or at least thermally coupled, with a heat-generating component in an electronic device. This will be shown below.

The thermal distribution assembly 190 may further include a second layer 2804 designed to engage and thermally couple to the first layer 2802. The second layer 2804 may include a bottom wall 2814, along with a first sidewall 2832 and a second sidewall 2834, both of which extend from the bottom wall 2814 in a perpendicular, or at least substantially perpendicular, manner. When the thermal distribution assembly 190 is assembled, the bottom wall 2814, the first sidewall 2832, and the second sidewall 2834 of the second layer 2804 may engage the bottom wall 2812, the first sidewall 2822, and the second sidewall 2824 of the first layer 2802, respectively. Also, the second layer 2804 may be formed from a second type material, which may include a material having a relatively high thermal conductivity (as compared to the first type material of the first layer 2802), such as copper or graphite. In this regard, the second layer 2804 is designed to redistribute, redirect, or otherwise spread thermal energy away from a heat-generating component (not shown) in an electronic device when the heat-generating component is thermally coupled with the thermal distribution assembly 190. The second layer 2804 may receive thermal energy from the first layer 2802, when the first layer 2802 receives thermal energy from the heat-generating component(s). At least one of the bottom wall 2816, the first sidewall 2842, and the second sidewall 2844 may include a contact surface that is in direct thermal contact, or at least thermally coupled, with the second layer 2804.

Also, the thermal distribution assembly 190 may include a third layer 2806 designed to combine with the first layer 2802 and enhance the structural support and rigidity to the thermal distribution assembly 190. Accordingly, the third layer 2806 may be formed from a third type material, which in some instances is the same or similar to that of the first type material for the first layer 2802. The third layer 2806 may include a bottom wall 2816, along with a first sidewall 2842 and a second sidewall 2844, both of which extend from the bottom wall 2816 in a perpendicular, or at least substantially perpendicular, manner. When the thermal distribution assembly 190 is assembled, the bottom wall 2816, the first sidewall 2842, and the second sidewall 2844 of the third layer 2806 may engage the bottom wall 2814, the first sidewall 2832, and the second sidewall 2834 of the second layer 2804, respectively. Also, when the thermal distribution assembly 190 is positioned in the electronic device 100 (shown in FIGS. 1 and 2), the first sidewall 2842 and the second sidewall 2844 third layer 2806 may engage and thermally couple to the third sidewall component 116 and the fourth sidewall component 118 (shown in FIG. 1), respectively. In this manner, the thermal distribution assembly 190 can be thermally coupled to portions of the band 110 (shown in FIGS. 1 and 2). At least one of the bottom wall 2814, the first sidewall 2832, and the second sidewall 2834 may include a contact surface that is in direct thermal contact, or at least thermally coupled, with the first layer 2802.

Based on the aforementioned material makeup of the thermal distribution assembly 190, the second layer 2804 may include a heat transfer characteristic that is different from that of the first layer 2802 and the third layer 2806. For example, the second layer 2804 may be formed from a material having a relatively high thermal conductivity, as compared to the material(s) that forms the first layer 2802 and the third layer 2806. Also, the first layer 2802 and the third layer 2806 may be formed a material having a relatively high durability or rigidity, as compared to the material that forms the second layer 2804.

In order to assemble the thermal distribution assembly 190 with layers of different material makeups, the various layers may undergo a cladding operation designed to bond the layers together. The cladding operation can include placing each layer of material on separate rollers, and then pressing the layers together when the layers pass the rollers. The pressing effect may create molecular bonds between molecules of the metals. It should be noted that the cladding operation can be used when the second layer 2804 includes copper. A different assembly operation may be used when the second layer 2804 includes graphite. This will be shown and discussed below. Also, when the thermal distribution assembly 190 is assembled, the first layer 2802 and the third layer 2806 may provide support for the second layer 2804, and may also provide some structural support to an electronic device (not shown) that carries the thermal distribution assembly 190. While the second layer 2804 is primarily used for heat transfer, the first layer 2802 and the third layer 2806 may also provide at least some heat transfer capabilities. Also, while the first layer 2802 and the third layer 2806 are primarily used for structural support, the second layer 2804 may also provide at least some structural support.

Figure 43:
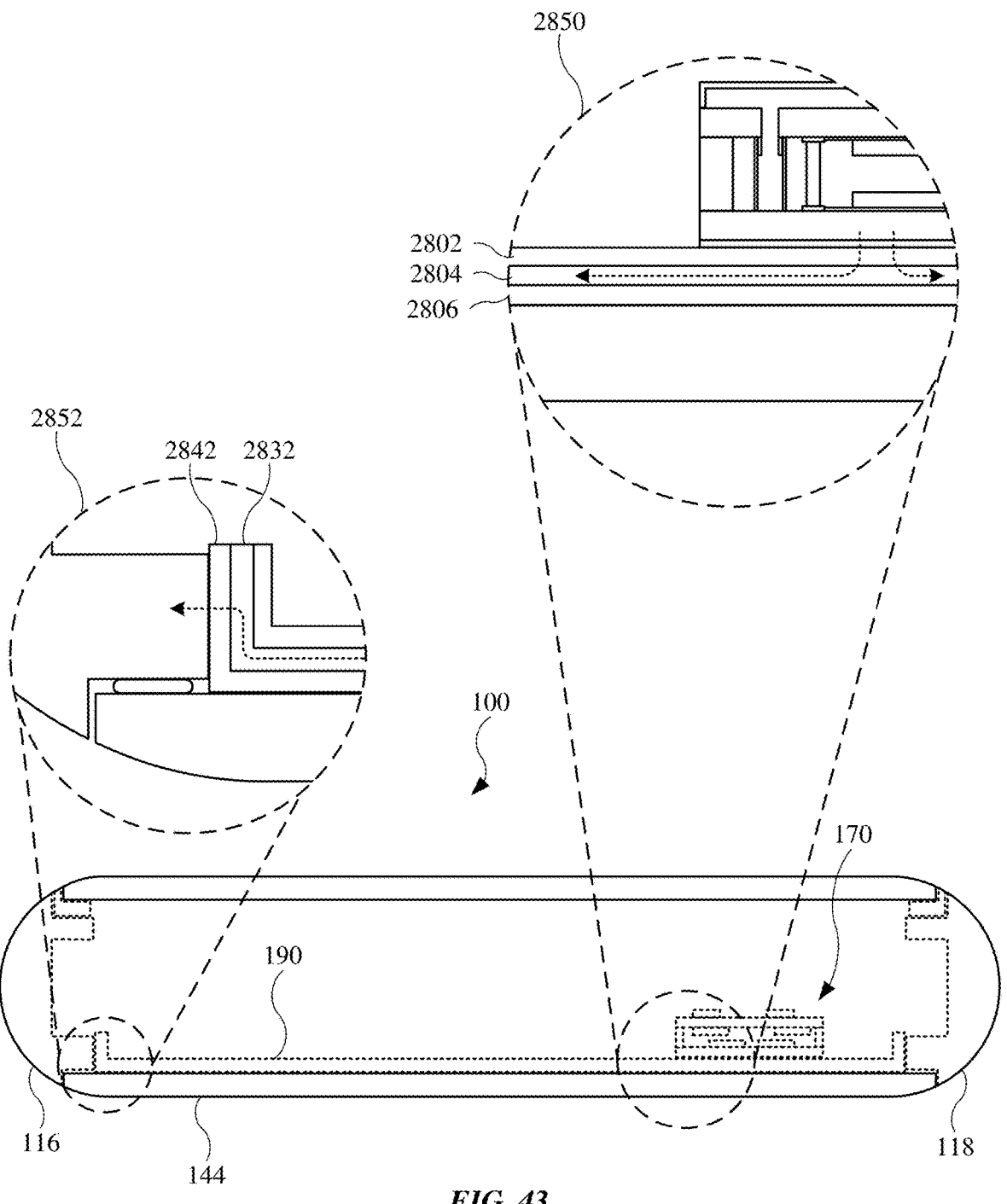
FIG. 43 illustrates a partial cross sectional view of the electronic device shown in FIG. 1, showing the thermal distribution assembly positioned in the electronic device.

FIG. 43 illustrates a partial cross sectional view of the electronic device 100 shown in FIG. 1, showing the thermal distribution assembly 190 positioned in the electronic device 100. For purposes of illustration, some components of the electronic device 100 are removed. As shown, the thermal distribution assembly 190 may be in direct thermal contact, or at least thermally coupled, with the circuit board assembly 170 such that heat generated from one or more operational components of the circuit board assembly 170 may pass from the circuit board assembly 170 to at least some layers of the thermal distribution assembly 190. For example, as shown in the first enlarged view 2850, thermal energy flow (represented by dotted lines with an arrow), or heat flow, generated from operational components of the circuit board assembly 170 may pass through the first layer 2802 to the second layer 2804. As shown, a contact surface (bottom wall 2812, labeled in FIG. 42) of the first layer 2802 is in thermal contact with the circuit board assembly 170. Further, due in part to the relatively high thermal conductivity of the second layer 2804 (as compared to the third layer 2806), the thermal energy has a tendency to extend through the first layer 2802 and perpendicular, or at least partially perpendicular, to the first layer 2802 and continue through the second layer 2804 rather than through the third layer 2806. As further shown, the thermal energy flow moves parallel, or at least partially parallel, with respect to a contact surface (bottom wall 2814, labeled in FIG. 24) of the second layer 2804. Accordingly, the relatively low thermal conductivity of the third layer 2806 may prevent thermal energy build-up, also referred to as a thermal hot spot, at a location(s) near the second protective layer 144. This will be further discussed below.

Also, as shown in FIG. 43, the thermal distribution assembly 190 can be designed to engage the band 110. For example, as shown in the second enlarged view 2852, a contact surface of the first sidewall 2842 of the third layer 2806 of the thermal distribution assembly 190 may engage the third sidewall component 116 of the band 110. Accordingly, the third layer 2806 may be in direct thermal contact, or at least thermally coupled, with the third sidewall component 116. The second layer 2804 may distribute or redirect the thermal energy to the third layer 2806, and in particular from the first sidewall 2832 of the second layer 2804 to the first sidewall 2842 of the third layer 2806, so that the thermal energy is distributed to the third sidewall component 116, where the thermal energy may then dissipate from the third sidewall component 116 to the ambient air. The thermal distribution assembly 190 may further engage the fourth sidewall component 118 of the band 110, and in this manner, the thermal distribution assembly 190 can distribute heat to the fourth sidewall component 118 in a manner similar to that of the third sidewall component 116 (that is, by way of the sidewalls of the second layer 2804 and the third layer 2806, shown in FIG. 42). In this manner, at least one of the sidewall components as a distributed heat sink that prevents heat generated by the circuit board assembly 170 from becoming trapped at or near the second protective layer 144 so has to prevent formation of a thermal hot spot.

Furthermore, the thermal distribution assembly 190 may prevent or limit the second protective layer 144 from receiving thermal energy generated from operational components of the circuit board assembly 170, as the third layer 2806 provides minimal thermal conductivity, as compared to the second layer 2804, such that the thermal energy in the electronic device 100 is primarily carried by the second layer 2804. In this regard, the second layer 2804 may define a thermal path, or primary thermal path, for thermal energy generated by operational components of the circuit board assembly 170. While FIG. 43 shows the thermal distribution assembly 190 receiving heat from a component(s) of the circuit board assembly 170, it should be noted that the thermal distribution assembly 190 can receive heat from any heat-generating component of the electronic device 100 that is thermally coupled to the thermal distribution assembly 190. Also, the thermal distribution assembly 190 may provide a rigid support structure that supports the second protective layer 144. For example, the first layer 2802 and the third layer 2806 of the thermal distribution assembly 190 may extend across a major surface of the second protective layer 144, as shown in FIG. 43.

Figure 44:
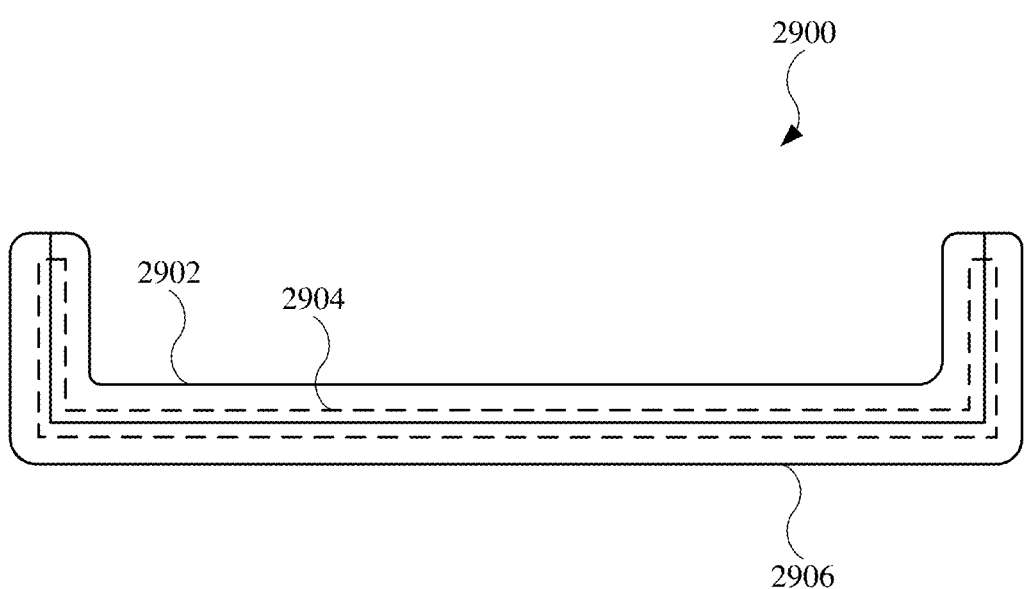
FIG. 44 illustrates a side view of an alternative embodiment of a thermal distribution assembly, in accordance with some described embodiments.

FIG. 44 illustrates a side view of an alternative embodiment of a thermal distribution assembly 2900, in accordance with some described embodiments. The thermal distribution assembly 2900 may include any material(s) and/or feature(s) previously described for a thermal distribution assembly. The thermal distribution assembly 2900 may include a first layer 2902, a second layer 2904 (shown as a dotted line), and a third layer 2906, with the second layer 2904 embedded between the first layer 2902 and the third layer 2906. As shown, the second layer 2904 may be completely covered by the first layer 2902 and the third layer 2906. This may prevent movement or shifting of the second layer 2904 relative to the first layer 2902 and/or the third layer 2906. However, it should be noted that the second layer 2904 may still receive heat passing through the first layer 2902 and/or the third layer 2906.

Figure 45:
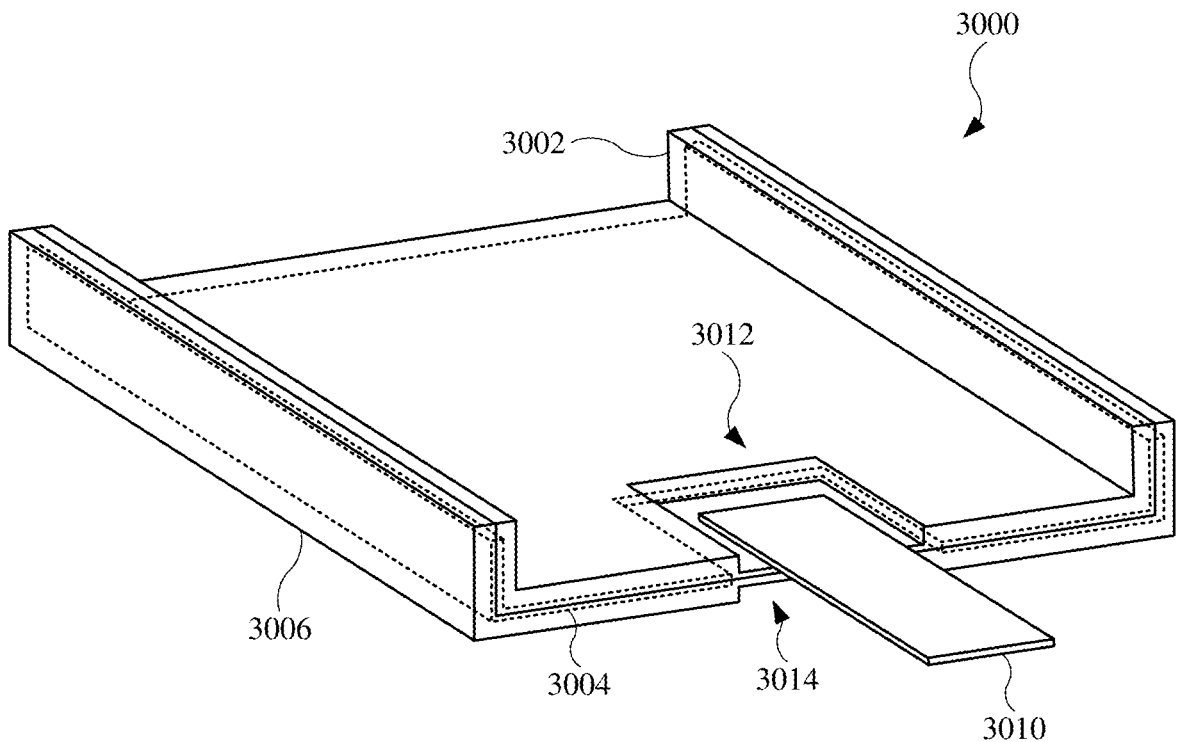
FIG. 45 illustrates an isometric view of an alternative embodiment of a thermal distribution assembly, showing the thermal distribution assembly modified to receive a component, in accordance with some described embodiments.

FIG. 45 illustrates an isometric view of an alternative embodiment of a thermal distribution assembly 3000, showing the thermal distribution assembly 3000 modified to receive a component 3010, in accordance with some described embodiments. The thermal distribution assembly 3000 may include any material(s) and/or feature(s) previously described for a thermal distribution assembly. As shown, the thermal distribution assembly 3000 may include a first layer 3002, a second layer 3004, and a third layer 3006, with the second layer 3004 embedded between the first layer 3002 and the third layer 3006.

However, the second layer 3004 may be modified to reduce the dimensions of the thermal distribution assembly 3000. For example, a portion of the second layer 3004 may be locally removed in a desired location such that a portion of the thermal distribution assembly 3000 includes only the first layer 3002 and the third layer 3006, thereby reducing (locally) the dimensions of the thermal distribution assembly 3000 where the second layer 3004 is not present. As a result of the reduced dimensions, the thermal distribution assembly 3000 may include a first channel 3012 that receives the component 3010. The thermal distribution assembly 3000 may further include a second channel 3014 that may receive a second component (not shown). It should be noted that the locations of the first channel 3012 and the second channel 3014 correspond to a location in which the second layer 3004 is not present. However, any component(s) secured with the thermal distribution assembly 3000 at the first channel 3012 and/or the second channel 3014 may be thermally coupled to the second layer 3004 such that thermal energy generated by the component(s) may be drawn from the component(s) to the second layer 3004.

The component 3010 can be secured with the thermal distribution assembly 3000 by welding, soldering, or adhering (by adhesives), as non-limiting examples. Also, the dimensions of the first channel 3012 allow the component 3010 to be seated in the thermal distribution assembly 3000 such that the component 3010 is at least co-planar, and in some cases sub-flush, with respect to the first layer 3002. It should be noted that the dimensions of the second channel 3014 may allow a second component (not shown) to be seated in the thermal distribution assembly 3000 such that the second component is at least co-planar, and in some cases sub-flush, with respect to the third layer 3006. Also, the component 3010 may be representative of one or more components, such as an aforementioned heat-generating component, an audio module, a bracket, or a joint, as non-limiting examples. Alternatively, the component 3010 may include a thermally conductive layer designed to receive (and thereby dissipate) thermal energy from the thermal distribution assembly 3000.

Figure 46:
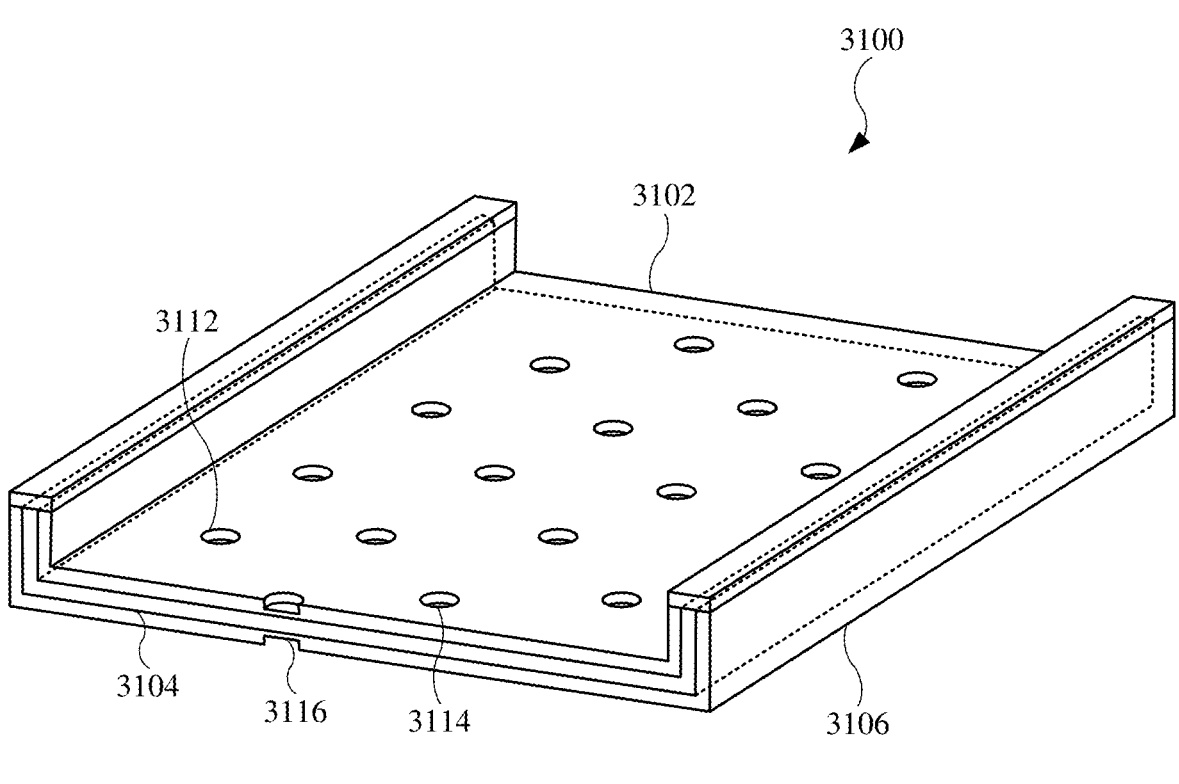
FIG. 46 illustrates an isometric view of an alternative embodiment of a thermal distribution assembly, in accordance with some described embodiments.

FIG. 46 illustrates an isometric view of an alternative embodiment of a thermal distribution assembly 3100, in accordance with some described embodiments. The thermal distribution assembly 3100 may include any material(s) and/or feature(s) previously described for a thermal distribution assembly. As shown, the thermal distribution assembly 3100 may include a first layer 3102, a second layer 3104, and a third layer 3106, with the second layer 3104 positioned between the first layer 3102 and the third layer 3106.

In some embodiments, the second layer 3104 includes a metal, such as copper. In the embodiment shown in FIG. 46, the second layer 3104 includes graphite. In order to bond the second layer 3104 with the first layer 3102 and the third layer 3106, the thermal distribution assembly 3100 may undergo a welding operation. For example, as shown in FIG. 46, the thermal distribution assembly 3100 includes several welds, such as a first weld 3112 and a second weld 3114, both being representative of several welds between the first layer 3102 and the second layer 3104. Also, the thermal distribution assembly 3100 may include several welds between the third layer 3106 and the second layer 3104, as represented by a third weld 3116. By welding the second layer 3104 with the first layer 3102 and the third layer 3106, the second layer 3104 may resist shear forces that would otherwise displace the second layer 3104 with respect to the first layer 3102 and the third layer 3106, particularly when the second layer 3104 includes a granular material, such as graphite.

Figure 47:
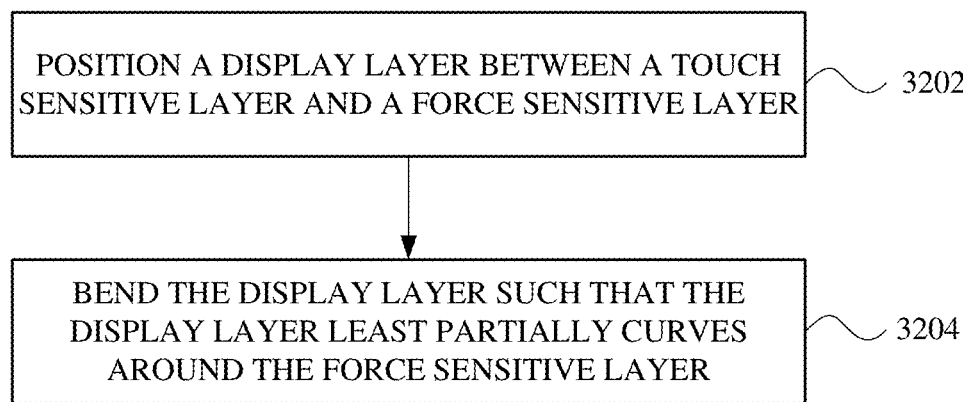
FIG. 47 illustrates a flowchart showing a method for forming a display assembly for an electronic device, in accordance with some described embodiments.

FIG. 47 illustrates a flowchart 3200 showing a method for forming a display assembly for an electronic device, in accordance with some described embodiments. The electronic device may include a portable electronic device, such as a mobile wireless communication device that includes a smartphone or a wearable electronic device.

In step 3202, a display layer is positioned between a touch sensitive layer and a force sensitive layer. The touch sensitive layer is configured to detect a touch input that controls the electronic device. The force sensitive layer is configured to detect an amount of force applied to the touch sensitive layer. Each of the display layer, the touch sensitive layer, and the force sensitive layer may include an edge region that includes at least one connector. Moreover, some edge regions having a connector(s) may be perpendicular or parallel to other edge regions. For example, the touch sensitive layer may include an edge region with a connector, and the display layer may include edge region with a connector, with the aforementioned edge regions being parallel, or at least substantially parallel, with respect to one another. Further, the force sensitive layer may include an edge region that includes a connector. However, the edge region of the force sensitive layer may be perpendicular, or at least substantially perpendicular, with respect to the edge region of the display layer and/or the edge region of the touch sensitive layer.

In step 3204, the display layer is bent such that the display layer least partially curves around the force sensitive layer. In some instances, the display layer is pre-bent. Also, the edge region of the display (that carries the connector) may be separated from a major portion of the display layer. The major portion of the display layer refers a surface that defines a substantial majority of the display layer, while a minor portion of the display layer refers to a portion that is separated from the major portion by the bend. The edge region having the connector may be located on, or carried by, the minor portion.

Figure 48:
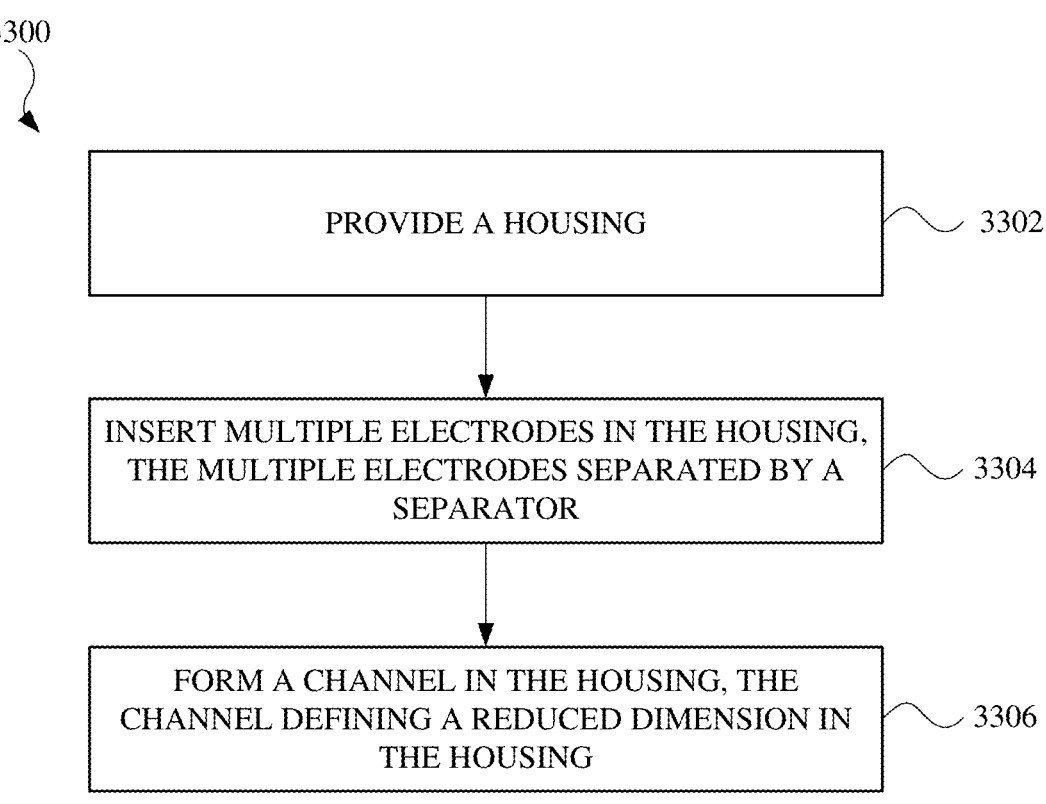
FIG. 48 illustrates a flowchart showing a method for forming a battery assembly for an electronic device, in accordance with some described embodiments.

FIG. 48 illustrates a flowchart 3300 showing a method for forming a battery assembly for an electronic device, in accordance with some described embodiments. The battery assembly may be used to supply electrical current to several internal components (such as integrated circuits, audio modules, cameras, lighting elements, etc.) located in the electronic device.

In step 3302, a housing is provided. The housing is designed to provide an enclosure to several components of the battery. The housing may include a first cover element that is sealed with a second cover element, subsequent to the components being positioned between the first cover element and the second cover element. Also, the housing may take the form of one of several different shapes. In this regard, the housing may include an L-shaped configuration, an I-shaped configuration, or a C-shaped configuration (as non-limiting examples), based upon the shape of the electrodes and the separators. Moreover, any of these aforementioned configurations may include an opening, or through hole, designed to accommodate, or provide space for, an internal component of the electronic device.

In step 3304, multiple electrodes are inserted into the housing. The multiple electrodes may include pairs of anodes and cathodes. Also, each pair of electrodes is separated by a separator that physically isolates the electrode pairs from each other, while still allowing the flow of electrical charge between the electrode pairs. Also, each electrode may undergo a die cutting operation to form the electrodes with a particular size and shape. The size and shape may include a size and shape in accordance with the housing. In this regard, each electrode in an electrode pair may include an L-shape, a C-shape, or an I-shape, as non-limiting examples. Moreover, each separator and each electrode in an electrode pair may include an opening when the housing also includes the aforementioned opening, in order to provide a through hole in the battery assembly.

In step 3306, a channel is formed in the housing. The channel may define a reduced dimension in the housing. In this regard, the housing may (substantially) include a first height. However, in a location corresponding to the channel, the housing may include a second height that is less than the first height. The channel is designed to lower the profile of the battery assembly such that an additional component (such as a flexible circuit) can readily pass over the battery along the channel. In this regard, the channel may allow repositioned of the additional component in the electronic device. However, the housing of the battery can still receive components, such as a circuit board, in a location corresponding to (or within) the channel.

FIG. 49 illustrates a flowchart 3400 showing a method for forming a circuit board assembly, in accordance with some described embodiments. The circuit board assembly is designed to carry several operational components. The circuit board assembly may include a stacked configuration in which a first circuit board is stacked or a second circuit board, or alternatively, the second circuit board is overlaid by the first circuit board. When positioned in an enclosure, or housing, of an electronic device, the stacked configuration may reduce the overall space (in multiple dimensions) occupied by the circuit board assembly.

In step 3402, a first circuit board is provided. The first circuit board may include a first operational component. The first operational component includes a recess. Also, the first circuit board may include multiple (opposing) surfaces, with each surface designed to carry multiple operational components, some of which are in electrical communication with each other by way of metal traces and/or a via.

In step 3404, a second circuit is secured with the first circuit board such that the first circuit overlays the second circuit board. The second circuit board may include a second operational component having a protrusion.

In step 3406, the protrusion of the second operational component is positioned in (or at least partially positioned in) the recess. In this matter, the first operational component is "mated" with the second operational component by way of the recess and the protrusion. This may reduce a gap between the first circuit board and the second circuit board, as the first operational component and the second operational component are positioned closer to each other, as opposed to operational components that cannot mate with one another. As a result, the circuit board assembly may include a lower profile and occupy less space in an electronic device.

Figure 50:
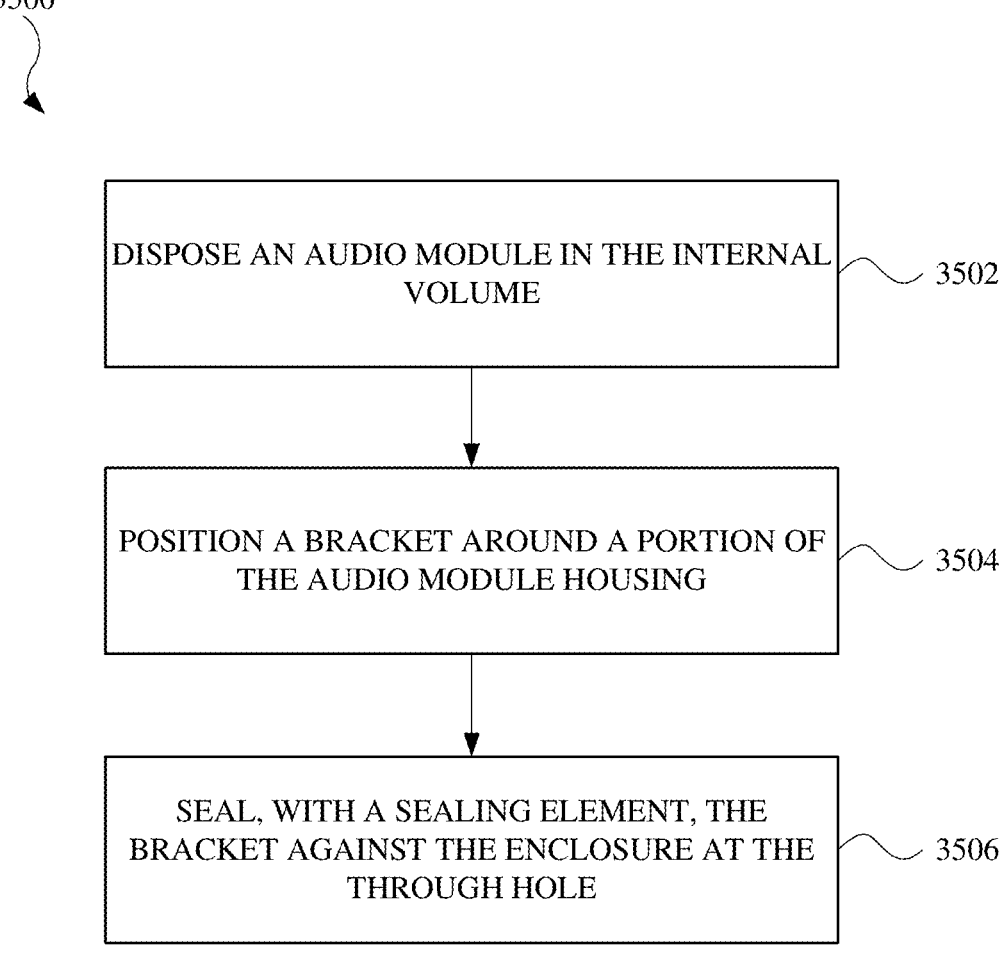
FIG. 50 illustrates a flowchart showing a method for assembling an electronic device that includes an enclosure that defines an internal volume, in accordance with some described embodiments.

FIG. 50 illustrates a flowchart 3500 showing a method for assembling an electronic device that includes an enclosure that defines an internal volume, in accordance with some described embodiments. The enclosure may include a through hole that opens to the internal volume. In step 3502, an audio module is disposed in the internal volume. The audio module may include an audio module housing that carries a diaphragm. The audio module may further include an audio module opening formed in the audio module housing and aligned with the through hole. Also, with the exception of the audio module opening, the audio module housing may be free of additional openings, or alternatively, may include an opening (or openings) covered by an airtight and liquid-tight seal such that the audio module housing defines an acoustic volume (including a front and back volume) that is maintained separately from air inside the internal volume defined by the enclosure.

In step 3504, a bracket is positioned around a portion of audio module housing. For example, the bracket may at least partially surround a portion of the audio module housing associated with the audio module opening, thereby providing additional support to the audio module housing. Also, the bracket may adhesively secure with the enclosure at or near the through hole. The adhesive used to secure the bracket to the enclosure may include a liquid-resistant adhesive.

In step 3506, a sealing element seals the bracket against the enclosure at the through hole. The sealing element may be positioned between the bracket and the enclosure, and may also engage the bracket and the enclosure. In this regard, the audio module housing is sealed from air in the internal volume, and may seal the diaphragm from the air in the internal volume. Further, the audio module housing is positioned and designed to receive or emit air from an external environment outside the electronic device, such as air entering the through hole. Also, using the diaphragm, the audio module can emit acoustical energy that exits the audio module opening and the through hole.

Figure 51:
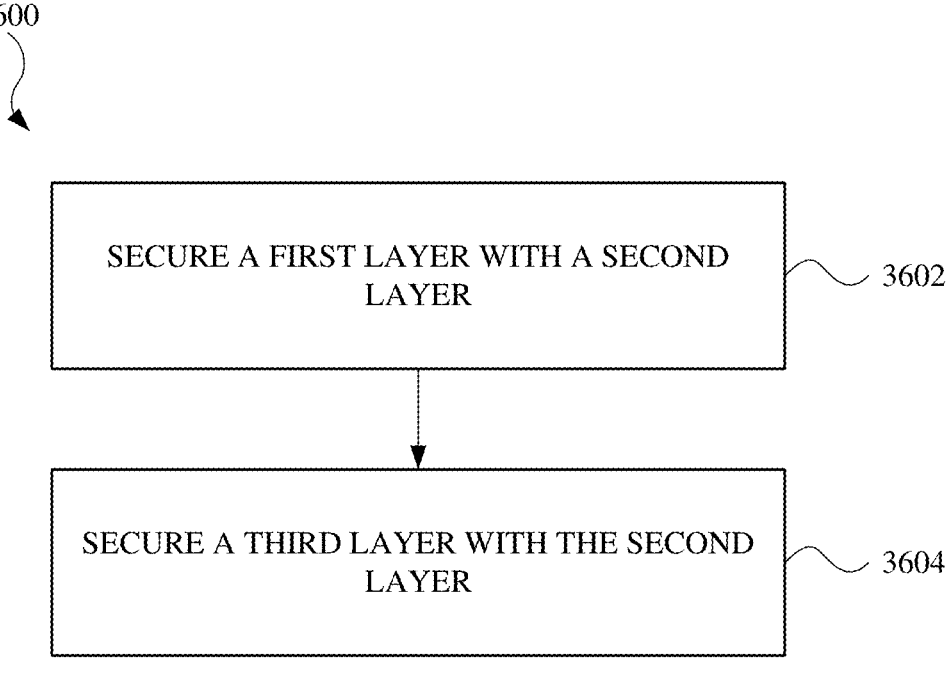
FIG. 51 illustrates a flowchart showing a method for making a thermal distribution assembly for removing heat from a heat-generating component in an electronic device having an enclosure sidewall, in accordance with some described embodiments.

FIG. 51 illustrates a flowchart 3600 showing a method for making a thermal distribution assembly for removing thermal energy from a heat-generating component in an electronic device having an enclosure sidewall, in accordance with some described embodiments. The thermal distribution assembly is designed to provide structural support to the electronic device, in particular when a glass bottom wall coupled to the enclosure sidewall defines an enclosure of the electronic device.

In step 3602, a first layer is secured with a second layer. The first layer may include a first bottom wall and a first sidewall extending from the first bottom wall. The second layer may include a second bottom wall engaging the first bottom wall. Also, the second layer may further include a second sidewall extending from the second bottom wall and engaging the first sidewall. In some instances, the first layer includes a first type material, such as steel (including stainless steel) in order to provide structural support. Also, in some instances, the second layer includes a second type material, such as copper or graphite, designed to enhance thermal conductivity of the thermal distribution assembly. Also, the first and second layer may each include an additional sidewall.

In step 3604, a third layer is secured with the second layer. The third layer may include a third bottom wall engaging the second bottom wall. The third layer may further include a third sidewall extending from the third bottom wall and engaging the second sidewall and the enclosure sidewall. The third layer may include a third type material, such as steel (including stainless steel). In this regard, the third layer may combine with the first layer to provide additional structural support. Also, the first layer and the third layer may fully cover the second layer such that the second layer is hidden from view by the first layer and the third layer.

When the thermal distribution assembly is assembled and positioned in the electronic device, the first layer is designed distribute thermal energy from the heat-generating component to the second layer. Also, the second layer is designed distribute the thermal energy throughout various locations of the second layer, such that the thermal energy reaches the third layer and can be distributed to the enclosure sidewall.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. A display assembly for an electronic device, the display assembly comprising:

a touch sensitive layer for detecting a touch input;

a force sensitive layer for detecting an amount of force applied to the touch sensitive layer;

a display layer for presenting visual information, at least a portion of the display layer extending between the touch sensitive layer and the force sensitive layer, the display layer comprising a curved portion curving around an edge of the force sensitive layer; and a first material in contact with the curved portion and the edge of the force sensitive layer;

wherein the first material is disposed on an inner surface of the curved portion.

2. The display assembly of claim 1, wherein a second material is disposed on an outer surface of the curved portion.

3. The display assembly of claim 1, wherein the display layer comprises a first portion disposed on an inner surface of the curved portion and a second portion disposed on an outer surface of the curved portion.

4. The display assembly of claim 1, wherein at least a portion of the first material extends between the display layer and the force sensitive layer.

5. The display assembly of claim 1, further comprising a flexible circuit, the flexible circuit curving around the display layer, wherein at least a portion of a second material extends between the display layer and the flexible circuit.

6. An electronic device comprising:

a transparent protective layer;

a display assembly covered by the transparent protective layer, the display assembly comprising:

a force sensitive layer;

a display layer disposed over the force sensitive layer, the display layer defining a bend that at least partially bends around the force sensitive layer; and a protective material on the bend, a portion of the protective material disposed on an inner surface of the bend; and a frame that carries the transparent protective layer, the frame comprising a notch that at least partially receives the display layer at the bend.

7. The electronic device of claim 6, wherein the display assembly further comprises:

a touch sensitive layer disposed over the display layer; and a flexible circuit coupled to the touch sensitive layer, wherein the flexible circuit at least partially bends around the bend of the display layer.

8. The electronic device of claim 7, further comprising a portion of a support material disposed between the flexible circuit and the bend of the display layer.

9. The electronic device of claim 6, wherein:

the portion is a first portion; and at least a second portion of the protective material extends between the display layer and the force sensitive layer.

10. The electronic device of claim 9, wherein the second portion of the protective material contacts a surface of the bend and an edge of the force sensitive layer.

11. The electronic device of claim 6, wherein:

the bend curves at least 180 degrees; and a support material extends along an exterior surface of the bend from a first planar surface to a second planar surface.

12. The electronic device of claim 6, wherein:

the bend curves at least 180 degrees; and the protective material extends along an interior surface of the bend from a first planar surface to a second planar surface.

13. An electronic device, comprising:

a touch sensitive layer;

a force sensitive layer for detecting an amount of force applied to the touch sensitive layer;

a display layer, the display layer at least partially positioned between the touch sensitive layer and the force sensitive layer, the display layer comprising a bend region disposed around the force sensitive layer that covers an edge of the force sensitive layer; and a protective material at least partially positioned on an inner surface of the bend region and the force sensitive layer.

14. The electronic device of claim 13, wherein the protective material is positioned between the bend region and the force sensitive layer in a direction parallel to a major surface of the force sensitive layer.

15. The electronic device of claim 13, wherein the protective material contacts a side surface of the force sensitive layer.

16. The electronic device of claim 13, further comprising:

a flexible circuit coupled to the touch sensitive layer, the flexible circuit comprising a bend region disposed around the display layer; and a support material at least partially positioned between the bend region of the display layer and the bend region of the flexible circuit.

17. The electronic device of claim 13, wherein the protective material extends from a first planar surface to a second planar surface of the display layer.

18. The electronic device of claim 13, wherein at least a portion of a support material extends along an exterior surface of the display layer opposite a surface of the display layer facing the force sensitive layer.

* * * * *